(12) United States Patent
Takishita et al.

(10) Patent No.: US 10,578,966 B2
(45) Date of Patent: Mar. 3, 2020

(54) COLORING COMPOSITION, FILM, COLOR FILTER, PATTERN FORMING METHOD, METHOD OF MANUFACTURING COLOR FILTER, SOLID IMAGE PICKUP ELEMENT, AND INFRARED SENSOR

(71) Applicant: FUJIFILM Corporation, Tokyo (JP)

(72) Inventors: Hirotaka Takishita, Haibara-gun (JP);
Tetsuya Kamimura, Haibara-gun (JP);
Takuya Tsuruta, Haibara-gun (JP);
Kyouhei Arayama, Haibara-gun (JP);
Kazuto Shimada, Haibara-gun (JP);
Masahiro Mori, Haibara-gun (JP)

(73) Assignee: FUJIFILM Corporation, Tokyo (JP)

( * ) Notice: Subject to any disclaimer, the term of this patent is extended or adjusted under 35 U.S.C. 154(b) by 0 days.

(21) Appl. No.: 15/271,302

(22) Filed: Sep. 21, 2016

(65) Prior Publication Data

US 2017/0010528 A1    Jan. 12, 2017

Related U.S. Application Data

(63) Continuation of application No. PCT/JP2015/061129, filed on Apr. 9, 2015.

(30) Foreign Application Priority Data

| May 1, 2014 | (JP) | ................................ 2014-094646 |
| Jul. 18, 2014 | (JP) | ................................ 2014-147374 |
| Apr. 6, 2015 | (JP) | ................................ 2015-077313 |

(51) Int. Cl.
*G03F 7/00* (2006.01)
*G03F 7/004* (2006.01)
(Continued)

(52) U.S. Cl.
CPC ........ *G03F 7/0007* (2013.01); *C09B 23/0075* (2013.01); *C09B 23/04* (2013.01);
(Continued)

(58) Field of Classification Search
CPC ........ G03F 7/0007; G03F 7/031; G03F 7/032; G03F 7/033; G03F 7/0388; G03F 7/0042;
(Continued)

(56) References Cited

U.S. PATENT DOCUMENTS

| 2,418,605 A | 4/1947 | Shepherd, Jr. et al. |
| 2007/0045517 A1 | 3/2007 | Fukuyoshi et al. |

(Continued)

FOREIGN PATENT DOCUMENTS

| CN | 103597040 A | 2/2014 |
| JP | 60-69602 A | 4/1985 |

(Continued)

OTHER PUBLICATIONS

International Search Report for PCT/JP2015/061129 dated Jun. 16, 2015.
(Continued)

*Primary Examiner* — Bijan Ahvazi
(74) *Attorney, Agent, or Firm* — Sughrue Mion, PLLC

(57) ABSTRACT

A coloring composition includes colorants and a resin, in which a ratio A/B of a minimum value A of an absorbance in a wavelength range of 400 to 830 nm to a maximum value B of an absorbance in a wavelength range of 1000 to 1300 nm is 4.5 or higher.

54 Claims, 1 Drawing Sheet

(51) Int. Cl.
| | |
|---|---|
| C09B 57/00 | (2006.01) |
| G02B 5/20 | (2006.01) |
| G02B 5/22 | (2006.01) |
| C09B 67/46 | (2006.01) |
| G03F 7/031 | (2006.01) |
| G03F 7/032 | (2006.01) |
| G03F 7/033 | (2006.01) |
| G03F 7/038 | (2006.01) |
| G03F 7/16 | (2006.01) |
| G03F 7/20 | (2006.01) |
| G03F 7/26 | (2006.01) |
| H04N 5/33 | (2006.01) |
| C09B 23/01 | (2006.01) |
| C09B 23/04 | (2006.01) |
| G03F 7/027 | (2006.01) |
| G03F 7/105 | (2006.01) |
| H01L 27/146 | (2006.01) |

(52) U.S. Cl.
CPC ............ *C09B 57/00* (2013.01); *C09B 67/009* (2013.01); *G02B 5/201* (2013.01); *G02B 5/208* (2013.01); *G02B 5/22* (2013.01); *G03F 7/0042* (2013.01); *G03F 7/0045* (2013.01); *G03F 7/027* (2013.01); *G03F 7/031* (2013.01); *G03F 7/032* (2013.01); *G03F 7/033* (2013.01); *G03F 7/0388* (2013.01); *G03F 7/105* (2013.01); *G03F 7/16* (2013.01); *G03F 7/20* (2013.01); *G03F 7/26* (2013.01); *H01L 27/14621* (2013.01); *H01L 27/14625* (2013.01); *H04N 5/33* (2013.01)

(58) Field of Classification Search
CPC . G03F 7/0045; G03F 7/16; G03F 7/20; G03F 7/26; C09B 57/00; C09B 67/009; G02B 5/22; G02B 5/208; H04N 5/33
See application file for complete search history.

(56) References Cited

U.S. PATENT DOCUMENTS

| | | | | |
|---|---|---|---|---|
| 2010/0243970 | A1* | 9/2010 | Toshimitsu | G02B 5/223 252/582 |
| 2011/0012075 | A1 | 1/2011 | Nii et al. | |
| 2011/0070407 | A1* | 3/2011 | Kato | C08F 2/46 428/172 |
| 2011/0195235 | A1 | 8/2011 | Kato et al. | |
| 2011/0294051 | A1* | 12/2011 | Sultemeyer | C09B 7/08 430/7 |
| 2014/0120473 | A1 | 5/2014 | Aoyagi | |

FOREIGN PATENT DOCUMENTS

| | | | |
|---|---|---|---|
| JP | 61-5203 A | 1/1986 | |
| JP | 6-222211 A | 8/1994 | |
| JP | 2000314807 A | 11/2000 | |
| JP | 2008009238 A | 1/2008 | |
| JP | 2009-69822 A | 4/2009 | |
| JP | 2009-263614 A | 11/2009 | |
| JP | 2010-002704 * | 1/2010 | ............... G02B 5/22 |
| JP | 2010-2704 A | 1/2010 | |
| JP | 2010-90313 A | 4/2010 | |
| JP | 2011-68731 A | 4/2011 | |
| JP | 2013-77009 A | 4/2013 | |
| WO | 2006/003807 A1 | 1/2006 | |
| WO | 2012/091083 A1 | 7/2012 | |

OTHER PUBLICATIONS

Written Opinion for PCT/JP2015/061129 dated Jun. 16, 2015.
Communication dated Jul. 11, 2017. issued by the Japanese Patent Office in counterpart application No. 2016-515912.
English Translation of International Preliminary Report on Patentability and Written Opinion, dated Nov. 1, 2016, in International Application No. PCT/JP2015/061129, 10 pages in English.
Communication dated Jul. 24, 2017, from the Singapore Patent Office in counterpart application No. 11201608040V.
Office Action dated Feb. 9, 2018 from the Intellectual Property Office of Singapore in counterpart Singaporean Application No. 11201608040V.
Office Action dated May 16, 2018 from the Korean Intellectual Property Office in counterpart Korean Application No. 10-2016-7026657.
Office Action dated Nov. 28, 2018 from the Korean Intellectual Property Office in counterpart Korean application No. 10-2016-7026657.
Office Action dated Dec. 22, 2018, from the Taiwanese Intellectual Property Office in counterpart Taiwanese Application No. 104112299.
Office Action dated Oct. 10, 2019 in U.S. Appl. No. 15/802,828.

* cited by examiner

COLORING COMPOSITION, FILM, COLOR FILTER, PATTERN FORMING METHOD, METHOD OF MANUFACTURING COLOR FILTER, SOLID IMAGE PICKUP ELEMENT, AND INFRARED SENSOR

CROSS-REFERENCE TO RELATED APPLICATIONS

This application is a Continuation of PCT International Application No. PCT/JP2015/61129, filed on Apr. 9, 2015, which claims priority under 35 U.S.C. § 119(a) to Japanese Patent Application No. 2014-094646, filed on May 1, 2014, Japanese Patent Application No. 2014-147374, filed on Jul. 18, 2014, and Japanese Patent Application No. 2015-077313, filed on Apr. 6, 2015. Each of the above application(s) is hereby expressly incorporated by reference, in its entirety, into the present application.

BACKGROUND OF THE INVENTION

1. Field of the Invention

The present invention relates to a coloring composition. In particular, the present invention relates to a coloring composition which is preferably used for forming a color filter. Further, the present invention relates to a film, a color filter, a solid image pickup element, and an infrared sensor in which the coloring composition is used. In addition, the present invention relates to a pattern forming method and a method of manufacturing a color filter in which the coloring composition is used.

2. Description of the Related Art

A color filter is an essential component in a solid image pickup element or a liquid crystal display. In particular, in a color filter for a solid image pickup element, improvement of color separability and improvement of color reproducibility are required.

This color filter is formed to include colored regions of plural hues (colored cured films) and, typically, is formed to include at least red, green, and blue colored regions (hereinafter, also referred to as "colored patterns" or "colored pixels"). A method of forming a colored pattern includes: applying a coloring composition having any one of red, green, and blue colorants to obtain a colored pattern of a first hue; forming a colored pattern by performing exposure, development, and optionally a heat treatment on the applied coloring composition; and repeating application, exposure, development, and optionally a heat treatment as described above to obtain colored patterns of a second hue and a third hue.

JP2013-77009A discloses a coloring radiation-sensitive composition for a color filter in which, in a case where a coloring composition layer having a spectral transmittance of 30% at a wavelength of 600 nm is formed, the coloring composition layer satisfies the following conditions: a spectral transmittance at a wavelength of 400 nm is 20% or lower; a spectral transmittance at a wavelength of 550 nm is 10% or lower; a spectral transmittance at a wavelength of 700 nm is 70% or higher; and a wavelength at which a spectral transmittance is 50% is in a range of 650 nm to 680 nm.

JP2009-69822A discloses a resin black matrix in which a maximum light transmittance in a wavelength range of 400 to 700 nm is 1% or lower, and an average light transmittance in a wavelength range of 850 to 3000 nm is 60% or higher.

JP2009-263614A discloses a near infrared absorbing compound which has an absorption in the near infrared range and is excellent in invisibility in a wavelength range of 400 to 700 nm without having an absorption in the wavelength range.

SUMMARY OF THE INVENTION

A sensing technique using near infrared rays is used in various purposes.

Near infrared rays are less likely to be scattered than visible rays due to its long wavelength and can be used in, for example, distance measurement or three-dimensional measurement. By utilizing these characteristics of near infrared rays, near infrared rays can be used in a proximity sensor, a motion sensor, or the like. In addition, near infrared rays are invisible by a person or an animal. Therefore, even when an object is irradiated using a near infrared light source at night, the object cannot recognize near infrared rays. Thus, near infrared rays can be used for imaging a nocturnal wild animal or imaging an object without provoking the object for a security reason.

However, it cannot be said that color filters which have been known until now have sufficient light shielding properties with respect to visible rays on the long wavelength side. For example, it was found that, when a color filter of the related art is applied to, for example, an optical sensor in which near infrared rays or the like having a wavelength of 900 nm or longer (near infrared rays having a wavelength which is longer than that of visible rays) are used as a light source, noises are generated from visible rays, which causes deterioration in the performance of the sensor.

Accordingly, an object of the present invention is to provide a coloring composition with which a color filter capable of allowing transmission of near infrared rays in a state where noises generated from visible rays are small can be formed. In addition, another object of the present invention is to provide a film, a color filter, a pattern forming method, a method of manufacturing a color filter, a solid image pickup element, and an infrared sensor in which the coloring composition is used.

The present inventors performed a thorough investigation and found that the above-described objects can be achieved using a coloring composition in which a ratio of a minimum value of an absorbance in a specific wavelength range to a maximum value of an absorbance in another specific wavelength range is a specific value or higher, thereby completing the present invention. That is, the present invention is as follows.

<1> A coloring composition comprising: colorants; and a resin, in which a ratio A/B of a minimum value A of an absorbance in a wavelength range of 400 to 830 nm to a maximum value B of an absorbance in a wavelength range of 1000 to 1300 nm is 4.5 or higher.

<2> The coloring composition according to <1>, in which the colorants include one or more first colorants having an absorption maximum in a wavelength range of 800 to 900 nm and two or more second colorants having an absorption maximum in a wavelength range of 400 to 700 nm.

<3> The coloring composition according to <2>, in which a content of the first colorants is 10 to 200 parts by mass with respect 100 parts to by mass of the second colorants.

<4> The coloring composition according to <2> or <3>, in which the first colorants include a pyrrolopyrrole colorant compound.

<5> The coloring composition according to <4>, in which the pyrrolopyrrole colorant compound is a pigment.

<6> The coloring composition according to <4> or <5>, in which the pyrrolopyrrole colorant compound is represented by the following formula (1),

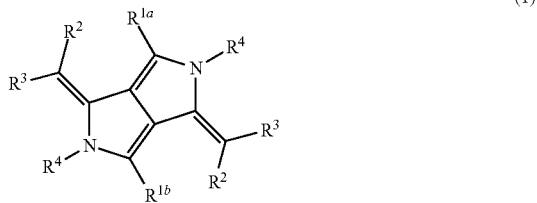

in Formula (1), $R^{1a}$ and $R^{1b}$ each independently represent an alkyl group, an aryl group, or a heteroaryl group, $R^2$ and $R^3$ each independently represent a hydrogen atom or a substituent, at least one of $R^2$ or $R^3$ represents an electron-withdrawing group, $R^2$ and $R^3$ may be bonded to each other to form a ring, $R^4$ represents a hydrogen atom, an alkyl group, an aryl group, a heteroaryl group, a substituted boron atom, or a metal atom and may form a covalent bond or a coordinate bond with at least one selected from the group consisting of $R^{1a}$, $R^{1b}$, and $R^3$.
<7> The coloring composition according to any one of <2> to <6>, in which the colorants include, as the second colorants, two or more colorants selected from the group consisting of a red colorant, a yellow colorant, a blue colorant, and a violet colorant. <8> The coloring composition according to any one of <1> to <7>, further comprising a polymerizable compound.
<9> The coloring composition according to <8>, further comprising a photopolymerization initiator.
<10> The coloring composition according to any one of <1> to <9> which is used for forming a colored layer of a color filter.
<11> A film in which a light transmittance in a thickness direction of the film has a maximum value of 20% or lower in a wavelength range of 400 to 830 nm and has a minimum value of 70% or higher in a wavelength range of 1000 to 1300 nm.
<12> The film according to <11> which is formed by curing the coloring composition according to any one of <1> to <10>.
<13> A color filter comprising the film according to <11> or <12>.
<14> A pattern forming method comprising: a step of applying the coloring composition according to any one of <1> to <10> to a support to form a coloring composition layer; a step of exposing the coloring composition layer in a pattern shape; and a step of forming a colored pattern by removing a non-exposed portion by development.
<15> A method of manufacturing a color filter comprising the pattern forming method according to <14>.
<16> A solid image pickup element comprising the color filter according to <13> or a color filter which is obtained using the method of manufacturing a color filter according to <15>.
<17> An infrared sensor comprising the color filter according to <13> or a color filter which is obtained using the method of manufacturing a color filter according to <15>.

According to the present invention a coloring composition can be provided with which a color filter capable of allowing transmission of near infrared rays in a state where noises generated from visible rays are small can be formed. In addition, a film, a color filter, a pattern forming method, a method of manufacturing a color filter, a solid image pickup element, and an infrared sensor in which the coloring composition is used can be provided.

DESCRIPTION OF THE PREFERRED EMBODIMENTS

Figure 1:
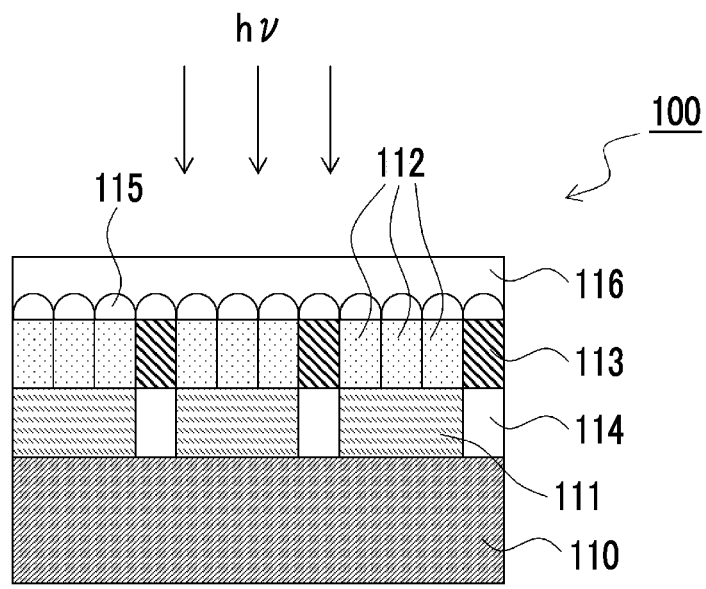
FIG. 1 is a schematic cross-sectional view showing a configuration of an infrared sensor according to an embodiment of the present invention.

In this specification, a total solid content denotes the total mass of components of a total composition of a coloring composition excluding a solvent. In addition, a solid content denotes a solid content at 25° C.

In this specification, unless specified as a substituted group or as an unsubstituted group, a group (atomic group) denotes not only a group having no substituent but also a group having a substituent. For example, "alkyl group" denotes not only an alkyl group having no substituent (unsubstituted alkyl group) but also an alkyl group having a substituent (substituted alkyl group).

In this specification, "radiation" denotes, for example, a bright light spectrum of a mercury lamp, a far ultraviolet ray represented by excimer laser, an extreme ultraviolet ray (EUV ray), an X-ray, or an electron ray. In addition, "light" denotes an actinic ray or radiation. In this specification, unless specified otherwise, "exposure" refers to not only exposure using a mercury lamp, far ultraviolet rays represented by excimer laser, X-rays, or EUV rays but also drawing using corpuscular beams such as electron rays or ion beams.

In this specification, "(meth)acrylate" denotes either or both of acrylate or methacrylate, "(meth)acryl" denotes either or both of acryl and methacryl, and "(meth)acryloyl" denotes either or both of acryloyl and methacryloyl.

In this specification, a monomer is distinguished from an oligomer and a polymer and denotes a compound having a weight average molecular weight of 2000 or lower. In this specification, a polymerizable compound denotes a compound having a polymerizable functional group and may be either a monomer or a polymer. A polymerizable functional group denotes a group relating to a polymerization reaction.

In this specification, in a chemical formula, Me represents a methyl group, Et represents an ethyl group, Pr represents a propyl group, Bu represents a butyl group, and Ph represents a phenyl group.

In this specification, the term "step" denotes not only an individual step but also a step which is not clearly distinguishable from another step as long as an effect expected from the step can be achieved.

In this specification, a weight average molecular weight and a number average molecular weight are defined as values in terms of polystyrene obtained by GPC. In this specification, an weight average molecular weight (Mw) and a number average molecular weight (Mn) can be obtained by using HLC-8220 (manufactured by Tosoh Corporation), using TSKgel Super AWM-H (manufactured by Tosoh Corporation; 6.0 mm ID (inner diameter)×15.0 cm) as a column, and using a 10 mmol/L lithium bromide N-methylpyrrolidinone (NMP) solution as an eluent.

"Pigment" denotes an insoluble colorant compound which is not likely to dissolve in a solvent. Typically, "pigment" denotes a colorant compound which is present in a state of being dispersed as particles in a composition. As the solvent described herein, for example, an arbitrary solvent can be used, and examples thereof are described in the item "Solvent" below. It is preferable that the pigment has a solubility of 0.1 g/100 g Solvent or lower at 25° C., for example, both in propylene glycol monomethyl ether acetate and in water.

<Coloring Composition>

A coloring composition according to the present invention includes colorants and a resin, in which a ratio A/B of a minimum value A of an absorbance in a wavelength range of 400 to 830 nm to a maximum value B of an absorbance in a wavelength range of 1000 to 1300 nm is 4.5 or higher.

The above-described ratio A/B is preferably 10 or higher, more preferably 15 or higher, and still more preferably 30 or higher.

In a case where the absorbance ratio is 4.5 or higher, a film having spectral characteristics in which a light transmittance in a thickness direction of the film has a maximum value of 20% or lower in a wavelength range of 400 to 830 nm and has a minimum value of 70% or higher in a wavelength range of 1000 to 1300 nm can be suitably formed using the coloring composition.

The above-described absorbance conditions may be achieved using any means. For example, as described below in detail, the absorbance conditions can be suitably achieved by adding one or more first colorants having an absorption maximum in a wavelength range of 800 to 900 nm and two or more second colorants having an absorption maximum in a wavelength range of 400 to 700 nm to the coloring composition and adjusting the kind and content of each of the colorants.

An absorbance $A\lambda$ at a wavelength $\lambda$ is defined by the following Expression (1).

$$A\lambda = -\log(T\lambda) \quad (1)$$

$A\lambda$ denotes the absorbance at the wavelength $\lambda$, and $T\lambda$ denotes a transmittance at the wavelength $\lambda$.

A value of the absorbance may be a value measured in the form of a solution or a value of a film which is formed using the coloring composition. In a case where the absorbance is measured in the form of the film, it is preferable that the film is formed by applying the coloring composition to a glass substrate using a method such as spin coating such that the thickness of the dried film is a predetermined value, and drying the applied coloring composition on a hot plate at 100° C. for 120 seconds. The thickness of the film can be obtained by measuring the thickness of the substrate including the film using a stylus surface profilometer (DEKTAK 150, manufactured by ULVAC Inc.).

In addition, the absorbance can be measured using a well-known spectrophotometer of the related art. Measurement conditions of the absorbance are not particularly limited. It is preferable that the maximum value B of the absorbance in a wavelength range of 1000 to 1300 nm is measured under conditions which are adjusted such that the minimum value A of the absorbance in a wavelength range of 400 to 830 nm is 0.1 to 3.0. By measuring the absorbance under the above-described conditions, a measurement error can be further reduced. A method of adjusting the minimum value A of the absorbance in a wavelength range of 400 to 830 nm to be 0.1 to 3.0 is not particularly limited. For example, in a case where the absorbance is measured in the form of the coloring composition, for example, a method of adjusting the optical path length of a sample cell can be used. In addition, in a case where the absorbance is measured in the form of the film, for example, a method of adjusting the thickness of the film can be used.

A method of measuring the spectral characteristics and the thickness of the film formed using the coloring composition is as follows.

The coloring composition is applied to a glass substrate using a method such as spin coating such that the thickness of the dried film is a predetermined value and then is dried on a hot plate at 100° C. for 120 seconds.

The thickness of the film is obtained by measuring the thickness of the dried substrate including the film using a stylus surface profilometer (DEKTAK 150, manufactured by ULVAC Inc.).

The transmittance of the dried substrate including the film is measured in a wavelength range of 300 to 1300 nm using a spectrophotometer (ref. the glass substrate) of an ultraviolet-visible-near infrared spectrophotometer (U-4100, manufactured by Hitachi High-Technologies Corporation).

The coloring composition can also be referred to as a near infrared ray transmitting composition because it allows transmission of near infrared rays (preferably rays having a wavelength of 900 nm or higher).

Hereinafter, each of components which can form the coloring composition according to the present invention will be described.

<<Colorant>>

The coloring composition according to the present invention includes colorants.

It is preferable that the colorants include one or more first colorants having an absorption maximum in a wavelength range of 800 to 900 nm and two or more second colorants having an absorption maximum in a wavelength range of 400 to 700 nm.

"Having an absorption maximum in a wavelength range of 800 to 900 nm" represents having a maximum absorbance in a wavelength range of 800 to 900 nm in an absorption spectrum. For example, in an absorption spectrum in a wavelength range of 350 to 1300 nm, it is preferable that the first colorants have a maximum absorbance in a wavelength range of 800 to 900 nm.

In addition, "having an absorption maximum in a wavelength range of 400 to 700 nm" represents having a maximum absorbance in a wavelength range of 400 to 700 nm in an absorption spectrum. For example, in an absorption spectrum in a wavelength range of 350 to 1300 nm, it is preferable that the second colorants have a maximum absorbance in a wavelength range of 400 to 700 nm.

<<First Colorants>>

First, the first colorants will be described.

The first colorants are colorants having an absorption maximum in a wavelength range of 800 to 900 nm. It is preferable that the first colorants have an absorption maximum in a wavelength range of 800 to 880 nm and more preferably have an absorption maximum in a wavelength range of 800 to 860 nm.

As the first colorant, a pigment or a dye may be used, and a pigment is preferable because the coloring composition, with which a film having excellent heat resistance can be formed, is likely to be obtained.

Examples of the first colorant include a pyrrolopyrrole colorant compound, a copper compound, a cyanine colorant compound, a phthalocyanine colorant compound, an iminium colorant compound, a thiol complex compound, a transition metal oxide compound, a squarylium colorant compound, a naphthalocyanine colorant compound, a quaterrylene colorant compound, a dithiol metal complex colorant compound, and a croconium compound.

Examples of the phthalocyanine colorant compound include oxotitanyl phthalocyanine. Examples of the naphthalocyanine colorant compound include oxovanadyl naphthalocyanine. As the phthalocyanine colorant compound, the naphthalocyanine colorant compound, the iminium compound, the cyanine colorant compound, the squarylium colorant compound, or the croconium compound, for example, one of compounds disclosed in paragraphs "0010" to "0081" of JP2010-111750A may be used, the content of which are incorporated in this specification. The cyanine colorant compound can be found in, for example, "Functional colorants by Makoto Okawara, Masaru Matsuoka, Teijiro Kitao, and Tsuneoka Hirashima, published by Kodansha Scientific Ltd.", the content of which is incorporated herein by reference.

In addition, as the first colorant, a compound disclosed in paragraphs "0004" to "0016" of JP1995-164729A (JP-H07-164729A), a compound disclosed in paragraphs "0027" to "0062" of JP2002-146254A, or near infrared ray absorbing particles disclosed in paragraphs "0034" to "0067" of JP2011-164583A which are formed of crystallites of an oxide including Cu and/or P and have a number average aggregated particle size of 5 to 200 nm may be used, the content of which is incorporated herein by reference. In addition, for example, FD-25 (manufactured by Yamada Chemical Co., Ltd.) or IRA842 (manufactured by Exiton, Inc.) may be used.

As the first colorant, a pyrrolopyrrole colorant compound is preferable. By using a pyrrolopyrrole colorant compound, the spectral characteristics of the coloring composition are likely to be adjusted to be in the above-described ranges. In addition, a film having excellent heat resistance can be formed. Further, the viscosity stability of the coloring composition can be improved, and an increase in viscosity caused over time can be suppressed in the coloring composition.

As the pyrrolopyrrole colorant compound, a pigment or a dye may be used, and a pigment is preferable because the coloring composition, with which a film having excellent heat resistance can be formed, is likely to be obtained.

As the pyrrolopyrrole colorant compound, a compound represented by the following Formula (1) is preferable. By using the compound represented by the following Formula (1), the coloring composition, with which a film having the above-described characteristics and excellent heat resistance can be formed, can be obtained.

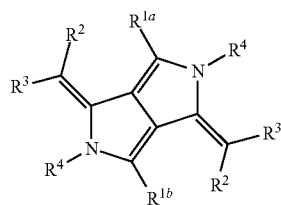

(1)

In Formula (1), $R^{1a}$ and $R^{1b}$ each independently represent an alkyl group, an aryl group, or a heteroaryl group, $R^2$ and $R^3$ each independently represent a hydrogen atom or a substituent, at least one of $R^2$ or $R^3$ represents an electron-withdrawing group, $R^2$ and $R^3$ may be bonded to each other to form a ring, $R^4$ represents a hydrogen atom, an alkyl group, an aryl group, a heteroaryl group, a substituted boron atom, or a metal atom and may form a covalent bond or a coordinate bond with at least one selected from the group consisting of $R^{1a}$, $R^{1b}$, and $R^3$.

The alkyl group represented by $R^{1a}$ or $R^{1b}$ in Formula (1) is an alkyl group having preferably 1 to 30 carbon atoms, more preferably 1 to 20 carbon atoms, and still more preferably 1 to 10 carbon atoms, and examples thereof include methyl, ethyl, iso-propyl, tert-butyl, n-octyl, n-decyl, n-hexadecyl, cyclopropyl, cyclopentyl, and cyclohexyl. The alkyl group may have a substituent or may be unsubstituted. Examples of the substituent include a substituent T described below and a group represented by Formula A described below.

The aryl group represented by $R^{1a}$ or $R^{1b}$ is an alkyl group having preferably 6 to 30 carbon atoms, more preferably 6 to 20 carbon atoms, and still more preferably 6 to 12 carbon atoms, and examples thereof include phenyl, o-methylphenyl, p-methylphenyl, biphenyl, naphtyl, anthranil, and phenanthryl. The aryl group may have a substituent or may be unsubstituted. Examples of the substituent include a substituent T described below and a group represented by Formula A described below.

The heteroaryl group represented by $R^{1a}$ or $R^{1b}$ is an heteroaryl group having preferably 1 to 30 carbon atoms, and more preferably 1 to 12 carbon atoms. Examples of a heteroatom include a nitrogen atom, an oxygen atom, and a sulfur atom. Specific examples of the heteroaryl group include imidazolyl, pyridyl, quinolyl, furyl, thienyl, benzoxazolyl, benzimidazolyl, benzothiazolyl, naphthothiazolyl, m-carbazolyl, and azepinyl. The heteroaryl group may have a substituent or may be unsubstituted. Examples of the substituent include a substituent T described below and a group represented by Formula A described below.

In Formula (1), $R^{1a}$ and $R^{1b}$ may be the same as or different from each other.

$R^2$ and $R^3$ each independently represent a hydrogen atom or a substituent, and at least one of $R^2$ and $R^3$ represents an electron-withdrawing group. $R^2$ and $R^3$ may be bonded to each other to form a ring. Examples of the substituent include substituents disclosed in paragraphs "0020" to "0022" of JP2009-263614A. The content is incorporated herein by reference.

Examples of the substituent include the following substituent T.

(Substituent T)

Examples of the substituent T include an alkyl group (preferably having 1 to 30 carbon atoms; for example, a methyl group, an ethyl group, or a cyclohexyl group), an alkenyl group (preferably having 2 to 30 carbon atoms), an alkynyl group (preferably having 2 to 30 carbon atoms), an aryl group (preferably having 6 to 30 carbon atoms; for example, a phenyl group, a p-methylphenyl group, a biphenyl group, or a naphthyl group), an amino group (preferably having 0 to 30 carbon atoms), an alkoxy group (preferably having 1 to 30 carbon atoms; for example, a methoxy group or a 2-ethylhexyloxy group), an aryloxy group (preferably having 6 to 30 carbon atoms; for example, a phenyloxy group, a 1-naphthyloxy group, or 2-naphthyloxy group), a heteroaryloxy group (preferably having 1 to 30 carbon atoms; for example, a pyridyloxy group), an acyl group (preferably having 1 to 30 carbon atoms), an alkoxycarbonyl group (preferably having 2 to 30 carbon atoms), an aryloxycarbonyl group (preferably having 7 to 30 carbon atoms), an acyloxy group (preferably having 2 to 30 carbon atoms), an acylamino group (preferably having 2 to 30 carbon atoms), an alkoxycarbonylamino group (preferably having 2 to 30 carbon atoms), an aryloxycarbonylamino group (preferably having 7 to 30 carbon atoms), a sulfonylamino group (preferably having 1 to 30 carbon atoms), a sulfamoyl group (preferably having 0 to 30 carbon atoms), a carbamoyl group (preferably having 1 to 30 carbon atoms), an alkylthio group (preferably having 1 to 30 carbon atoms), an arylthio group (preferably having 6 to 30 carbon atoms), a heteroarylthio group (preferably having 1 to 30 carbon atoms), an alkylsulfinyl group (preferably having 1 to 30 carbon atoms), an arylsulfinyl group (preferably having 6 to 30 carbon atoms), a ureido group (preferably having 1 to 30 carbon atoms), a phosphoric amide group (preferably having 1 to 30 carbon atoms), a hydroxy group, a mercapto group, a halogen atom (for example, a fluorine atom, a chlorine atom, a bromine atom, or an iodine atom), a cyano group, a sulfo group, a carboxyl group, a nitro group, a hydroxamic acid group, a sulfino group, a hydrazino group, an imino group, and a heteroaryl group.

These groups may further have a substituent. Examples of the substituent include the groups exemplified as the substituent T and a group represented by the following Formula A.

$$-L^1-X^1 \qquad A:$$

In Formula A, $L^1$ represents a single bond or a divalent linking group, and $X^1$ represents a (meth)acryloyloxy group, an epoxy group, an oxetanyl group, an isocyanate group, a hydroxyl group, an amino group, a carboxyl group, a thiol group, an alkoxysilyl group, a methylol group, a vinyl group, a (meth)acrylamido group, a sulfo group, a styryl group, or a maleimide group.

In a case where $L^1$ represents a divalent linking group, it is preferable that $L^1$ represents an alkylene group having 1 to 20 carbon atoms, an arylene group having 6 to 18 carbon atoms, a heteroarylene group having 3 to 18 carbon atoms, —O—, —S—, —C(=O)—, or a group of a combination of the above-described groups.

It is more preferable that $X^1$ represents one or more groups selected from the group consisting of a (meth)acryloyloxy group, a vinyl group, an epoxy group, and an oxetanyl group, and it is still more preferable that $X^1$ represents a (meth)acryloyloxy group.

The electron-withdrawing group represented by $R^2$ or $R^3$ is preferably an electron-withdrawing group having an Hammett sigma para value (σpvalue) of 0.2 or higher, and examples thereof include a cyano group, an acyl group, an alkoxycarbonyl group, an aryloxycarbonyl group, a sulfamoyl group, an alkylsulfinyl group, an arylsulfinyl group, and a heteroaryl group. These electron-withdrawing groups may further have a substituent.

The Hammett substituent constant σ value will be described. The Hammett rule is an experimental rule proposed by L. P. Hammett in 1935 in order to quantitatively discuss an effects of a substituent on a reaction or a equilibrium of a benzene derivative. The validity of the Hammett rule is widely admitted nowadays. Substituent constants obtained by the Hammett rule are an σp value and an σm value, and these values can be found in many general books. For example, the detail can be found in "Lange's Handbook of Chemistry" 12th edition, edited by J. A. Dean, 1979 (McGraw Hill), "Kagaku no Ryoiki (Journal of Japanese Chemistry) special edition" vol. 122, pp. 96-103, 1979 (Nankodo), and "Chem. Rev." vol. 91, pp. 165-195, 1991. It is shown that a substituent having a Hammett substituent constant σp value of 0.2 or higher is an electron-attracting group. The σp value is preferably 0.25 or higher, more preferably 0.3 or higher, and still more preferably 0.35 or higher.

Specific examples of the substituent having a Hammett substituent constant σp value of 0.2 or higher include a cyano group (—CN: 0.66), a carboxyl group (—COOH: 0.45), an alkoxycarbonyl group (for example, —COOMe: 0.45), an aryloxycarbonyl group (for example, —COOPh: 0.44), a carbamoyl group (for example, $CONH_2$: 0.36), an alkylcarbonyl group (for example, —COMe: 0.50), an arylcarbonyl group (for example, —COPh: 0.43), an alkylsulfonyl group (for example, —$SO_2$Me: 0.72), and an arylsulfonyl group (for example, —$SO_2$Ph: 0.68). The values in the parentheses are representative σp values of the substituents extracted from "Chem. Rev." vol. 91, pp. 165-195, 1991.

Further, in a case where $R^2$ and $R^3$ are bonded to each other to form a ring, it is preferable that the formed ring is a 5- to 7-membered (preferably 5- or 6-membered) ring which is typically used as an acid nucleus in a merocyanine colorant, and specific examples are as follows:

(a) a 1,3-dicarbonyl nucleus such as 1,3-indanedione nucleus, 1,3-cyclohexanedione, 5,5-dimethyl-1,3-Cyclohexanedione or 1,3-dioxane-4,6-dione;

(b) a pyrazolinone nucleus such as 1-phenyl-2-pyrazolin-5-one, 3-methyl-1-phenyl-2-pyrazolin-5-one, or 1-(2-benzothiazoyl)-3-methyl-2-pyrazolin-5-one;

(c) an isoxazolinone nucleus such as 3-phenyl-2-isoxazolin-5-one or 3-methyl-2-isoxazolin-5-one;

(d) an oxyindole nucleus such as 1-alkyl-2,3-dihydro-2-oxyindole;

(e) a 2,4,6-triketohexahydropyrimidine nucleus such as barbituric acid, 2-thiobarbituric acid, or a derivative thereof, and examples of the derivative include a 1-alkyl form such as 1-methyl or 1-ethyl, a 1,3-dialkyl form such as 1,3-dimethyl, 1,3-diethyl, or 1,3-dibutyl, a 1,3-diaryl form such as 1,3-diphenyl, 1,3-di(p-chlorophenyl), or 1,3-di(p-ethoxycarbonylphenyl), a 1-alkyl-1-aryl form such as 1-ethyl-3-phenyl, and a 1,3-diheterocycle-substituted form such as 1,3-di(2-pyridyl);

(f) a 2-thio-2,4-thiazolidinedione nucleus such as rhodanine or a derivative thereof, and examples of the derivative include a 3-alkylrhodanine such as 3-methylrhodanine, 3-ethylrhodanine or 3-allylrhodanine, a 3-arylrhodanine such as 3-phenylrhodanine, and a 3-heterocycle-substituted rhodanine such as 3-(2-pyridyl)rhodanine;

(g) a 2-thio-2,4-oxazolidinedione (2-thio-2,4-(3H,5H)-oxazoledione nucleus) such as 3-ethyl-2-thio-2,4-oxazolidinedione;

(h) a thianaphthenone nucleus such as 3(2H)-thianaphthenone-1,1-dioxide;

(i) a 2-thio-2,5-thiazolidinedione nucleus such as 3-ethyl-2-thio-2,5-thiazolidinedione;

(j) a 2,4-thiazolidinedione nucleus such as 2,4-thiazolidinedione, 3-ethyl-2,4-thiazolidinedione, or 3-phenyl-2,4-thiazolidinedione;

(k) a thiazolin-4-one nucleus such as 4-thiazolinone or 2-ethyl-4-thiazolinone;

(l) a 4-thiazolidinone nucleus such as 2-ethylmercapto-5-thiazolin-4-one or 2-alkylphenylamino-5-thiazolin-4-one;

(m) a 2,4-imidazolidinedione (hydantoin) nucleus such as 2,4-imidazolidinedione or 3-ethyl-2,4-imidazolidinedione;

(n) a 2-thio-2,4-imidazolidinedione (2-thiohydantoin) nucleus such as 2-thio-2,4-imidazolidinedione or 3-ethyl-2-thio-2,4-imidazolidinedione;

(o) an imidazolin-5-one nucleus such as 2-propylmercapto-2-imidazolin-5-one;

(p) a 3,5-pyrazolidinedione nucleus such as 1,2-diphenyl-3,5-pyrazolidinedione or 1,2-dimethyl-3,5-pyrazolidinedione;

(q) a benzothiophen-3-one nucleus such as benzothiophen-3-one, oxobenzothiophen-3-one, or dioxobenzothiophen-3-one; and (r) an indanone nucleus such as 1-indanone, 3-phenyl-1-indanone, 3-methyl-1-indanone, 3,3-diphenyl-1-indanone, or 3,3-dimethyl-1-indanone.

The σp values of $R^2$ and $R^3$ which form the ring cannot be defined. However, in this specification, assuming that each of $R^2$ and $R^3$ is substituted with a partial ring structure, the σp values of $R^2$ and $R^3$ which form the ring are defined. For example, in a case where $R^2$ and $R^3$ form a 1,3-indanedione ring, each of $R^2$ and $R^3$ is substituted with a benzoyl group.

It is preferable that the ring which is formed by $R^2$ and $R^3$ being bonded to each other is a 1,3-dicarbonyl nucleus, a pyrazolinone nucleus, a 2,4,6-triketohexahydropyrimidine nucleus (including a thioketone form), a 2-thio-2,4-thiazolidinedione nucleus, a 2-thio-2,4-oxazolidinedione nucleus, a 2-thio-2,5-thiazolidinedione nucleus, a 2,4-thiazolidinedione nucleus, a 2,4-imidazolidinedione nucleus, a 2-thio-2,4-imidazolidinedione nucleus, a 2-imidazolin-5-one nucleus, a 3,5-pyrazolidinedione nucleus, a benzothiophen-3-one nucleus, or an indanone nucleus. It is more preferable that the ring which is formed by $R^2$ and $R^3$ being bonded to each other is a 1,3-dicarbonyl nucleus, a 2,4,6-triketohexahydropyrimidine nucleus (including a thioketone form), a 3,5-pyrazolidinedione nucleus, a benzothiophen-3-one nucleus, or an indanone nucleus.

It is more preferable that $R^3$ represents a heteroaryl group. It is preferable that the heteroaryl group is a 5- or 6-membered ring. In addition, the heteroaryl group is preferably a monocycle or a fused ring, more preferably a monocycle or a fused ring composed of 2 to 8 rings, and still more preferably a monocycle or a fused ring composed of 2 to 4 rings. The number of heteroatoms constituting the heteroaryl group is preferably 1 to 3 and more preferably 1 or 2. Examples of the heteroatom include a nitrogen atom, an oxygen atom, and a sulfur atom. The heteroaryl group is preferably a quinoline group, a benzothiazole group, or a naphthothiazol group, and is more preferably a benzothiazole group. The heteroaryl group may have a substituent or may be unsubstituted. Examples of the substituent include the above-described substituent T and the above-described group represented by Formula A.

In Formula (1), two $R^2$'s may be the same as or different from each other, and two $R^3$'s may be the same as or different from each other.

The alkyl group, the aryl group, and the heteroaryl group represented by $R^4$ have the same meaning and the same preferable ranges as those of the substituents described regarding $R^{1a}$ and $R^{1b}$. The substituent of the substituted boron atom represented by $R^4$ has the same definition as that described above regarding $R^2$ and $R^3$, and is preferably an alkyl group, an alkoxy group, an aryl group, or a heteroaryl group. In addition, the metal atom represented by $R^4$ is preferably a transition metal, magnesium, aluminum, calcium, barium, zinc, or tin, is more preferably aluminum, zinc, tin, vanadium, iron, cobalt, nickel, copper, palladium, iridium, or platinum, and is still more preferably aluminum, zinc, vanadium, iron, copper, palladium, iridium, or platinum. $R^4$ is preferably a substituted boron atom.

$R^4$ may form a covalent bond or a coordinate bond with at least one selected from the group consisting of $R^{1a}$, $R^{1b}$, and $R^3$.

In Formula (1), two $R^4$'s may be the same as or different from each other.

It is preferable that the compound represented by Formula (1) is a compound represented by the following Formula (2), (3), or (4).

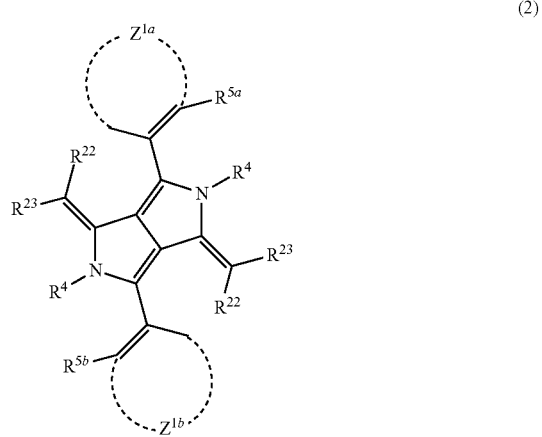

(2)

In Formula (2), $Z^{1a}$ and $Z^{1b}$ each independently represent an atomic group which forms an aryl ring or a heteroaryl ring. $R^{5a}$ and $R^{5b}$ each independently represent an aryl group having 6 to 20 carbon atoms, a heteroaryl group having 4 to 20 carbon atoms, an alkyl group having 1 to 20 carbon atoms, an alkoxy group having 1 to 20 carbon atoms, an alkoxycarbonyl group having 1 to 20 carbon atoms, a carboxyl group, a carbamoyl group having 1 to 20 carbon atoms, a halogen atom, or a cyano group, and $R^{5a}$ or $R^{5b}$ may be bonded to $Z^{1a}$ or $Z^{1b}$ to form a fused ring. $R^{22}$ and $R^{23}$ each independently represent a cyano group, an acyl group having 1 to 6 carbon atoms, an alkoxycarbonyl group having 1 to 6 carbon atoms, an alkylsulfinyl group having 1 to 10 carbon atoms, an arylsulfinyl group having 6 to 10 carbon atoms, or a nitrogen-containing heteroaryl group having 3 to 20 carbon atoms. $R^{22}$ and $R^{23}$ may be bonded to each other to form a cyclic acid nucleus. $R^4$ represents a hydrogen atom, an alkyl group having 1 to 20 carbon atoms, an aryl group having 6 to 20 carbon atoms, a heteroaryl group having 4 to 20 carbon atoms, a metal atom, or a substituted boron atom which has a halogen atom, an alkyl group having 1 to 10 carbon atoms, an aryl group having 6 to 20 carbon atoms, or a heteroaryl group having 4 to 20 carbon atoms as a substituent, and may form a covalent bond or a coordinate bond with $R^{23}$.

In Formula (2), $Z^{1a}$ and $Z^{1b}$ each independently represent an atomic group which forms an aryl ring or a heteroaryl ring. The formed aryl ring and the formed heteroaryl ring have the same definitions and the same preferable ranges as those of the aryl group and the heteroaryl group described as the substituent of $R^2$ and $R^3$ in Formula (1). It is preferable that $Z^{1a}$ and $Z^{1b}$ are the same as each other.

$R^{5a}$ and $R^{5b}$ have the same definitions and the same preferable ranges as those of the examples described regarding $R^2$ and $R^3$ in Formula (1) It is preferable that $R^{5a}$ and $R^{5b}$ are the same as each other.

$R^{5a}$ or $R^{5b}$ may be bonded to $Z^{1a}$ or $Z^{1b}$ to form a fused ring. and examples of the fused ring include a naphtyl ring and a quinoline ring. By introducing the group represented by $R^{5a}$ or $R^{5b}$ into the aryl ring or the heteroaryl ring which is formed by $Z^{1a}$ or $Z^{1b}$, invisibility can be significantly improved.

$R^{22}$ and $R^{23}$ have the same definitions and the same preferable ranges as those of the examples described regarding $R^2$ and $R^3$ in Formula (1).

$R^4$ has the same definition and the same preferable range as $R^4$ in Formula (1). $R^4$ may form a covalent bond or a coordinate bond with $R^{23}$.

The compound represented by Formula (2) may further have a substituent, and this substituent has the same definition and the same preferable range as those of the substituent of $R^2$ and $R^3$.

In a preferable combination in Formula (2), $Z^{1a}$ and $Z^{1b}$ each independently form a benzene ring or a pyridine ring, $R^{5a}$ and $R^{5b}$ each independently represent an alkyl group, an alkoxy group, a halogen atom, or a cyano group, $R^{22}$ and $R^{23}$ each independently represent a heteroaryl group, a cyano group, an acyl group, an alkoxycarbonyl group, or a cyclic acid nucleus which is formed by $R^{22}$ and $R^{23}$ being bonded to each other, and $R^4$ represents a hydrogen atom, a substituted boron atom, a transition metal atom, magnesium, aluminum, calcium, barium, zinc, or tin. In a more preferable combination, both $Z^{1a}$ and $Z^{1b}$ form a benzene ring, both $R^{5a}$ and $R^{5b}$ represent an alkyl group, a halogen atom, or a cyano group, $R^{22}$ and $R^{23}$ each independently represent a combination of a nitrogen-containing heteroaryl group with a cyano group or an alkoxycarbonyl group or are bonded to each other to form a cyclic acid nucleus, and $R^4$ represents a hydrogen atom, a substituted boron atom, aluminum, zinc, vanadium iron, copper, palladium, iridium, or platinum.

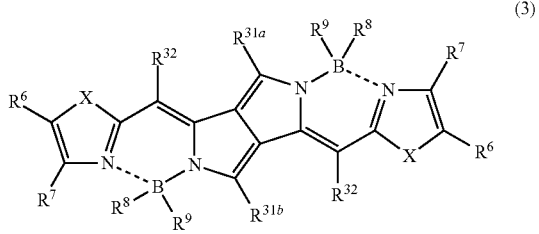

(3)

In Formula (3), $R^{31a}$ and $R^{31b}$ each independently represent an alkyl group having 1 to 20 carbon atoms, an aryl group having 6 to 20 carbon atoms, or a heteroaryl group having 3 to 20 carbon atoms. $R^{32}$ represents a cyano group, an acyl group having 1 to 6 carbon atoms, an alkoxycarbonyl group having 1 to 6 carbon atoms, an alkylsulfinyl group having 1 to 10 carbon atoms, an arylsulfinyl group having 6 to 10 carbon atoms, or a nitrogen-containing heteroaryl group having 3 to 10 carbon atoms. $R^6$ and $R^7$ each independently represent a hydrogen atom, an alkyl group having 1 to 10 carbon atoms, an aryl group having 6 to 10 carbon atoms, or a heteroaryl group having 4 to 10 carbon atoms. $R^6$ and $R^7$ may be bonded to each other to form a fused ring, and the formed ring is preferably an alicyclic ring having 5 to 10 carbon atoms, an aryl ring having 6 to 10 carbon atoms, or a heteroaryl ring having 3 to 10 carbon atoms. $R^8$ and $R^9$ each independently represent an alkyl group having 1 to 10 carbon atoms, an alkoxy group having 1 to 10 carbon atoms, an aryl group having 6 to 20 carbon atoms, or a heteroaryl group having 3 to 10 carbon atoms. X represents an oxygen atom, a sulfur atom, —NR—, or —CRR'—, and R and R' represent a hydrogen atom, an alkyl group having 1 to 10 carbon atoms, or an aryl group having 6 to 10 carbon atoms.

In Formula (3), $R^{31a}$ and $R^{31b}$ have the same definitions and the same preferable ranges as those of the examples described regarding $R^{1a}$ and $R^{1b}$ in Formula (1). It is preferable that $R^{31a}$ and $R^{31b}$ are the same as each other.

$R^{32}$ has the same definition and the same preferable range as $R^2$ in Formula (1).

$R^6$ and $R^7$ have the same definitions and the same preferable ranges as those of the examples of the substituent of $R^2$ and $R^3$ in Formula (1). In addition, $R^6$ and $R^7$ may be bonded to each other to form a ring. The formed ring is an alicyclic ring having 5 to 10 carbon atoms, an aryl ring having 6 to 10 carbon atoms, or a heteroaryl ring having 3 to 10 carbon atoms, and preferable examples thereof include a benzene ring, a naphthalene ring, and a pyridine ring. When $R^6$ and $R^7$ represent a boron complex obtained by introducing a substituted 5-membered nitrogen-containing heteroaryl ring, an infrared absorbing colorant having high fastness and high invisibility at the same time can be realized.

$R^8$ and $R^9$ have the same definitions and the same preferable ranges as those of the examples of the substituent of $R^2$ and $R^3$ in Formula (1).

X represents an oxygen atom, a sulfur atom, —NR—, or —CRR'—. R and R' each independently represent a hydrogen atom, an alkyl group having 1 to 10 carbon atoms, or an aryl group having 6 to 10 carbon atoms, and preferably represents a hydrogen atom, an alkyl group having 1 to 6 carbon atoms, or a phenyl group.

In a preferable combination in Formula (3), $R^{31a}$ and $R^{31b}$ each independently represent an alkyl group having 1 to 10 carbon atoms, a benzene ring, or a pyridine ring, $R^{32}$ represents a cyano group or an alkoxycarbonyl group, $R^6$ and $R^7$ are bonded to each other to form a benzene ring, a pyridine ring, a pyrazine ring, or a pyrimidine ring, $R^8$ and $R^9$ each independently represent an alkyl group having 1 to 6 carbon atoms, a phenyl group, or a naphthyl group, X represents an oxygen atom, a sulfur atom, —NR—, or —CRR'—, and R and R' each independently represent a hydrogen atom, an alkyl group having 1 to 6 carbon atoms, or a phenyl group. In a more preferable combination, both $R^{31a}$ and $R^{31b}$ represent an alkyl group having 1 to 10 carbon atoms or a benzene ring, $R^{32}$ represents a cyano group, $R^6$ and $R^7$ are bonded to each other to form a benzene ring or a pyridine ring, $R^8$ and $R^9$ each independently represent an alkyl group having 1 to 6 carbon atoms, a phenyl group, or a naphthyl group, and X represents an oxygen atom or a sulfur atom.

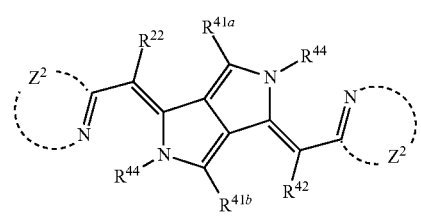

(4)

In Formula (4), $R^{41a}$ and $R^{41b}$ represent groups which are different from each other and represent an alkyl group having 1 to 20 carbon atoms, an aryl group having 6 to 20 carbon atoms, or a heteroaryl group having 3 to 20 carbon atoms. $R^{42}$ represents a cyano group, an acyl group having 1 to 6 carbon atoms, an alkoxycarbonyl group having 1 to 6 carbon atoms, an alkylsulfinyl group having 1 to 10 carbon atoms, an arylsulfinyl group having 6 to 10 carbon atoms, or a nitrogen-containing heteroaryl group having 3 to 10 carbon atoms. $Z^2$ represents an atomic group which forms a nitrogen-containing 5- or 6-membered heterocycle with —C=N—, and examples of the nitrogen-containing heteroaryl ring include a pyrazole ring, a thiazole ring, an oxazole ring, an imidazole ring, an oxadiazole ring, a thiadiazole ring, a triazole ring, a pyridine ring, a pyridazine ring, a pyrimidine ring, a pyrazine ring, a benzo fused ring or a naphtho fused ring thereof, or a fused ring complex thereof. $R^{44}$ represents a hydrogen atom, an alkyl group having 1 to 20 carbon atoms, an aryl group having 6 to 20 carbon atoms, a heteroaryl group having 4 to 20 carbon atoms, a metal atom, or a substituted boron atom which has a halogen atom, an alkyl group having 1 to 10 carbon atoms, an aryl group having 6 to 20 carbon atoms, or a heteroaryl group having 4 to 20 carbon atoms as a substituent, and may form a covalent bond or a coordinate bond with the nitrogen-containing heteroaryl ring formed by $Z^2$.

In Formula (4), $R^{41a}$ and $R^{41b}$ have the same definitions and the same preferable ranges as those of the examples described regarding $R^{1a}$ and $R^{1b}$ in Formula (1). In this case, $R^{41a}$ and $R^{41b}$ represent groups which are different from each other.

$R^{42}$ has the same definition and the same preferable range as $R^2$ in Formula (1).

$Z^2$ represents an atomic group which forms a nitrogen-containing 5- or 6-membered heterocycle with —C=N—, and examples of the nitrogen-containing heteroaryl ring include a pyrazole ring, a thiazole ring, an oxazole ring, an imidazole ring, an oxadiazole ring, a thiadiazole ring, a triazole ring, a pyridine ring, a pyridazine ring, a pyrimidine ring, a pyrazine ring, a benzo fused ring or a naphtho fused ring thereof, or a fused ring complex thereof.

$R^{44}$ represents a hydrogen atom, an alkyl group having 1 to 20 carbon atoms, an aryl group having 6 to 20 carbon atoms, a heteroaryl group having 4 to 20 carbon atoms, a metal atom, or a substituted boron atom which has a halogen atom, an alkyl group having 1 to 10 carbon atoms, an aryl group having 6 to 20 carbon atoms, or a heteroaryl group having 4 to 20 carbon atoms as a substituent, and may form a covalent bond or a coordinate bond with the nitrogen-containing heteroaryl ring formed by $Z^2$.

By introducing the groups represented by the $R^{41a}$ and $R^{41b}$ which are different from each other and introducing the nitrogen-containing 5- or 6-membered heterocycle which is formed by $Z^2$ and —C=N—, high fastness, high invisibility, excellent dispersibility, and high solubility in an organic solvent can be imparted.

In a preferable combination in Formula (4), $R^{41a}$ and $R^{41b}$ each independently represent an alkyl group having 1 to 10 carbon atoms, a benzene ring, or a pyridine ring, $R^{42}$ represents a cyano group, an alkyl or arylsulfinyl group having 1 to 10 carbon atoms, or an alkoxycarbonyl group, $Z^2$ and —C=N— form a thiazole ring, an oxazole ring, an imidazole ring, a thiadiazole ring, a triazole ring, a pyridine ring, a pyrimidine ring, a pyrazine ring, or a benzo fused ring or a naphtho fused ring thereof, $R^{44}$ represents a hydrogen atom, a substituted boron atom, a transition metal atom, magnesium, aluminum, calcium, barium, zinc, or tin. In a more preferable combination, $R^{41a}$ and $R^{41b}$ each independently represent an alkyl group having 1 to 10 carbon atoms or a benzene ring, $R^{42}$ represents a cyano group, $Z^2$ and —C=N— form a thiazole ring, an oxazole ring, an imidazole ring, a triazole ring, a pyridine ring, a pyrimidine ring, or a benzo fused ring or a naphtho fused ring thereof, $R^{44}$ represents a hydrogen atom, a substituted boron atom (which has an alkyl group having 1 to 10 carbon atoms, a benzene ring, a pyridine ring, or a thiophene ring as a substituent), aluminum, zinc, vanadium, iron, copper, palladium, iridium, or platinum.

As the pyrrolopyrrole colorant compound, a compound represented by the following Formula (5) is more preferable.

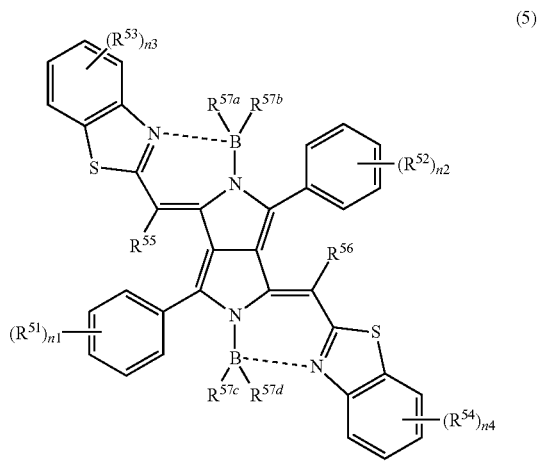

(5)

In Formula (5), $R^{51}$ to $R^{54}$ each independently represent a substituent.

$R^{55}$ and $R^{56}$ each independently represent a cyano group, an acyl group having 1 to 6 carbon atoms, an alkoxycarbonyl group having 1 to 6 carbon atoms, an alkylsulfinyl group having 1 to 10 carbon atoms, an arylsulfinyl group having 6 to 10 carbon atoms, or a nitrogen-containing heteroaryl group having 3 to 10 carbon atoms.

$R^{57a}$ to $R^{57d}$ each independently represent an alkyl group having 1 to 10 carbon atoms, an alkoxy group having 1 to 10 carbon atoms, an aryl group having 6 to 20 carbon atoms, or a heteroaryl group having 3 to 10 carbon atoms.

n1 and n2 each independently represent an integer of 0 to 5.

n3 and n4 each independently represent an integer of 0 to 4.

Examples of the substituent represented by $R^{51}$ and $R^{52}$ include the substituents described above regarding the substituent T.

$R^{51}$ and $R^{52}$ each independently represent preferably an alkyl group, an aryl group, an alkoxy group, an aryloxy group, a heteroaryloxy group, a halogen atom, or a cyano group, more preferably an alkoxy group or an aryloxy group, and still more preferably an alkoxy group.

The number of carbon atoms in the alkyl group is preferably 1 to 30 and more preferably 1 to 20. The alkyl group may be linear, branched, or cyclic and is preferably linear or branched.

The number of carbon atoms in the aryl group or the aryloxy group is preferably 6 to 30 and more preferably 6 to 20.

The number of carbon atoms in the alkoxy group is preferably 1 to 30 and more preferably 1 to 20. The alkoxy group is preferably linear or branched and more preferably branched.

A heteroaryl ring included in the heteroaryloxy group is preferably a 5- or 6-membered ring. In addition, the heteroaryl ring is preferably a monocycle or a fused ring, more preferably, a monocycle or a fused ring composed of 2 to 8 rings, and still more preferably a monocycle or a fused ring composed of 2 to 4 rings. The number of heteroatoms constituting the heteroaryl ring is preferably 1 to 3 and more preferably 1 or 2. Examples of the heteroatom include a nitrogen atom, an oxygen atom, and a sulfur atom.

Examples of the substituent represented by $R^{53}$ and $R^{54}$ include the substituents described above regarding the substituent T.

$R^{53}$ and $R^{54}$ each independently represent preferably an alkyl group, an aryl group, an alkoxy group, an aryloxy group, a heteroaryloxy group, a halogen atom, or a cyano group.

$R^{55}$ and $R^{56}$ each independently represent preferably a cyano group, an acyl group having 1 to 6 carbon atoms, an alkoxycarbonyl group having 1 to 6 carbon atoms, an alkylsulfinyl group having 1 to 10 carbon atoms, an arylsulfinyl group having 6 to 10 carbon atoms, a nitrogen-containing heteroaryl group having 3 to 10 carbon atoms, or a cyano group.

$R^{57a}$ to $R^{57d}$ each independently represent an alkyl group having 1 to 10 carbon atoms, an alkoxy group having 1 to 10 carbon atoms, an aryl group having 6 to 20 carbon atoms, or a heteroaryl group having 3 to 10 carbon atoms, preferably an alkyl group having 1 to 10 carbon atoms or an aryl group having 6 to 20 carbon atoms, more preferably an aryl group having 6 to 20 carbon atoms, and still more preferably a phenyl group.

n1 and n2 each independently represent an integer of 0 to 5, preferably 0 to 3, more preferably 0 to 2, and still more preferably 1. In a more preferable combination, n1 and n2 represent 1, and $R^{51}$ and $R^{52}$ represent an alkoxy group.

n3 and n4 each independently represent an integer of 0 to 4 and preferably 0 to 2.

Specific examples of the compound represented by Formula (1) include the following compounds. In addition, other specific examples of the compound represented by Formula (1) include compounds described in paragraphs "0049" to "0058" of JP2009-263614A.

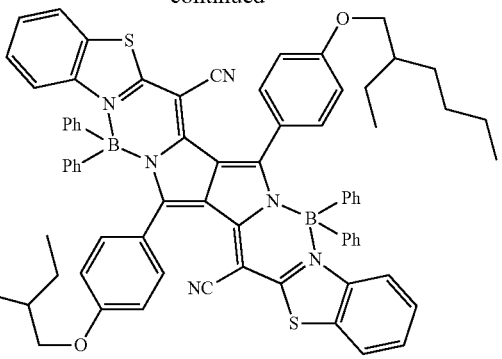

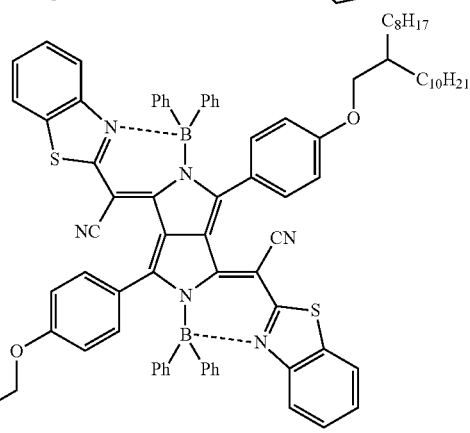

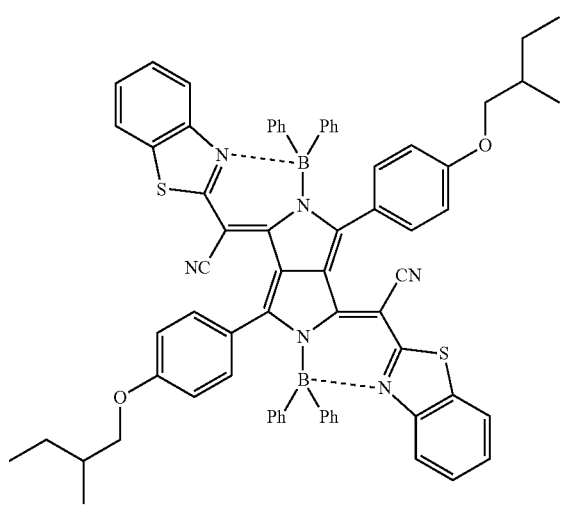

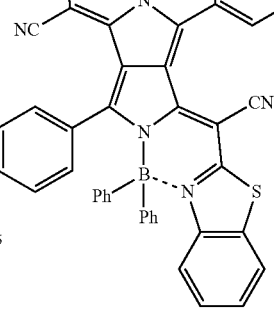

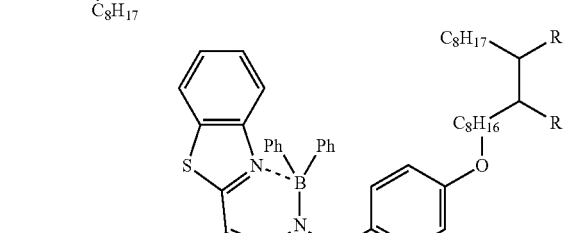

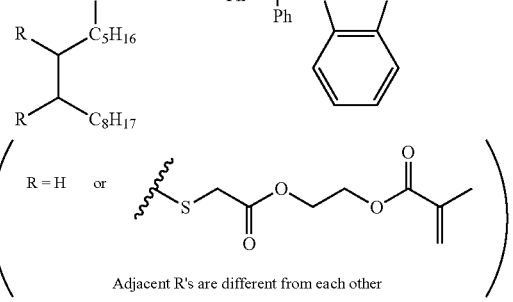

The content of the first colorants in the coloring composition is preferably 10 to 200 parts by mass, more preferably 20 to 150 parts by mass, and still more preferably 30 to 80 parts by mass with respect to 100 parts by mass of the second colorants described below. As a result, the above-described absorbance conditions of the coloring composition can be suitably achieved.

The content of the first colorants in the coloring composition is preferably 0 to 60 mass % and more preferably 10 to 40 mass % with respect to the total solid content of the coloring composition.

In the coloring composition, one first colorant may be used alone, or two or more first colorants may be used in combination. In a case where two or more first colorants are used in combination, it is preferable that the total content of the first colorants is in the above-described range.

<<Second Colorants>>

Next, the second colorants will be described.

The second colorants are colorants having an absorption maximum in a wavelength range of 400 to 700 nm.

As the second colorant, a pigment or a dye may be used. A pigment is preferable.

The pigment is preferably an organic pigment, and examples thereof are as follows. However, the present invention is not limited to the examples:

Color Index (C.I.) Pigment Yellow 1, 2, 3, 4, 5, 6, 10, 11, 12, 13, 14, 15, 16, 17, 18, 20, 24, 31, 32, 34, 35, 35:1, 36, 36:1, 37, 37:1, 40, 42, 43, 53, 55, 60, 61, 62, 63, 65, 73, 74, 77, 81, 83, 86, 93, 94, 95, 97, 98, 100, 101, 104, 106, 108, 109, 110, 113, 114, 115, 116, 117, 118, 119, 120, 123, 125, 126, 127, 128, 129, 137, 138, 139, 147, 148, 150, 151, 152, 153, 154, 155, 156, 161, 162, 164, 166, 167, 168, 169, 170, 171, 172, 173, 174, 175, 176, 177, 179, 180, 181, 182, 185, 187, 188, 193, 194, 199, 213, and 214 (all of which are yellow pigments);

C.I. Pigment Orange 2, 5, 13, 16, 17:1, 31, 34, 36, 38, 43, 46, 48, 49, 51, 52, 55, 59, 60, 61, 62, 64, 71, and 73 (all of which are orange pigments);

C.I. Pigment Red 1, 2, 3, 4, 5, 6, 7, 9, 10, 14, 17, 22, 23, 31, 38, 41, 48:1, 48:2, 48:3, 48:4, 49, 49:1, 49:2, 52:1, 52:2, 53:1, 57:1, 60:1, 63:1, 66, 67, 81:1, 81:2, 81:3, 83, 88, 90, 105, 112, 119, 122, 123, 144, 146, 149, 150, 155, 166, 168, 169, 170, 171, 172, 175, 176, 177, 178, 179, 184, 185, 187, 188, 190, 200, 202, 206, 207, 208, 209, 210, 216, 220, 224, 226, 242, 246, 254, 255, 264, 270, 272, and 279 (all of which are red pigments);

C.I. Pigment Green 7, 10, 36, 37, and 58 (all of which are green pigments);

C.I. Pigment Violet 1, 19, 23, 27, 32, 37, and 42 (all of which are violet pigments); and C.I. Pigment Blue 1, 2, 15, 15:1, 15:2, 15:3, 15:4, 15:6, 16, 22, 60, 64, 66, 79, and 80 (all of which are blue pigments).

Among these organic pigments, one kind may be used alone, or two or more kinds may be used in combination.

As the dye, well-known dyes for a color filter of the related art can be used without any particular limitation.

In terms of a chemical structure, a dye such as a pyrazole azo dye, an anilino azo dye, a triphenylmethane dye, an anthraquinone dye, an anthrapyridone dye, a benzylidene dye, an oxonol dye, a pyrazolotriazole azo dye, a pyridone azo dye, a cyanine dye, a phenothiazine dye, a pyrrolopyrazole azomethine dye, a xanthene dye, a phthalocyanine dye, a benzopyran dye, an indigo dye, or a pyrromethene dye can be used. In addition, a polymer of the above-described dyes may be used. In addition, dyes described in JP2015-028144A and JP2015-34966A can also be used.

In addition, as the dye, an acid dye and/or a derivative thereof may be suitably used.

Furthermore, for example, a direct dye, a basic dye, a mordant dye, an acid mordant dye, an azoic dye, a disperse dye, an oil-soluble dye, a food dye, and/or a derivative thereof can be suitably used.

Specific examples of the acid dye are shown below, but the present invention is not limited to these examples. For example, the following dyes and derivatives thereof can be used:

acid alizarin violet N;
acid black 1, 2, 24, 48;
acid blue 1, 7, 9, 15, 18, 23, 25, 27, 29, 40-45, 62, 70, 74, 80, 83, 86, 87, 90, 92, 103, 112, 113, 120, 129, 138, 147, 158, 171, 182, 192, 243, and 324:1;
acid chrome violet K;
acid Fuchsin and acid green 1, 3, 5, 9, 16, 25, 27, and 50;
acid orange 6, 7, 8, 10, 12, 50, 51, 52, 56, 63, 74, and 95;
acid red 1, 4, 8, 14, 17, 18, 26, 27, 29, 31, 34, 35, 37, 42, 44, 50, 51, 52, 57, 66, 73, 80, 87, 88, 91, 92, 94, 97, 103, 111, 114, 129, 133, 134, 138, 143, 145, 150, 151, 158, 176, 183, 198, 211, 215, 216, 217, 249, 252, 257, 260, 266, and 274;
acid violet 6B, 7, 9, 17, and 19; and
acid yellow 1, 3, 7, 9, 11, 17, 23, 25, 29, 34, 36, 42, 54, 72, 73, 76, 79, 98, 99, 111, 112, 114, 116, 184, and 243 and Food Yellow 3.

In addition to the above-described examples, an azo acid dye, a xanthene acid dye, and a phthalocyanine acid dye are preferably used, and the following acid dyes, C.I. Solvent Blue 44 and 38, C.I. Solvent Orange 45, Rhodamine B, and Rhodamine 110 and derivatives of the dyes are preferably used.

Among these, it is preferable that the dye is a colorant selected from the group consisting of a triarylmethane dye, an anthraquinone dye, an azomethine dye, a benzylidene dye, an oxonol dye, a cyanine dye, a phenothiazine dye, a pyrrolopyrazole azomethine dye, a xanthene dye, a phthalocyanine dye, a benzopyran dye, an indigo dye, a pyrazole azo dye, an anilino azo dye, a pyrazolotriazole azo dye, a pyridone azo dye, an anthrapyridone dye, and a pyrromethene dye.

Further, a combination of a pigment and a dye may be used.

In addition, as the second colorant, a bisbenzofuranone pigment, an azomethine pigment, a perylene pigment, or an azo dye can be used.

Examples of the bisbenzofuranone pigment include pigments described in JP2012-528448A, JP2010-534726A, and JP2012-515234A. For example, "IRAGAPHOR BK" (manufactured by BASF SE) is available.

Examples of the azomethine pigment include pigments described in JP1989-170601A (JP-H01-170601A) and JP1990-34664A (JP-H02-34664A). For example, "Chromofine Black A1103" (manufactured by Dainichiseika Color & Chemicals Mfg. Co., Ltd.) is available.

The azo dye is not particularly limited, and for example, a compound represented by the following Formula (A-1) can be suitably used.

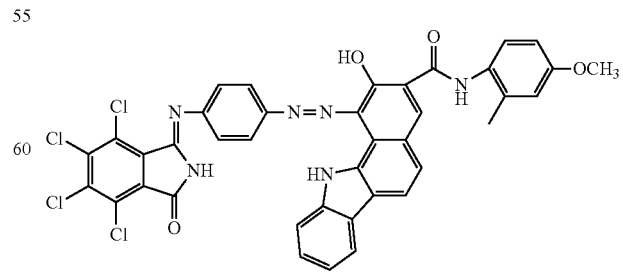

Chromofine Black A1103

-continued

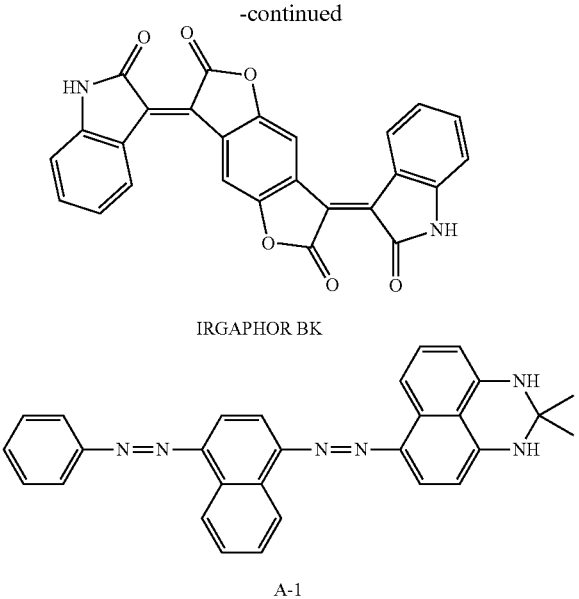

IRGAPHOR BK

A-1

In a preferable embodiment of the second colorants, it is preferable that the second colorants include two or more colorants selected from a red colorant, a yellow colorant, a blue colorant, and a violet colorant, and it is more preferable that the second colorants include a red colorant, a yellow colorant, a blue colorant, and a violet colorant. In a preferable example, it is preferable that the second colorants include C.I. Pigment Red 254 as a red pigment, C.I. Pigment Yellow 139 as a yellow pigment, C.I. Pigment Blue 15:6 as a blue pigment, and C.I. Pigment Violet 23 as a violet pigment.

In a case where the second colorants included in the coloring composition include a combination of a red colorant, a yellow colorant, a blue colorant, and a violet colorant, a ratio of the mass of the red colorant to the total mass of the second colorants is 0.1 to 0.4, a ratio of the mass of the yellow colorant to the total mass of the second colorants is 0.1 to 0.4, a ratio of the mass of the blue colorant to the total mass of the second colorants is 0.2 to 0.6, and a ratio of the mass of the violet colorant to the total mass of the second colorants is 0.01 to 0.3. It is more preferable that a ratio of the mass of the red colorant to the total mass of the second colorants is 0.1 to 0.3, a ratio of the mass of the yellow colorant to the total mass of the second colorants is 0.1 to 0.3, a ratio of the mass of the blue colorant to the total mass of the second colorants is 0.3 to 0.5, and a ratio of the mass of the violet colorant to the total mass of the second colorants is 0.05 to 0.25.

In addition, in another preferable embodiment of the second colorants, it is preferable that the second colorants include at least one colorant selected from the group consisting of a bisbenzofuranone pigment, an azomethine pigment, a perylene pigment, and an azo dye, and it is more preferable that the second colorants include at least one colorant selected from the group consisting of a bisbenzofuranone pigment, an azomethine pigment, and a perylene pigment.

The content of the pigment in the second colorants is preferably 95 mass % or higher, more preferably 97 mass % or higher, and still more preferably 99 mass % or higher with respect to the total mass of the second colorants.

The content of the second colorants in the coloring composition is preferably 10 to 60 mass % and more preferably 30 to 50 mass % with respect to the total solid content of the coloring composition.

The total content of the first colorants and the second colorants in the coloring composition is preferably 1 to 80 mass %, more preferably 20 to 70 mass %, and still more preferably 30 to 70 mass % with respect to the total solid content of the coloring composition.

<<Other Colorants>>

The coloring composition according to the present invention may further include a colorant (hereinafter, also referred to as "third colorant") other than the first colorants and the second colorants. That is, the coloring composition according to the present invention may include a colorant having an absorption maximum in a wavelength range other than the wavelength range of 400 to 700 nm and the wavelength range of 800 to 900 nm. The content of the third colorant is preferably 3 mass % or lower, more preferably 1 mass % or lower, and still more preferably 0 mass % with respect to the total mass of the colorants.

<<Colorant Derivative>>

The coloring composition may include a colorant derivative having a structure in which a portion of the first colorant is substituted with an acidic group, a basic group, or a phthalimidomethyl group. As the colorant derivative, a colorant derivative having an acidic group or a basic group is preferable from the viewpoints of dispersibility and dispersion stability. In particular, a pyrrolopyrrole colorant derivative is preferable, and a pyrrolopyrrole pigment derivative is more preferable.

As the acidic group included in the colorant derivative, a sulfonic acid, a carboxylic acid, or a quaternary ammonium salt thereof is preferable, a carboxylate group or a sulfonate group is more preferable, and a sulfonate group is still more preferable. As the basic group included in the pigment derivative, an amino group is preferable, and a tertiary amine group is more preferable.

<<Pigment Dispersion>>

In a case where a pigment is used as a colorant, it is preferable that the coloring composition according to the present invention is prepared using a method including: preparing a pigment dispersion by dispersing the pigment and optionally other components such as a resin, an organic solvent, or a pigment derivative; and mixing the obtained pigment dispersion with other components of the coloring composition.

The pigment dispersion may be prepared by dispersing the first colorants and the second colorants separately or by dispersing (co-dispersing) the first colorants and the second colorants together. In particular, in a case where the first colorants include a pyrrolopyrrole colorant compound (preferably a pyrrolopyrrole colorant compound represented by Formula (1)), it is preferable that the first colorants and the second colorants are co-dispersed. According to this embodiment, the dispersion stability of the pyrrolopyrrole colorant compound can be improved.

Hereinafter, the composition of the pigment dispersion and a method of preparing the pigment dispersion will be described in detail.

<<<<Pigment>>>>

In the coloring composition, it is preferable that an average particle size (r) of the pigment satisfies preferably 20 nm≤r≤300 nm, more preferably 25 nm≤r≤250 nm, and still more preferably 30 nm≤r≤200 nm. "Average particle size" described herein denotes the average particle size of secondary particles which are aggregates of primary particles of the pigment.

In addition, regarding a particle size distribution of the secondary particles of the pigment (hereinafter, referred to simply as "particle size distribution") which can be used, it is preferable that secondary particles having a particle size of (average particle size±100) nm account for 70 mass % or higher, preferably, 80 mass % or higher in the pigment. The particle size distribution of the secondary particles can be measured using a scattering intensity distribution.

The pigment having a secondary particle size and a particle size distribution of secondary particles in the above-described ranges can be prepared by mixing and dispersing a pigment mixed solution while pulverizing the pigment mixed solution using a pulverizer such as a bead mill or a roll mill, the pigment mixed solution being obtained by mixing a commercially available pigment and another pigment (having an average particle size of secondary particles of more than 300 nm), which is optionally used, with a resin and an organic solvent. The pigment obtained as described above is typically in the form of a pigment dispersion.

The average particle size of primary particles can be obtained by observing a pigment with a scanning electron microscope (SEM) or a transmission electron microscope (TEM), measuring particle sizes of 100 particles in a region where particles do not aggregate, and obtaining an average value of the measured particle sizes.

—Refinement of Pigment—

In the present invention, a pigment having fine granulated particles is preferably used. The pigment can be refined through the following steps of: preparing a high-viscosity liquid composition using the pigment, a water-soluble organic solvent, and a water-soluble inorganic salt; and pulverizing the liquid composition under stress using, for example, a wet pulverizer.

Examples of the water-soluble organic solvent used in the refinement process of the pigment include methanol, ethanol, isopropanol, n-propanol, isobutanol, n-butanol, ethylene glycol, diethylene glycol, diethylene glycol monomethyl ether, diethylene glycol monoethyl ether, diethylene glycol monobutyl ether, propylene glycol, and propylene glycol monomethyl ether acetate.

In addition, another solvent having a low water solubility or no water solubility may be used as long as it is adsorbed on the pigment and does not wash away in waste water by using it in a small amount, and examples of the solvent having a low water solubility or no water solubility include benzene, toluene, xylene, ethylbenzene, chlorobenzene, nitrobenzene, aniline, pyridine, quinoline, tetrahydrofuran, dioxane, ethyl acetate, isopropyl acetate, butyl acetate, hexane, heptane, octane, nonane, decane, undecane, dodecane, cyclohexane, methylcyclohexane, halogenated hydrocarbon, acetone, methyl ethyl ketone, methyl isobutyl ketone, cyclohexanone, dimethyl formamide, dimethyl sulfoxide, and N-methyl pyrrolidone.

Among these solvents used in the refinement process of the pigment, one kind may be used, or optionally, a mixture of two or more kinds may be used.

Examples of the water-soluble inorganic salt used in the refinement process of the pigment include sodium chloride, potassium chloride, calcium chloride, barium chloride, and sodium chloride.

The amount of the water-soluble inorganic salt used in the refinement process is preferably 1 to 50 times the mass of the pigment. The more the amount of the water-soluble inorganic salt used, the higher the pulverizing effect. However, the amount of the water-soluble inorganic salt used is preferably 1 to 10 times the mass of the pigment from the viewpoint of productivity. In addition, an inorganic salt having a water content of 1% or lower is preferably used.

The amount of the water-soluble organic solvent used in the refinement process is 50 to 300 parts by mass and more preferably 100 to 200 parts by mass with respect to 100 parts by mass of the pigments.

Operating conditions of the wet pulverizer in the refinement process of the pigment are not particularly limited. In order to effectively promote the pulverization using a pulverization medium, in a case where the pulverizer is a kneader, it is preferable that operating conditions are as follows: the rotating speed of a blade in the kneader is preferably 10 to 200 rpm, and a speed ratio between two shafts is relatively high. Under these conditions, the pulverization effect is high. The operating time including a dry pulverization time is preferably 1 hour to 8 hours, and the internal temperature of the kneader is preferably 50° C. to 150° C. In addition, it is preferable that the water-soluble inorganic salt as a pulverization medium has a particle size of 5 to 50 μm, has a sharp particle size distribution, and is spherical.

<<<<Resin (Dispersion Resin)>>>>

Examples of the resin (dispersion resin) used for preparing the pigment dispersion include: a polymeric dispersant such as a resin having an amine group (polyamideamine or a salt thereof), an oligoimine resin, a polycarboxylic acid or a salt thereof, a high-molecular-weight unsaturated acid ester, a modified polyurethane, a modified polyester, a modified poly(meth)acrylate, a (meth)acrylic copolymer, or a naphthalene sulfonic acid formalin condensate; a surfactant such as a polyoxyethylene alkyl phosphoric acid ester, polyoxyethylene alkyl amine, or alkanol amine; and a pigment derivative.

In terms of a structure, the polymeric dispersant can be further classified into a linear polymer, a terminal-modified polymer, a graft polymer, and a block polymer.

In addition, as the polymeric dispersant, a resin having an acid value of 60 mgKOH/g or higher (more preferably 60 mgKOH/g or higher and 300 mgKOH/g or lower) can be preferably used.

Examples of the terminal-modified polymer having an anchor site to a pigment surface include a polymer having a phosphate group at a terminal thereof described in JP1991-112992A (JP-H03-112992A) or JP2003-533455A, a polymer having a sulfonate group at a terminal thereof described in JP2002-273191A, and a polymer having a partial skeleton or a heterocycle of an organic colorant described in JP1997-77994A (JP-H09-77994A). In addition, polymers described in JP2007-277514A in which two or more anchor sites (for example, an acid group, a basic group, a partial skeleton or a hetero ring of an organic colorant) to a pigment surface are introduced into a terminal thereof are also preferable due to its dispersion stability.

Examples of the graft polymer having an anchor site to a pigment surface include a reaction product of poly(lowalkylene imine) and polyester described in JP1979-37082A (JP-S54-37082A), JP1996-507960A (JP-H08-507960A), or JP2009-258668A, a reaction product of polyallylamine and polyester described in JP1997-169821A (JP-H09-169821A), a copolymer of a macromonomer and a nitrogen-containing monomer described in JP1998-339949A (JP-H10-339949A) or JP2004-37986A, a graft polymer having a partial skeleton or a heterocycle of an organic colorant described in JP2003-238837A, JP2008-9426A, or JP2008-81732A, and a copolymer of a macromonomer and an acid group-containing monomer described in JP2010-106268A.

As the macromonomer used for manufacturing the graft polymer having an anchor site to a pigment surface by radical polymerization, a well-known macromonomer can be used, and examples thereof include macromonomers manufactured by Toagosei Co., Ltd. such as AA-6 (polymethyl methacrylate having a methacryloyl group as a terminal group), AS-6 (polystyrene having a methacryloyl group as a terminal group), AN-6S (a copolymer of styrene and acrylonitrile having a methacryloyl group as a terminal group), and AB-6 (polybutyl acrylate having a methacryloyl group as a terminal group); macromonomers manufactured by Daicel Corporation such as PLACCEL FM5 (an adduct of 2-hydroxyethyl methacrylate and 5 molar equivalents of ε-caprolactone) and FA10L (an adduct of 2-hydroxyethyl acrylate and 10 molar equivalents of ε-caprolactone); and a polyester macromonomer described in JP1990-272009A (JP-H02-272009A). Among these, from the viewpoint of the developability and dispersion stability of the pigment dispersion and the developability of the coloring composition in which the pigment dispersion is used, a polyester macromonomer having excellent flexibility and solvent compatibility is more preferable, and the polyester macromonomer represented by the polyester macromonomer described in JP1990-272009A (JP-H02-272009A) is most preferable.

As the block polymer having an anchor site to a pigment surface, a block polymer described in JP2003-49110A or JP2009-52010A is preferable.

As the resin, a graft copolymerization including a structural unit represented by any one of the following Formulae (1) to (4) can also be used.

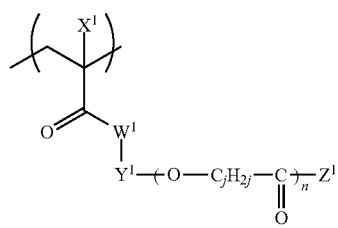

(1)

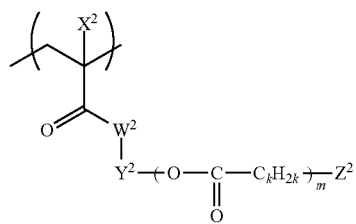

(2)

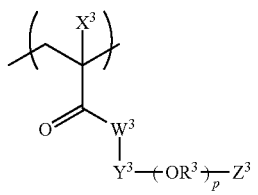

(3)

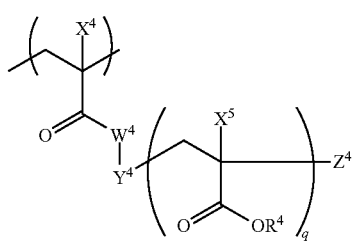

(4)

$X^1$, $X^2$, $X^3$, $X^4$, and $X^5$ each independently represent a hydrogen atom or a monovalent organic group, preferably a hydrogen atom or an alkyl group having 1 to 12 carbon atoms, more preferably a hydrogen atom or a methyl group, and still more preferably a methyl group.

$W^1$, $W^2$, $W^3$, and $W^4$ each independently represent an oxygen atom or NH and preferably an oxygen atom.

$R^3$ represents a branched or linear alkylene group (having preferably 1 to 10 carbon atoms and more preferably 2 or 3 carbon atoms). From the viewpoint of dispersion stability, it is preferable that $R^3$ represents a group represented by —$CH_2$—$CH(CH_3)$— or a group represented by —$CH(CH_3)$—$CH_2$—.

$Y^1$, $Y^2$, $Y^3$, and $Y^4$ each independently represent a divalent linking group, and a structure thereof is not particularly limited.

The graft copolymer can be found in the description of paragraphs "0025" to "0069 of JP2012-255128A, the content of which is incorporated herein by reference.

Specific examples of the graft copolymer are as follows. In addition, a resin described in paragraphs "0072" to "0094" of JP2012-255128A can be used.

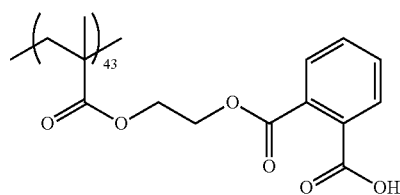

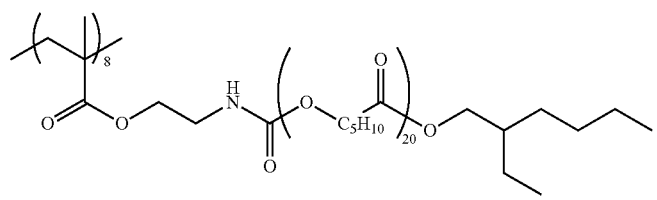

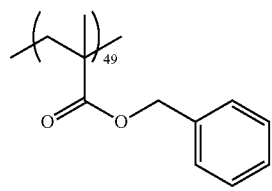

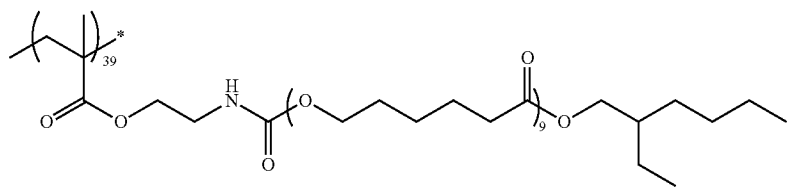

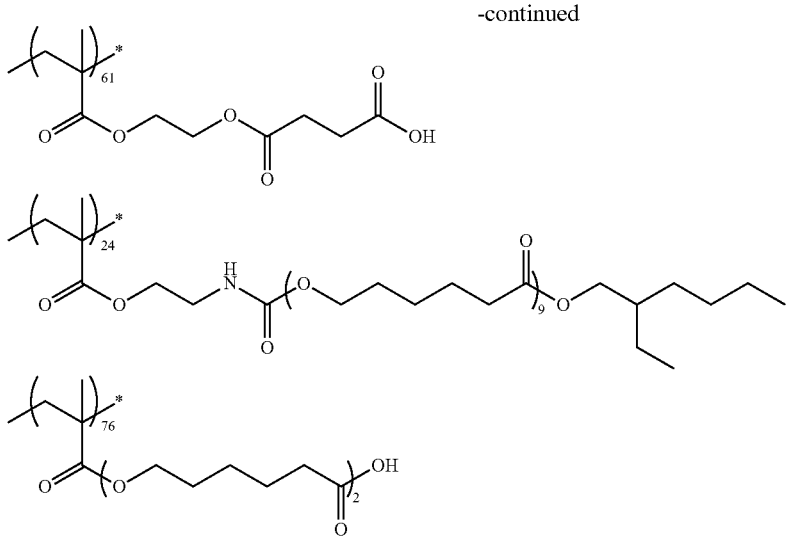

In addition, as the resin, an oligoimine dispersant having a nitrogen atom at least either a main chain or a side chain can be used. As the oligoimine dispersant, a resin, which includes a structural unit having a partial structure X with a functional group (pKa: 14 or lower) and a side chain including a side chain Y having 40 to 10000 atoms and has a basic nitrogen atom at least either a main chain or a side chain, is preferable. The basic nitrogen atom is not particularly limited as long as it is a nitrogen atom exhibiting basicity.

Examples of the oligoimine dispersant include a dispersion resin including a structural unit represented by the following Formula (I-1), a structural unit represented by the following Formula (I-2), and/or a structural unit represented by the following Formula (I-2a).

 (I-1)

 (I-2)

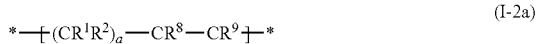 (I-2a)

$R^1$ and $R^2$ each independently represent a hydrogen atom, a halogen atom, or an alkyl group (having preferably 1 to 6 carbon atoms). a's each independently represent an integer of 1 to 5. * represents a linking portion between structural units.

$R^8$ and $R^9$ represent the same group as that of $R^1$.

L represents a single bond, an alkylene group (having preferably 1 to 6 carbon atoms), an alkenylene group (having preferably 2 to 6 carbon atoms), an arylene group (having preferably 6 to 24 carbon atoms), an heteroarylene group (having preferably 1 to 6 carbon atoms), an imino group (having preferably 0 to 6 carbon atoms), an ether group, a thioether group, a carbonyl group, or a linking group of a combination of the above-described groups. Among these, a single bond or —$CR^5R^6$—$NR^7$— (an imino group is present at the X or Y site) is preferable. Here, $R^5$ and $R^6$ each independently represent a hydrogen atom, a halogen atom, or an alkyl group (having preferably 1 to 6 carbon atoms). $R^7$ represents a hydrogen atom or an alkyl group having 1 to 6 carbon atoms.

$L^a$ is structural unit which forms a ring structure with $CR^8CR^9$ and N, preferably a structural unit which forms a nonaromatic heterocycle having 3 to 7 carbon atoms with $CR^8CR^9$ and a carbon atom, more preferably a structural unit which forms a nonaromatic 5- to 7-membered heterocycle with $CR^8CR^9$ and N (nitrogen atom), still more preferably a structural unit which forms a nonaromatic 5-membered heterocycle with $CR^8CR^9$ and N, and even still more preferably a structural unit which forms pyrrolidine with $CR^8CR^9$ and N. This structural unit may have a substituent such as an alkyl group.

X represents a group having a functional group (pKa: 14 or lower).

Y represents a side chain having 40 to 10000 atoms.

The dispersion resin (oligoimine dispersant) may further include one or more copolymerization components selected from the group consisting of the structural units represented by Formulae (I-3), (I-4), and (I-5). By the dispersion resin containing the above-described structural units, the dispersion performance can be further improved.

 (I-3)

 (I-4)

-continued

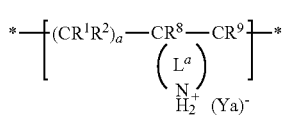
(I-5)

R[1], R[2], R[8], R[9], L, La, a, and * have the same definitions as those in Formulae (I-1), (I-2), and (I-2a).

Ya represents a side chain having 40 to 10000 atoms which has an anionic group. The structural unit represented by Formula (I-3) can be formed by adding an oligomer or a polymer having a group, which reacts with amine to form a salt, to a resin having a primary or secondary amino group at a main chain such that they react with each other.

The oligoimine dispersant can be found in the description of paragraphs "0102" to "0166" of JP2012-255128A, the content of which is incorporated herein by reference.

Specific examples of the oligoimine dispersant are as follows. In addition, a resin described in paragraphs "0168" to "0174" of JP2012-255128A can be used.

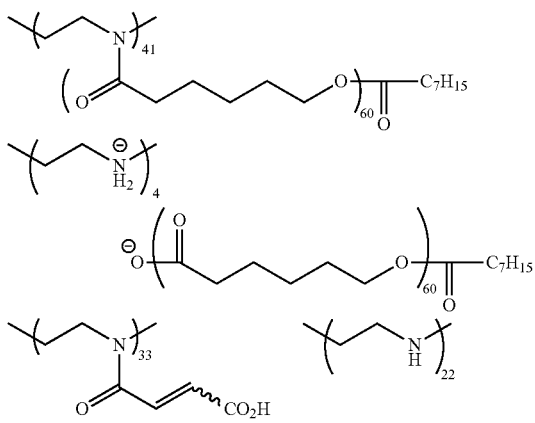

As the resin, a resin including a structural unit represented by the following Formula (P1) can be used. By using the following resin, the dispersibility of the colorants (in particular, the pyrrolopyrrole colorant compound represented by Formula (1)) can be further improved.

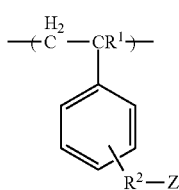
(P1)

In Formula (P1), R[1] represents a hydrogen atom or a methyl group, R[2] represents an alkylene group, and Z represents a nitrogen-containing heterocyclic structure.

The alkylene group represented by R[2] is not particularly limited, and examples thereof include a methylene group, an ethylene group, a trimethylene group, a tetramethylene group, a hexamethylene group, a 2-hydroxypropylene group, a methyleneoxy group, an ethyleneoxy group, a methyleneoxycarbonyl group, and a methylenethio group. Among these, a methylene group, a methyleneoxy group, a methyleneoxycarbonyl group, or a methylenethio group is more preferable.

Examples of the nitrogen-containing heterocyclic structure represented by Z include a structure including a pyridine ring, a pyrazine ring, a pyrimidine ring, a pyrrole ring, an imidazole ring, a triazole ring, a tetrazole ring, an indole ring, a quinoline ring, an acridine ring, a phenothiazine ring, a phenoxazine ring, an acridone ring, an anthraquinone ring, a benzimidazole structure, a benzotriazole structure, a benzothiazole structure, a cyclic amide structure, a cyclic urea structure, or a cyclic imide structure. Among these, as the nitrogen-containing heterocyclic structure represented by Z, a structure represented by the following Formula (P2) or (P3) is preferable.

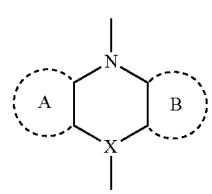
(P2)

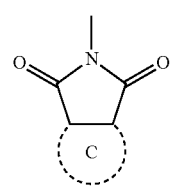
(P3)

In Formula (P2), X represents one selected from the group consisting of a single bond, an alkylene group (for example, a methylene group, an ethylene group, a propylene group, a trimethylene group, or a tetramethylene group)-O—, —S—, —NR—, and —C(=O)—. Here, R represents a hydrogen atom or an alkyl group. Examples of the alkyl group represented by R include a methyl group, an ethyl group, a n-propyl group, an i-propyl group, a n-butyl group, a t-butyl group, a n-hexyl group, a n-octyl group, a 2-ethylhexyl group, and a n-octadecyl group.

Among these, X represents preferably a single bond, a methylene group, —O—, or —C(=O)— and more preferably —C(=O)—.

In Formulae (P2) and (P3), ring A, ring B, and ring C each independently represent an aromatic ring. Examples of the aromatic ring include a benzene ring, a naphthalene ring, an indene ring, an azulene ring, a fluorene ring, an anthracene ring, a pyridine ring, a pyrazine ring, a pyrimidine ring, a pyrrole ring, an imidazole ring, an indole ring, a quinoline ring, an acridine ring, a phenothiazine ring, a phenoxazine ring, an acridone ring, and an anthraquinone ring. Among these, a benzene ring, a naphthalene ring, an anthracene ring, a pyridine ring, a phenoxazine ring, an acridine ring, a phenothiazine ring, an acridone ring, or an anthraquinone ring is preferable, and a benzene ring, a naphthalene ring, or a pyridine ring is more preferable.

Specific examples of the structural unit represented by Formula (P1) are as follows. In addition, specific examples of the structural unit can be found in paragraph "0023" of JP2008-009426A, the content of which is incorporated herein by reference.

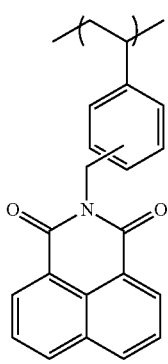

The resin including the structural unit represented by Formula (P1) may further include the structural unit represented by any one of Formulae (1) to (4) of the resin. In addition, the resin including the structural unit represented by Formula (P1) may further the structural unit represented by any one of Formulae (I-1), (I-2), (I-2a), (I-3), (I-4), and (I-5) of the resin.

Specific examples of the resin including the structural unit represented by Formula (P1) are as follows.

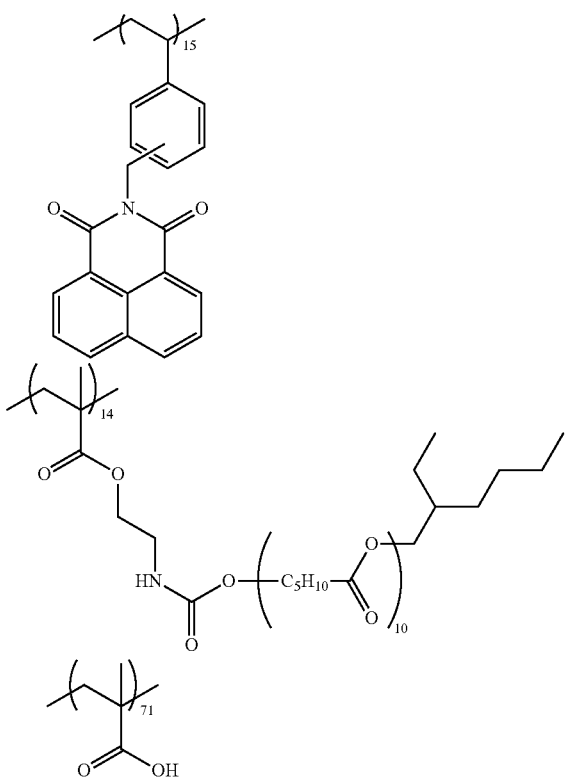

The resin is available as a commercially available product, and specific examples thereof include: "Disperbyk-101 (polyamideamine phosphate), 107 (carboxylate), 110, 111 (copolymer containing an acid group), 130 (polyamide), 161, 162, 163, 164, 165, 166, and 170 (high molecular weight copolymer)" and "BYK-P104, P105 (high molecular weight unsaturated polycarboxylic acid)" all of which are manufactured by BYK Chemie; "EFKA 4047, 4050 to 4010 to 4165 (polyurethane compound), EFKA 4330 to 4340 (block copolymer), 4400 to 4402 (modified polyacrylate), 5010 (polyester amide), 5765 (high molecular weight polycarboxylate), 6220 (fatty acid polyester), 6745 (phthalocyanine derivative), and 6750 (azo pigment derivative)" all of which are manufactured by EFKA; "AJISPER PB821, PB822, PB880, and PB881" all of which are manufactured by Ajinomoto Fine Techno Co., Inc.; "FLOWLEN TG-710 (urethane oligomer)" and "POLYFLOW No. 50E and No. 300 (acrylate copolymer)" all of which are manufactured by Kyoeisha Chemical Co., Ltd.; "DISPARLON KS-860, 873SN, 874, #2150 (aliphatic polycarboxylic acid), #7004 (polyether ester), DA-703-50, DA-705, and DA-725" all of which are manufactured by Kusumoto Chemicals Ltd.; "DEMOL RN, N (naphthalene sulfonic acid formalin polycondensate), MS, C, and SN-B (aromatic sulfonic acid formalin polycondensate)", "HOMOGENOL L-18 (high molecular polycarboxylic acid)", "EMULGEN 920, 930, 935, and 985 (polyoxyethylene nonylphenyl ether)", and "ACETAMIN 86 (stearylamine acetate)" all of which are manufactured by Kao Corporation; "SOLSPERSE 5000 (phthalocyanine derivative), 22000 (azo pigment derivative), 13240 (polyester amine), 3000, 17000, 27000 (polymer having a functional group at a terminal thereof), 24000, 28000, 32000, and 38500 (graft polymer)" all of which are manufactured by Lubrizol Corporation; "NIKKOL T106 (polyoxyethylene sorbitan monooleate) and MYS-IEX (polyoxyethylene monostearate)" all of which manufactured by Nikko Chemicals Co., Ltd.; "HINOACT T-8000E" manufactured by Kawaken Fine Chemicals Co., Ltd.; "organosiloxane polymer KP341" manufactured by Shin-Etsu Chemical Co., Ltd.; "W001: cationic surfactant" manufactured by Yusho Co., Ltd.; nonionic surfactants such as polyoxyethylene lauryl ether, polyoxyethylene stearyl ether, polyoxyethylene oleyl ether, polyoxyethylene octylphenyl ether, polyoxyethylene nonylphenyl ether, polyethylene glycol dilaurate, polyethylene glycol distearate, and sorbitan fatty acid esters; anionic surfactants such as "W004, W005, and W017" all of which are manufactured by Yusho Co. Ltd.; polymeric dispersants such as "EFKA-46, EFKA-47, EFKA-47EA, EFKA POLYMER 100, EFKA POLYMER 400, EFKA POLYMER 401, and EFKA POLYMER 450" all of which are manufactured by Morishita Co., Ltd. and "DISPERSE AID 6, DISPERSE AID 8, DISPERSE AID 15, and DISPERSE AID 9100" all of which are manufactured by San Nopco Limited; "ADEKA PLURONIC L31, F38, L42, L44, L61, L64, F68, L72, P95, F77, P84, F87, P94, L101, P103, F108, L121, and P-123" all of which are manufactured by Adeka Corporation; and "ISONET S-20" manufactured by Sanyo Chemical Industries Ltd.

Among these resins, one kind may be used alone, or two or more kinds may be used in combination. In the present invention, in particular, it is preferable that the pigment derivative described below and a polymeric dispersant are used in combination. In addition, regarding the resin, the terminal-modified polymer, the graft polymer, or the block polymer having an anchor site to a pigment surface may be used in combination with an alkali-soluble resin described below. Examples of the alkali-soluble resin include a (meth)acrylic acid copolymer, an itaconic acid copolymer, a crotonic acid copolymer, a maleic acid copolymer, a partially esterified maleic acid copolymer, an acidic cellulose derivative having a carboxylic acid at a side chain thereof, and a resin obtained by modifying a polymer having a hydroxyl group with an acid anhydride. Among these, a (meth)acrylic acid copolymer is preferable. In addition, an N-position-substituted maleimide monomer copolymer described in JP1998-300922A (JP-H10-300922A), an ether dimer copolymer described in JP2004-300204A, or an alkali-soluble resin having a polymerizable group described in JP1995-319161A (JP-H07-319161A) is also preferable.

The content of the resin (dispersion resin) in the pigment dispersion is preferably 1 to 80 parts by mass, more preferably 5 to 70 parts by mass, and still more preferably 10 to 60 parts by mass with respect to 100 parts by mass of the pigments.

Specifically, in a case where a polymeric dispersant is used, the amount of the polymeric dispersant used is preferably 5 to 100 parts by mass and more preferably 10 to 80 parts by mass with respect to 100 parts by mass of the pigments. Here, the amount of the pigments denotes the total amount of the pigments included in the colorants.

<<<<Pigment Derivative>>>>

It is preferable that the pigment dispersion includes a pigment derivative.

The pigment derivative denotes a compound having a structure in which a portion of a pigment is substituted with an acidic group, a basic group, or a phthalimidomethyl group. As the pigment derivative, a pigment derivative having an acidic group or a basic group is preferable from the viewpoints of dispersibility and dispersion stability.

Examples of an organic pigment for forming the pigment derivative include a pyrrolopyrrole pigment, a diketo pyrrolopyrrole pigment, an azo pigment, a phthalocyanine pigment, an anthraquinone pigment, a quinacridone pigment, a dioxazine pigment, a perinone pigment, a perylene pigment, a thioindigo pigment, an isoindoline pigment, an isoindolinone pigment, a quinophthalone pigment, a threne pigment, and a metal complex pigment.

In addition, as the acidic group included in the pigment derivative, a sulfonic acid, a carboxylic acid, or a quaternary ammonium salt thereof is preferable, a carboxylate group or a sulfonate group is more preferable, and a sulfonate group is still more preferable. As the basic group included in the pigment derivative, an amino group is preferable, and a tertiary amine group is more preferable.

As the pigment derivative, a pyrrolopyrrole pigment derivative, a quinoline pigment derivative, a benzimidazolone pigment derivative, or an isoindoline pigment derivative, is preferable, and a pyrrolopyrrole pigment derivative is more preferable. By using the pyrrolopyrrole pigment derivative, the coloring composition having a transmittance in the above-described range can be suitably prepared.

Specific examples of the pigment derivative are as follows.

The content of the pigment derivative in the pigment dispersion is preferably 1 to 50 mass % and more preferably 3 to 30 mass % with respect to the total mass of the pigments. Among these pigment derivatives, one kind may be used alone, or two or more kinds may be used in combination.

<<<<Organic Solvent>>>>

It is preferable that the pigment dispersion includes an organic solvent.

The organic solvent is selected in consideration of, for example, the solubility of each component included in the pigment dispersion and the application properties in a case where the pigment dispersion is applied to the coloring composition. As the organic solvent, esters, ethers, ketones, or aromatic hydrocarbons are used. Among these, methyl 3-ethoxypropionate, ethyl 3-ethoxypropionate, ethyl cellosolve acetate, ethyl lactate, diethylene glycol dimethyl ether, butyl acetate, methyl 3-methoxypropionate, 2-heptanone, cyclohexanone, diethylene glycol monoethyl ether acetate, diethylene glycol monobutyl ether acetate, propylene glycol methyl ether, or propylene glycol monomethyl ether acetate is preferable, and an organic solvent which can be included in the coloring composition described below can also be preferably used.

The content of the organic solvent in the pigment dispersion is preferably 50 to 95 mass % and more preferably 70 to 90 mass %.

<<Resin>>

The coloring composition according to the present invention includes a resin.

Examples of the resin include: the resin (also referred to as the dispersion resin) used for dispersing the pigments during the preparation of the above-described pigment dispersion;

and an alkali-soluble resin described below. Hereinafter, the alkali-soluble resin will be described. The alkali-soluble resin can also be used as the dispersion resin.

<<<Alkali-Soluble Resin>>>

The coloring composition according to the present invention can include an alkali-soluble resin as a resin. By the coloring composition including the alkali-soluble resin, developability or pattern formability is improved.

The molecular weight of the alkali-soluble resin is not particularly limited, and the weight average molecular weight (Mw) thereof is preferably 5000 to 100000. In addition, the number average molecular weight (Mn) of the alkali-soluble resin is preferably 1000 to 20000.

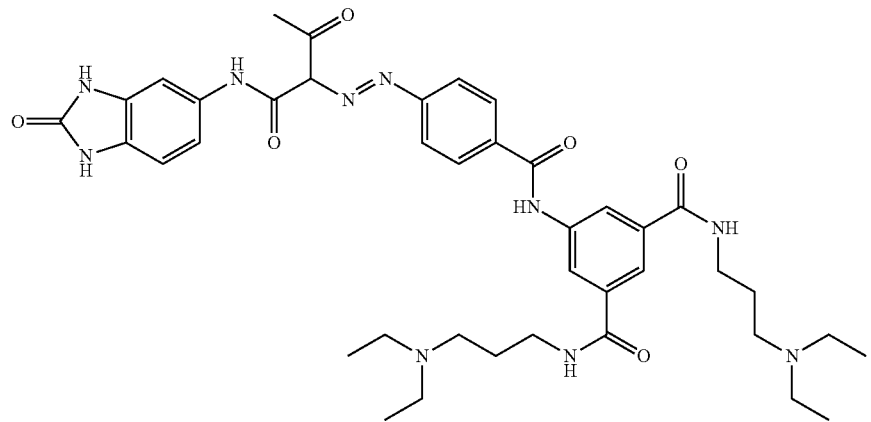 [SMILES: CCN(CC)CCCNC(=O)c1cc(NC(=O)c2ccc(/N=N/C(C(C)=O)C(=O)Nc3ccc4[nH]c(=O)[nH]c4c3)cc2)cc(C(=O)NCCCN(CC)CC)c1]

The alkali-soluble resin may be a linear organic polymer and can be appropriately selected from alkali-soluble resins having at least one group for promoting alkali solubility in a molecule (preferably a molecule having an acrylic copolymer or a styrene copolymer as a main chain).

The alkali-soluble resin will be described.

As the alkali-soluble resin, from the viewpoint of heat resistance, a polyhydroxystyrene resin, a polysiloxane resin, an acrylic resin, an acrylamide resin, or an acryl/acrylamide copolymer resin is preferable, and from the viewpoint of controlling developability, an acrylic resin, an acrylamide resin, or an acryl/acrylamide copolymer resin is preferable.

Examples of the group for promoting alkali solubility (hereinafter, also referred to as an acid group) include a carboxyl group, a phosphate group, a sulfonate group, and a phenolic hydroxyl group. A group that is soluble in an organic solvent and is developable with a weakly alkaline aqueous solution is preferable, and a carboxyl group is more preferable. Among these acid groups, one kind may be used alone, or two or more kinds may be used in combination.

Examples of a monomer which can introduce an acid group after polymerization include a monomer having a hydroxyl group such as 2-hydroxyethyl (meth)acrylate, a monomer having an epoxy group such as glycidyl (meth) acrylate, and a monomer having an isocyanate group such as 2-isocyanatoethyl (meth)acrylate. Among these monomers for introducing an acid group, one kind may be used alone, or two or more kinds may be used in combination. In order to introduce an acid group into the alkali-soluble resin, for example, polymerization may be performed using a monomer having an acid group and/or the monomer which can introduce an acid group into the alkali-soluble resin after polymerization (hereinafter, also referred to as "monomer for introducing an acid group") as monomer components. In a case where an acid group is introduced by using the monomer which can introduce into the alkali-soluble resin after polymerization as a monomer component, for example, a process for introducing an acid group described below is necessary after polymerization.

During the preparation of the alkali-soluble resin, for example, a well-known radical polymerization method can be used. Polymerization conditions under which the alkali-soluble resin is prepared using a radical polymerization method, for example, the temperature, the pressure, the kind and amount of a radical initiator, and the kind of a solvent can be easily set by those skilled in the art and can also be experimentally set.

As the alkali-soluble resin, a polymer having a carboxylic acid at a side chain thereof is preferable, and examples thereof include: an alkali-soluble phenol resin such as a methacrylic acid copolymer, an acrylic acid copolymer, an itaconic acid copolymer, a crotonic acid copolymer, a maleic acid copolymer, a partially esterified maleic acid copolymer, or a novolac type resin; an acidic cellulose derivative having a carboxylic acid at a side chain thereof; and a resin obtained by adding an acid anhydride to a polymer having a hydroxyl group. In particular, a copolymer of (meth)acrylic acid and another monomer which is copolymerizable with the (meth) acrylic acid is preferable as the alkali-soluble resin. Examples of the monomer which is copolymerizable with the (meth)acrylic acid include an alkyl (meth)acrylate, an aryl (meth)acrylate, and a vinyl compound. Examples of the alkyl (meth)acrylate and the aryl (meth)acrylate include methyl (meth)acrylate, ethyl (meth)acrylate, propyl (meth) acrylate, butyl (meth)acrylate, isobutyl (meth)acrylate, pentyl (meth)acrylate, hexyl (meth)acrylate, octyl (meth)acrylate, phenyl (meth)acrylate, benzyl (meth)acrylate, tolyl (meth)acrylate, naphtyl (meth)acrylate, and cyclohexyl (meth)acrylate. Examples of the vinyl compound include styrene, α-methylstyrene, vinyl toluene, glycidyl methacrylate, acrylonitrile, vinyl acetate, N-vinylpyrrolidone, tetrahydrofurfuryl methacrylate, a polystyrene macromonomer, and a polymethyl methacrylate macromonomer. Examples of the N-position-substituted maleimide monomer copolymer described in JP1998-300922A (JP-H10-300922A) include N-phenylmaleimide and N-cyclohexylmaleimide. Among these monomers which are copolymerizable with the (meth)acrylic acid, one kind may be used alone, or two or more kinds may be used in combination.

The alkali-soluble phenol resin can be suitably used in a case where the coloring composition is a positive composition. Examples of the alkali-soluble phenol resin include a novolac resin and a vinyl polymer.

Examples of the novolac resin include a resin which is obtained by condensation of a phenol and an aldehyde in the presence of an acid catalyst. Examples of the phenol include phenol, cresol, ethyl phenol, butyl phenol, xylenol, phenyl phenol, catechol, resorcinol, pyrogallol, naphthol, and bisphenol A. Examples of the aldehyde include formaldehyde, paraformaldehyde, acetaldehyde, propionaldehyde, and benzaldehyde. Among the phenols and the aldehydes, one kind may be used alone, or two or more kinds may be used in combination.

Specific examples of the novolac resin include a condensate of metacresol, paracresol, or a mixture of metacresol and paracresol with formalin.

The molecular weight distribution of the novolac resin may be adjusted by means of fractionation or the like. In addition, the novolac resin may be mixed with a low molecular weight component having a phenolic hydroxyl group such as bisphenol C or bisphenol A.

In addition, in order to improve a crosslinking effect of the coloring composition, an alkali-soluble resin having a polymerizable group may be used. As the alkali-soluble resin having a polymerizable group, an alkali-soluble resin having an allyl group, a (meth)acryl group, or an allyloxy alkyl group at a side chain thereof is suitably used.

Preferable examples of the alkali-soluble resin having a polymerizable group include: a urethane-modified polymerizable double bond-containing acrylic resin obtained by a reaction of a compound having a (meth)acryloyl group, in which one unreacted isocyanate group remains by a previous reaction of isocyanate groups and OH groups, with an acrylic resin having a carboxyl group; an unsaturated group-containing acrylic resin obtained by a reaction of an acrylic resin having a carboxyl group with a compound having both an epoxy group and a polymerizable double bond in a molecule thereof; an acid pendant type epoxy acrylate resin; a polymerizable double bond-containing acrylic resin obtained by a reaction of an acrylic resin having an OH group with a dibasic acid anhydride having a polymerizable double bond; a resin obtained by a reaction of an acrylic resin having an OH group with isocyanate and a compound having a polymerizable group; and a resin described in JP2002-229207A or JP2003-335814A obtained by performing a basic treatment on a resin having a halogen atom or a leaving group such as a sulfonate group at the α-position or at the β-position and having an ester group at a side chain.

Examples of the alkali-soluble resin having a polymerizable group include Dianal NR series (manufactured by Mitsubishi Rayon Co., Ltd.), Photomer 6173 (a COOH-containing polyurethane acrylic oligomer; manufactured by Diamond Shamrock Co., Ltd.), Biscoat R-264 and KS Resist 106 (both of which are manufactured by Osaka Organic Chemical Industry Ltd.), Cyclomer-P series and Plakcel CF200 series (both of which manufactured by Daicel Corporation), and Ebecryl 3800 (manufactured by Daicel-UCB Co., Ltd.).

As the alkali-soluble resin, a copolymer including benzyl (meth)acrylate and (meth)acrylic acid or a multi-component copolymer including benzyl (meth)acrylate, (meth)acrylic acid, and another monomer is preferable. In addition, as the alkali-soluble resin, copolymers described in JP1995-140654A (JP-H07-140654A) obtained by copolymerization of 2-hydroxyethyl methacrylate can be used, and examples thereof include: a copolymer including 2-hydroxypropyl (meth)acrylate, a polystyrene macromonomer, benzyl methacrylate, and methacrylic acid; a copolymer including 2-hydroxy-3-phenoxypropyl acrylate, a polymethyl methacrylate macromonomer, benzyl methacrylate, and methacrylic acid; a copolymer including 2-hydroxyethyl methacrylate, a polystyrene macromonomer, methyl methacrylate, and methacrylic acid; and a copolymer including 2-hydroxyethyl methacrylate, a polystyrene macromonomer, benzyl methacrylate, and methacrylic acid.

As the alkali-soluble resin, a resin (a) obtained by copolymerization in which a compound represented by the following Formula (ED) and/or a compound represented by the following Formula (ED2) (hereinafter, these compounds will also be referred to as "ether dimer") are used as essential monomer components is also preferable.

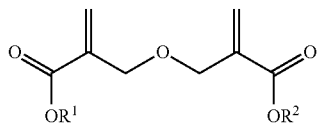

Formula (ED)

In Formula (ED), $R^1$ and $R^2$ each independently represent a hydrogen atom or a hydrocarbon group having 1 to 25 carbon atoms which may have a substituent.

Formula (ED2)

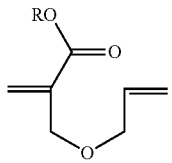

In Formula (ED2), R represents a hydrogen atom or an organic group having 1 to 30 carbon atoms. Specific examples of Formula (ED2) can be found in JP2010-168539A.

In Formula (ED), it is preferable that the hydrocarbon group represented by $R^1$ or $R^2$ is a hydrocarbon group having 1 to 25 carbon atoms.

In addition, the hydrocarbon group may have a substituent.

The hydrocarbon group is not particularly limited, and examples thereof include a linear or branched alkyl group such as methyl, ethyl, n-propyl, isopropyl, n-butyl, isobutyl, t-butyl, t-amyl, stearyl, lauryl, or 2-ethylhexyl; an aryl group such as phenyl; an alicyclic group such as cyclohexyl, t-butylcyclohexyl, dicyclopentadienyl, tricyclodecanyl, isobornyl, adamantyl, or 2-methyl-2-adamantyl; an alkyl group substituted with alkoxy such as 1-methoxyethyl or 1-ethoxyethyl; and an alkyl group substituted with an aryl group such as benzyl. Among these, a primary or secondary carbon substituent which is not likely to leave due to an acid or heat, for example, methyl, ethyl, cyclohexyl, or benzyl is preferable from the viewpoint of heat resistance.

Specific examples of the ether dimer include dimethyl-2,2'-[oxybis(methylene)]bis-2-propenoate, diethyl-2,2'-[oxybis(methylene)]bis-2-propenoate, di(n-propyl)-2,2'-[oxybis(methylene)]bis-2-propenoate, di(isopropyl)-2,2'-[oxybis(methylene)]bis-2-propenoate, di(n-butyl)-2,2'-[oxybis(methylene)]bis-2-propenoate, di(isobutyl)-2,2'-[oxybis(methylene)]bis-2-propenoate, di(t-butyl)-2,2'-[oxybis(methylene)bis-2-propenoate, di(t-amyl)-2,2'-[oxybis(methylene)]bis-2-propenoate, di(stearyl)-2,2'-[oxybis(methylene)]bis-2-propenoate, di(lauryl)-2,2'-[oxybis(methylene)]bis-2-propenoate, di(2-ethylhexyl)-2,2'-[oxybis(methylene)]bis-2-propenoate, di(1-methoxyethyl)-2,2'-[oxybis(methylene)]bis-2-propenoate, di(1-ethoxyethyl)-2,2'-[oxybis(methylene)]bis-2-propenoate, dibenzyl-2,2'-[oxybis(methylene)]bis-2-propenoate, diphenyl-2,2'-[oxybis(methylene)]bis-2-propenoate, dicyclohexyl-2,2'-[oxybis(methylene)]bis-2-propenoate, di(t-butylcyclohexyl)-2,2'-[oxybis(methylene)]bis-2-propenoate, di(dicyclopentadienyl)-2,2'-[oxybis(methylene)]bis-2-propenoate, di(tricyclodecanyl)-2,2'-[oxybis(methylene)]bis-2-propenoate, di(isobornyl)-2,2'[oxybis(methylene)]bis-2-propenoate, diadamantyl-2,2'-[oxybis(methylene)]bis-2-propenoate, and di(2-methyl-2-adamantyl)-2,2'-[oxybis(methylene)]bis-2-propenoate Among these, dimethyl-2,2'-[oxybis(methylene)]bis-2-propenoate, diethyl-2,2'-[oxybis(methylene)]bis-2-propenoate, dicyclohexyl-2,2'-[oxybis(methylene)]bis-2-propenoate, or dibenzyl-2,2'-[oxybis(methylene)]bis-2-propenoate is preferable. Among these ether dimers, one kind may be used alone, or two or more kinds may be used in combination.

A proportion of the ether dimer in the monomers for obtaining the resin (a) is not particularly limited and is preferably 2 to 60 mass %, more preferably 5 to 55 mass %, and still more preferably 5 to 50 mass % with respect to the total mass of all the monomer components.

The resin (a) may be a copolymer obtained by copolymerization of the ether dimer and another monomer.

Examples of the other monomer which is copolymerizable with the ether dimer include a monomer for introducing an acid group, a monomer for introducing a radically polymerizable double bond, a monomer for introducing an epoxy group, and another copolymerizable monomer other than the above-described monomers. Among these monomers, one kind may be used alone, or two or more kinds may be used in combination.

Examples of the monomer for introducing an acid group include a monomer having a carboxyl group such as (meth)acrylic acid or itaconic acid, a monomer having a phenolic hydroxyl group such as N-hydroxyphenyl maleimide, and a monomer having a carboxylic anhydride group such as maleic anhydride or itaconic anhydride. Among these, (meth)acrylic acid is preferable.

In addition, the monomer for introducing an acid group may be a monomer for introducing an acid group after polymerization, and examples thereof include a monomer having a hydroxyl group such as 2-hydroxyethyl (meth)acrylate, a monomer having an epoxy group such as glycidyl (meth)acrylate, and a monomer having an isocyanate group such as 2-isocyanatoethyl (meth)acrylate. The treatment for introducing an acid group after polymerization varies depending on the kind of a monomer, and examples thereof are as follows. In a case where the monomer having a hydroxyl group is used, for example, a treatment of adding an acid anhydride such as succinic anhydride, tetrahydrophthalic anhydride, or maleic anhydride is used. In a case where the monomer having an epoxy group is used, for example, a treatment of adding a compound having an amino group, such as N-methylamino benzoic acid or N-methylamino phenol, and an acid group or a treatment of adding an acid anhydride such as succinic anhydride, tetrahydrophthalic anhydride, or maleic anhydride to a hydroxyl group, which is produced after addition of an acid such as (meth)acrylic acid, is used. In a case where the monomer having an isocyanate group is used, for example, a treatment of adding a compound having a hydroxyl group, such as 2-hydroxybutyric acid, and an acid group is used.

In a case where the monomers for obtaining the resin (a) include the monomer having an acid group, the proportion of the monomer having an acid group is not particularly limited and is preferably 5 to 70 mass % and more preferably 10 to 60 mass % with respect to the total mass of all the monomer components.

Examples of the monomer for introducing a radically polymerizable double bond include: a monomer having a carboxyl group such as (meth)acrylic acid or itaconic acid; a monomer having a carboxylic anhydride group such as maleic anhydride or itaconic anhydride; and a monomer having an epoxy group such as glycidyl (meth)acrylate, 3,4-epoxy-cyclohexyl methyl (meth)acrylate, or o- (alternatively m- or p-) vinylbenzyl glycidyl ether. In a case where the monomer for introducing a radically polymerizable double bond is used, it is necessary to perform a treatment for introducing a radically polymerizable double bond after polymerization. The treatment for introducing a radically polymerizable double bond after polymerization varies depending on the kind of a monomer which can introduce a radically polymerizable double bond, and examples thereof are as follows. In a case where the monomer having a carboxyl group such as (meth)acrylic acid or itaconic acid is used, for example, a treatment of adding a compound having an epoxy group, such as glycidyl (meth)acrylate, 3,4-epoxy-cyclohexyl methyl (meth)acrylate, or o- (alternatively m- or p-) vinylbenzyl glycidyl ether, and a radically polymerizable double bond is used. In a case where the monomer having a carboxylic anhydride group such as maleic anhydride or itaconic anhydride is used, for example, a treatment of adding a compound having a hydroxyl group, such as 2-hydroxyethyl (meth)acrylate, and a radically polymerizable double bond is used. In a case where the monomer having an epoxy group such as glycidyl (meth)acrylate, 3,4-epoxy-cyclohexyl methyl (meth)acrylate, or o- (alternatively m- or p-) vinylbenzyl glycidyl ether is used, for example, a treatment of adding a compound having an acid group, such as (meth)acrylic acid, and a radically polymerizable double bond is used.

In a case where the monomers for obtaining the resin (a) include the monomer for introducing a radically polymerizable double bond, the proportion of the monomer for introducing a radically polymerizable double bond is not particularly limited and is preferably 5 to 70 mass % and more preferably 10 to 60 mass % with respect to the total mass of all the monomer components.

Examples of the monomer having an epoxy group include glycidyl (meth)acrylate, 3,4-epoxy-cyclohexyl methyl (meth)acrylate, and o- (alternatively m- or p-) vinylbenzyl glycidyl ether is used.

In a case where the monomers for obtaining the resin (a) include the monomer having an epoxy group, the proportion of the monomer having an epoxy group is not particularly limited and is preferably 5 to 70 mass % and more preferably 10 to 60 mass % with respect to the total mass of all the monomer components.

Examples of the other copolymerizable monomer include: a (meth)acrylic acid ester such as methyl (meth)acrylate, ethyl (meth)acrylate, n-propyl (meth)acrylate, isopropyl (meth)acrylate, n-butyl (meth)acrylate, isobutyl (meth)acrylate, t-butyl (meth)acrylate, methyl 2-ethylhexyl (meth)acrylate, cyclohexyl (meth)acrylate, benzyl (meth)acrylate, or 2-hydroxyethyl (meth)acrylate; an aromatic vinyl compound such as styrene, vinyl toluene, or α-methylstyrene; a N-substituted maleimide such as N-phenylmaleimide or N-cyclohexylmaleimide; a butadiene or substituted butadiene compound such as butadiene or isoprene; an ethylene or substituted ethylene compound such as ethylene, propylene, vinyl chloride, or acrylonitrile; and a vinyl ester such as vinyl acetate. Among these, methyl (meth)acrylate, cyclohexyl (meth)acrylate, benzyl (meth)acrylate, or styrene is preferable from the viewpoints of obtaining high transparency and preventing deterioration of heat resistance.

In a case where the monomers for obtaining the resin (a) include the other copolymerizable monomer, the proportion of the other copolymerizable monomer is not particularly limited and is preferably 95 mass % or lower and more preferably 85 mass % or lower.

The weight average molecular weight (Mw) of the resin (a) is not particularly limited and, from the viewpoints of the viscosity of the coloring composition and the heat resistance of a coated film, is preferably 5000 to 200000, more preferably 5000 to 100000, and still more preferably 5000 to 20000.

In addition, in a case where the resin (a) has an acid group, the acid value of the resin (a) is preferably 30 to 500 mgKOH/g and more preferably 50 to 400 mgKOH/g.

The resin (a) can be easily obtained by polymerization of monomers including the ether dimer as an essential component. At this time, cyclization of the ether dimer progresses along with polymerization such that a tetrahydropyran ring structure is formed.

A polymerization method used for the synthesis of the resin (a) is not particularly limited and various well-known polymerization methods of the related art can be used. In particular, a solution polymerization method is preferable. Specifically, the resin (a) can be synthesized, for example, using a synthesis method of the resin (a) described in JP2004-300204A.

Hereinafter, exemplary compounds of the resin (a) are shown, but the present invention is not limited thereto. Composition ratios of the following exemplary compounds are represented by mol %.

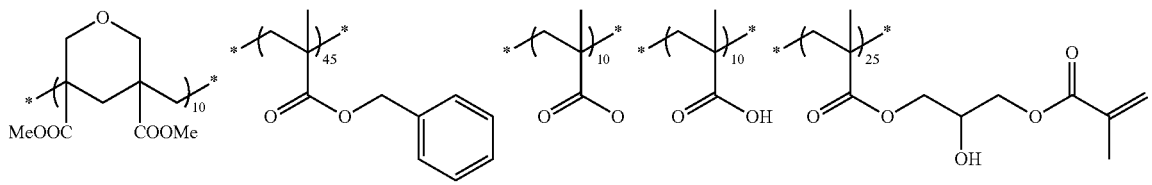

Mw = 12000

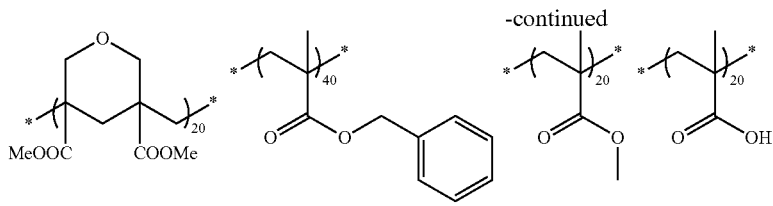

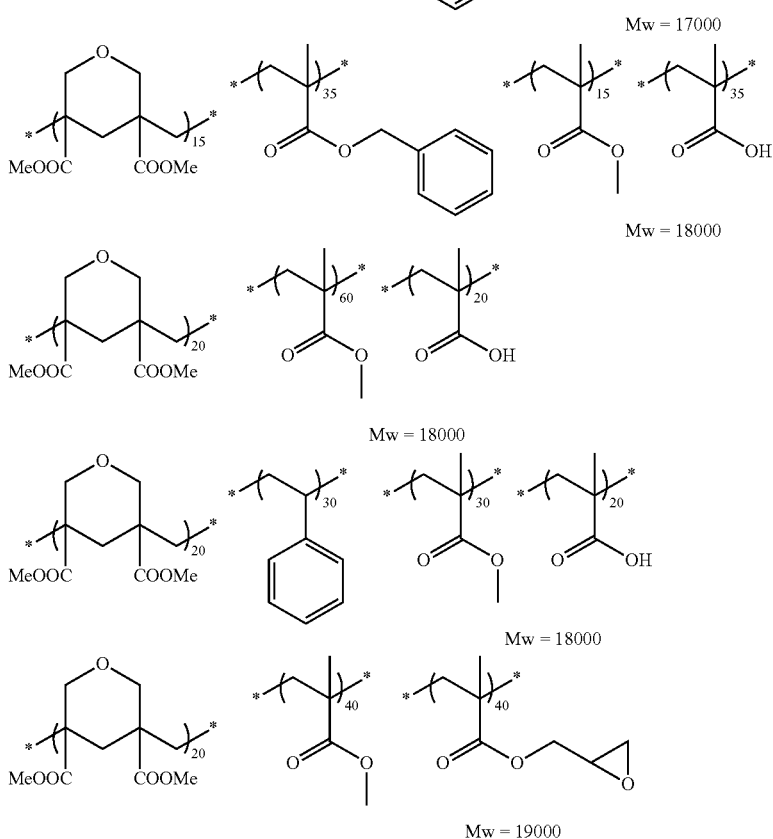

Among these alkali-soluble resins, a copolymer including benzyl (meth)acrylate and (meth)acrylic acid or a multi-component copolymer including benzyl (meth)acrylate, (meth)acrylic acid, and another monomer is preferable. In addition, as the alkali-soluble resin, copolymers described in JP1995-140654A (JP-H07-140654A) obtained by copolymerization of 2-hydroxyethyl methacrylate can be used, and examples thereof include: a copolymer including 2-hydroxypropyl (meth)acrylate, a polystyrene macromonomer, benzyl methacrylate, and methacrylic acid; a copolymer including 2-hydroxy-3-phenoxypropyl acrylate, a polymethyl methacrylate macromonomer, benzyl methacrylate, and methacrylic acid; a copolymer including 2-hydroxyethyl methacrylate, a polystyrene macromonomer, methyl methacrylate, and methacrylic acid; and a copolymer including 2-hydroxyethyl methacrylate, a polystyrene macromonomer, benzyl methacrylate, and methacrylic acid.

As the alkali-soluble resin, a resin including a structural unit which is derived from an ethylenically unsaturated monomer represented by the following Formula (X) can also be used.

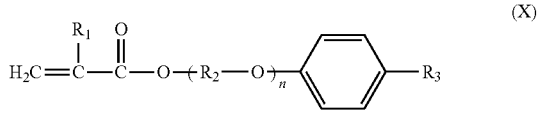

(In Formula (X), $R_1$ represents a hydrogen atom or a methyl group, $R_2$ represents an alkylene group having 2 to 10 carbon atoms, $R_3$ represents a hydrogen atom or an alkyl group having 1 to 20 carbon atoms which may have a benzene ring, and n represents an integer of 1 to 15.)

In Formula (X), the number of carbon atoms in the alkylene group of $R_2$ is preferably 2 to 3. In addition, the number of carbon atoms in the alkyl group of $R_3$ is preferably 1 to 20 and more preferably 1 to 10, and the alkyl group of $R_3$ may have a benzene ring. Examples of the alkyl group having a benzene ring represented by $R_3$ include a benzyl group and a 2-phenyl(iso)propyl group.

Specific examples of the resin including a structural unit which is derived from an ethylenically unsaturated monomer represented by Formula (X) include resins described in JP2012-247591A and JP2013-24934A The acid value of the alkali-soluble resin is preferably 30 to 500 mgKOH/g. The lower limit is 50 mgKOH/g or higher and more preferably 70 mgKOH/g or higher. The upper limit is preferably 400 mgKOH/g or lower, more preferably 200 mgKOH/g or lower, still more preferably 150 mgKOH/g or lower, and most preferably 120 mgKOH/g or lower.

The content of the alkali-soluble resin in the coloring composition is preferably 1 to 15 mass %, more preferably 2 to 12 mass %, and still more preferably 3 to 10 mass % with respect to the total solid content of the coloring composition.

<<Polymerizable Compound>>

It is preferable that the coloring composition according to the present invention includes a polymerizable compound.

As the polymerizable compound, a well-known polymerizable compound which is crosslinkable by a radical, an acid, or heat can be used. For example, a polymerizable compound having an ethylenically unsaturated bond, a cyclic ether (epoxy, oxetane), or methylol can be used. From the viewpoint of sensitivity, the polymerizable compound is suitably selected from compounds having at least one terminal ethylenically unsaturated bond and preferably two or more unsaturated bonds. Among these, a tetrafunctional or higher polyfunctional polymerizable compound is preferable, and a pentafunctional or higher polyfunctional polymerizable compound is more preferable.

This group of compounds is widely used and can be used in the coloring composition without any particular limitation. These compounds may have any chemical form such as a monomer, a prepolymer (that is, a dimer, a trimer, or an oligomer), or a mixture or polymer thereof. Among these polymerizable compounds in the coloring composition, one kind may be used alone, or two or more kinds may be used in combination.

Specific examples of the monomer and the prepolymer include an unsaturated carboxylic acid (for example, acrylic acid, methacrylic acid, itaconic acid, crotonic acid, isocrotonic acid, or maleic acid), an ester or amide of an unsaturated carboxylic acid, and a polymer thereof. Among these, an ester of an unsaturated carboxylic acid and an aliphatic polyhydric alcohol compound, an amide of an unsaturated carboxylic acid and an aliphatic polyamine compound, or a polymer thereof is preferable. In addition, for example, an adduct of an unsaturated carboxylic acid ester or amide having a nucleophilic substituent, such as a hydroxyl group, an amino group, or a mercapto group, with a monofunctional or polyfunctional isocyanate or epoxy, or a dehydrated condensate of an unsaturated carboxylic acid ester or amide having a nucleophilic substituent with a monofunctional or polyfunctional carboxylic acid is also preferably used. In addition, an adduct of an unsaturated carboxylic acid ester or amide having an electrophilic substituent such as an isocyanate group or an epoxy group with a monofunctional or polyfunctional alcohol, amine, or thiol, or a substitution reaction product of an unsaturated carboxylic acid ester or amide having a leaving substituent such as a halogen group or a tosyloxy group with a monofunctional or polyfunctional alcohol, amine, or thiol is also preferable. In addition, as other examples, a group of compounds in which the unsaturated carboxylic acid is substituted with, for example, an unsaturated phosphonic acid, a vinylbenzene derivative such as styrene, vinyl ether, or allyl ether can also be used.

As specific examples of the compounds, compounds described in paragraphs "0095" to "0108" of JP2009-288705A can be preferably used in the present invention.

In addition, as the polymerizable compound, a compound which has a boiling point at 100° C. or higher under normal pressure and has at least one ethylenically unsaturated group capable of addition polymerization is also preferable.

Examples of this compound include: a monofunctional acrylate or methacrylate such as polyethylene glycol mono (meth)acrylate, polypropylene glycol mono(meth)acrylate, or phenoxyethyl (meth)acrylate; a compound obtained by (meth)acrylation of a polyfunctional alcohol such as glycerin or trimethylolethane to which ethylene oxide or propylene oxide has been added, for example, polyethylene glycol di(meth)acrylate, trimethylol ethane tri(meth)acrylate, neopentyl glycol di(meth)acrylate, pentaerythritol tri (meth)acrylate, pentaerythritol tetra(meth)acrylate, dipentaerythritol penta(meth)acrylate, dipentaerythritol hexa (meth)acrylate, hexanediol (meth)acrylate, trimethylol propane tri(acryloyloxypropyl)ether, or tri(acryloyloxyethyl)isocyanurate; a urethane acrylate described in JP1973-41708B (JP-S48-41708B), JP1975-6034B (JP-S50-6034B), or JP1976-37193A (JP-S51-37193A); a polyester acrylate described in JP1973-64183A (JP-S48-64183A), JP1974-43191B (JP-S49-43191B), or JP1977-30490B (JP-S52-30490B); a polyfunctional acrylate or methacrylate such as epoxy acrylate which is a reaction product of an epoxy resin and (meth)acrylic acid; and mixtures of the above-described compounds.

For example, a polyfunctional (meth)acrylate obtained by a reaction of a polyfunctional carboxylic acid with a compound having an ethylenically unsaturated group and a cyclic ether group such as glycidyl (meth)acrylate can also be used.

As a preferable polymerizable compound, a cardo resin (for example, a compound having a fluorene ring and having two or more ethylenically unsaturated group) described in JP2010-160418A, JP2010-129825A, or JP4364216B can also be used.

In addition, as the compound which has a boiling point at 100° C. or higher under normal pressure and has at least one ethylenically unsaturated group capable of addition polymerization, a compound described in paragraphs "0254" to "0257" of JP2008-292970A is preferable.

In addition, radically polymerizable monomers represented by the following Formulae (MO-1) to (MO-5) can be preferably used. In a case where T in the formulae represents an oxyalkylene group, a terminal thereof on a carbon atom side is bonded to R.

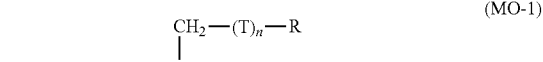

(MO-1)

(MO-2)

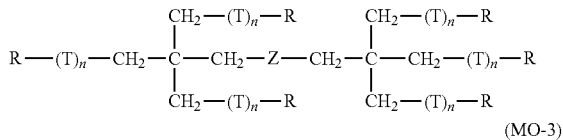

(MO-3)

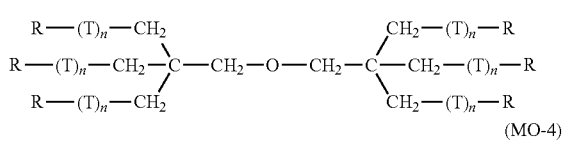

(MO-4)

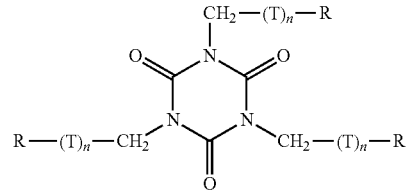

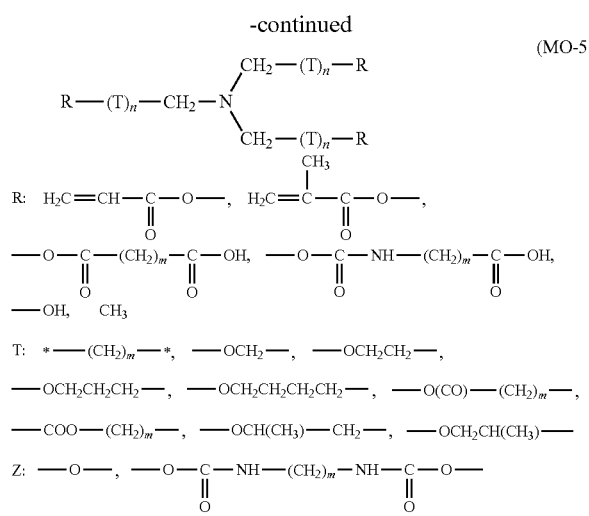

In Formulae (MO-1) to (MO-5), n represents 0 to 14, and m represents 1 to 8. Plural R's and plural T's which are present in one molecule may be the same as or different from each other.

At least one of plural R's which are present in each of polymerizable compounds represented by Formula (MO-1) to (MO-5) represents a group represented by —OC(=O)CH=CH$_2$ or —OC(=O)C(CH$_3$)=CH$_2$.

Specific examples of the polymerizable compounds represented by Formula (MO-1) to (MO-5) which are preferably used in the present invention include compounds described in paragraphs "0248" to "0251" of JP2007-269779A.

In addition, compounds obtained by (meth)acrylation of a polyfunctional alcohol to which ethylene oxide or propylene oxide has been added described in Formulae (1) and 2 of JP1998-62986A (JP-H10-62986A) together with specific examples thereof can also be used as the polymerizable compound.

Among these, as the polymerizable compound, dipentaerythritol triacrylate (KAYARAD D-330 as a commercially available product; manufactured by Nippon Kayaku Co., Ltd.), dipentaerythritol tetraacrylate (KAYARAD D-320 as a commercially available product; manufactured by Nippon Kayaku Co., Ltd.), dipentaerythritol penta(meth)acrylate (KAYARAD D-310 as a commercially available product; manufactured by Nippon Kayaku Co., Ltd.), dipentaerythritol hexa(meth)acrylate (KAYARAD DPHA as a commercially available product; manufactured by Nippon Kayaku Co., Ltd.), ethyleneoxy-modified dipentaerythritol hexaacrylate (A-DPH-12E as a commercially available product; manufactured by Shin-Nakamura Chemical Co., Ltd.), and a structure in which these (meth)acryloyl group is bonded through an ethylene glycol or a propylene glycol residue is preferable.

In addition, preferable examples of the polymerizable compound include 2-(meth)acryloyloxy ethyl caproate acid phosphate (PM-20 as a commercially available product; manufactured by Nippon Kayaku Co., Ltd.), urethane acrylate (U-6LPA as a commercially available product; manufactured by Shin-Nakamura Chemical Co., Ltd.), and pentaerythritol tri- or tetraacrylate (M-303, M-305, M-306, M-450, or M-452 as commercially available products; manufactured by Toagosei Co., Ltd.).

Oligomers of the above-described examples can be used. Hereinafter, a preferable embodiment of the polymerizable compound will be described.

The polymerizable compound may be a polyfunctional monomer having an acid group such as a carboxyl group, a sulfonate group, or a phosphate group. In a case where the polymerizable compound has a unreacted carboxyl group, this polymerizable compound can be used as it is. In addition, optionally, an acid group may be introduced into the polymerizable compound by causing a nonaromatic carboxylic anhydride to react with, for example, a hydroxyl group of the polymerizable compound. Specific examples of the nonaromatic carboxylic anhydride include tetrahydrophthalic anhydride, alkylated tetrahydrophthalic anhydride, hexahydrophthalic anhydride, alkylated hexahydrophthalic anhydride, succinic anhydride, and maleic anhydride.

Examples of the monomer having an acid group include an ester of an aliphatic polyhydroxy compound and an unsaturated carboxylic acid. A polyfunctional monomer having an acid group obtained by causing a nonaromatic carboxylic anhydride to react with an unreacted hydroxyl group of an aliphatic polyhydroxy compound is preferable. In this case, it is more preferable that the aliphatic polyhydroxy compound is pentaerythritol and/or dipentaerythritol. Examples of a commercially available product of the monomer having an acid group include M-510 and M-520 as polybasic acid-modified acrylic oligomer (manufactured by Toagosei Co., Ltd.).

Among these polymerizable compounds, in the coloring composition, one kind may be used alone, but a mixture of two or more kinds may be used because it is difficult to obtain a single compound due to reasons regarding the manufacturing of the polymerizable compounds.

In addition, optionally, a combination of a polyfunctional monomer having no acid group and a polyfunctional monomer having an acid group may be used as the polymerizable compound.

The acid value of the polyfunctional monomer having an acid group is preferably 0.1 to 40 mg-KOH/g and more preferably 5 to 30 mg-KOH/g. In a case where the acid value of the polyfunctional monomer is the lower limit value or higher, development solubility or the like is high. In a case where the acid value of the polyfunctional monomer is the upper limit value or lower, curing properties are high. Therefore, in a case where a combination of two or more kinds of polyfunctional monomers having different acid groups or a combination of a polyfunctional monomer having an acid group and a polyfunctional monomer having no acid group is used, it is preferable that the total acid value of the polyfunctional monomers is adjusted to be in the above-described range.

In addition, in a preferable embodiment, a polyfunctional monomer having a caprolactone structure can also be used as the polymerizable compound.

The polymerizable compound having a caprolactone structure is not particularly limited as long as it has a caprolactone structure in the molecule thereof, and examples thereof include ε-caprolactone-modified polyfunctional (meth)acrylate obtained by esterification of a polyhydric alcohol, (meth)acrylic acid, and ε-caprolactone, the polyhydric alcohol being, for example, trimethylolethane, ditrimethylolethane, trimethylolpropane, ditrimethylolpropane, pentaerythritol, dipentaerythritol, tripentaerythritol, glycerin, diglycerol, or trimethylolmelamine. In particular, a polyfunctional monomer having a caprolactone structure represented by the following Formula (Z-1) is preferable.

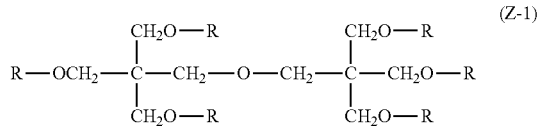

(Z-1)

In Formula (Z-1), all of six R's represent a group represented by the following Formula (Z-2), or one to five R's among the six R's represent a group represented by the following Formula (Z-2) and the remaining R's represent a group represented by the following Formula (Z-3).

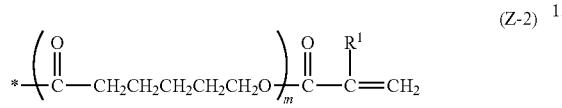

(Z-2)

In Formula (Z-2), $R^1$ represents a hydrogen atom or a methyl group, and m represents 1 or 2.
"*" represents a direct bond.

(Z-3)

In Formula (Z-3), $R^1$ represents a hydrogen atom or a methyl group, and "*" represents a direct bond.

The polyfunctional monomer having a caprolactone structure is commercially available as for example, KAYARAD DPCA series (manufactured by manufactured by Nippon Kayaku Co., Ltd.), and examples thereof include DPCA-20 (a compound in which m=1 in Formulae (Z-1) to (Z-3), the number of groups represented by Formula (Z-2)=2, and all of $R^1$s represent a hydrogen atom), DPCA-30 (a compound in which m=1 in Formulae (Z-1) to (Z-3), the number of groups represented by Formula (Z-2)=3, and all of $R^1$s represent a hydrogen atom), DPCA-60 (a compound in which m=1 in Formulae (Z-1) to (Z-3), the number of groups represented by Formula (Z-2)=6, and all of $R^1$s represent a hydrogen atom), and DPCA-120 (a compound in which m=2 in Formulae (Z-1) to (Z-3), the number of groups represented by Formula (Z-2)=6, and all of $R^1$s represent a hydrogen atom).

Among these polyfunctional monomer having a caprolactone structure, one kind may be used alone, or a mixture of two or more kinds may be used.

As the polymerizable compound, a polymerizable compound which has an alkyleneoxy group having two or more carbon atoms (for example, an ethyleneoxy group, a propyleneoxy group, or a butyleneoxy group) is preferable.

It is more preferable that the polymerizable compound which has an alkyleneoxy group having two or more carbon atoms is at least one compound selected from the group consisting of compounds represented by the following Formulae (Z-4) and (Z-5).

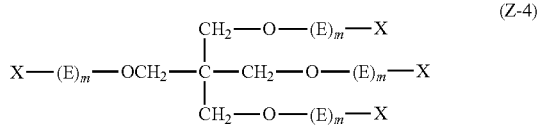

(Z-4)

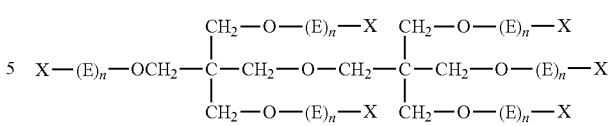

(Z-5)

In Formulae (Z-4) and (Z-5), E's each independently represent $-((CH_2)_yCH_2O)-$ or $-((CH_2)_yCH(CH_3)O)-$, y's each independently represent an integer of 0 to 10, and X's each independently represent an acryloyl group, a methacryloyl group, a hydrogen atom, or a carboxyl group.

In Formula (Z-4), the total number of acryloyl groups and methacryloyl groups is 3 or 4, m's each independently represent an integer of 0 to 10, and the sum of m's is an integer of 0 to 40. In a case where the sum of m's is 0, one of X's represents a carboxyl group.

In Formula (Z-5), the total number of acryloyl groups and methacryloyl groups is 5 or 6, n's each independently represent an integer of 0 to 10, and the sum of n's is an integer of 0 to 60. In a case where the sum of n's is 0, one of X's represents a carboxyl group.

In Formula (Z-4), m represents preferably an integer of 0 to 6 and more preferably an integer of 0 to 4. In addition, the sum of m's is preferably an integer of 2 to 40, more preferably an integer of 2 to 16, and still more preferably an integer of 4 to 8.

In Formula (Z-5), n represents preferably an integer of 0 to 6 and more preferably an integer of 0 to 4.

In addition, the sum of n's is preferably an integer of 3 to 60, more preferably an integer of 3 to 24, and still more preferably an integer of 6 to 12.

In addition, it is preferable that, in $-((CH_2)_yCH_2O)-$ or $-((CH_2)_yCH(CH_3)O)-$ of Formula (Z-4) or (Z-5), a terminal thereof on an oxygen atom side is bonded to X.

Among these compounds represented by Formula (Z-4) and (Z-5), one kinds may be used alone, or two or more kinds may be used in combination. In particular, it is preferable that all of six X's in Formula (Z-5) represent an acryloyl group.

In addition, the total content of the compound represented by Formula (Z-4) or (Z-5) in the polymerizable compound is preferably 20 mass % or higher and more preferably 50 mass % or higher.

The compound represented by Formula (Z-4) or (Z-5) can be synthesized through the following steps including: a step of bonding a ring-opened skeleton using a ring-opening addition reaction between pentaerythritol or dipentaerythritol and ethylene oxide or propylene oxide; and a step of causing, for example, (meth)acryloyl chloride to react with a terminal hydroxyl group of the ring-opened skeleton to introduce a (meth)acryloyl group to the terminal hydroxyl group. The respective steps are well-known in the art, and those skilled in the art can easily synthesize the compound represented by Formula (Z-4) or (Z-5).

Among the compounds represented by Formula (Z-4) and (Z-5), a pentaerythritol derivative and/or a dipentaerythritol derivative is more preferable.

Specific examples of the pentaerythritol derivative and/or the dipentaerythritol derivative include compounds represented by the following Formulae (a) to (f) (hereinafter, also referred to as "Exemplary Compounds (a) to (f)". Among these, Exemplary Compound (a), (b), (e), or (f) is preferable.

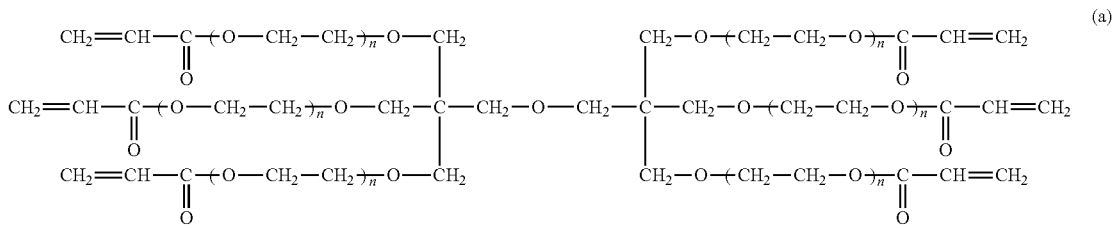

(a) (The sum of n's is 6)

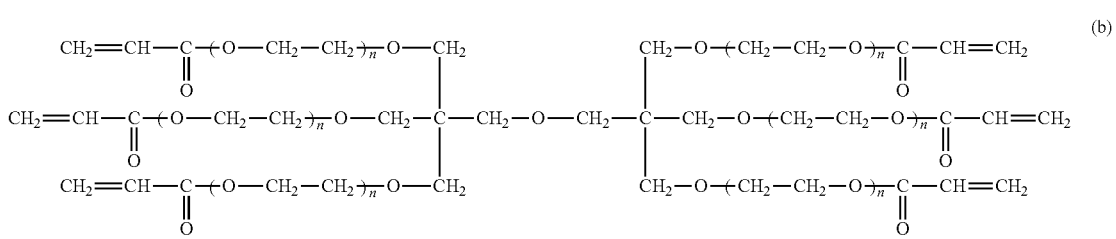

(b) (The sum of n's is 12)

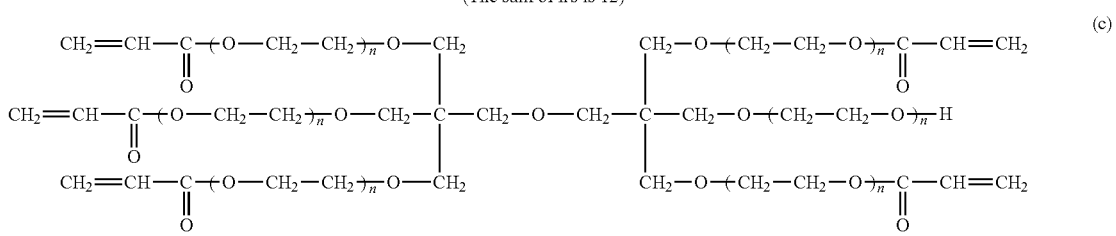

(c) (The sum of n's is 12)

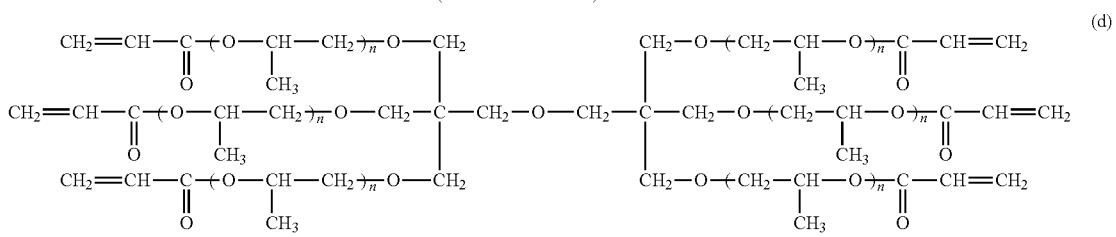

(d) (The sum of n's is 6)

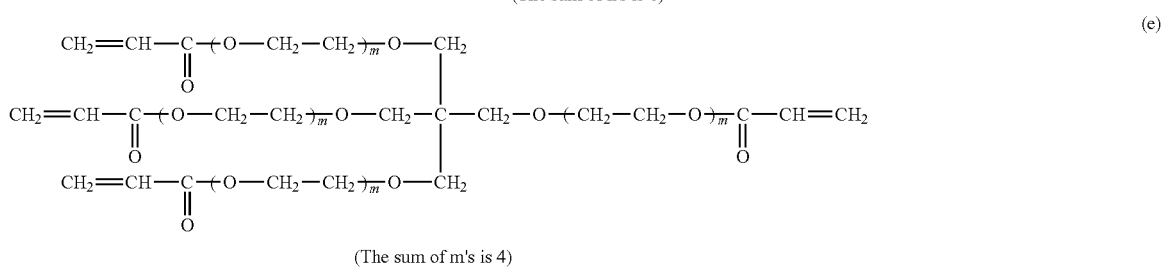

(e) (The sum of m's is 4)

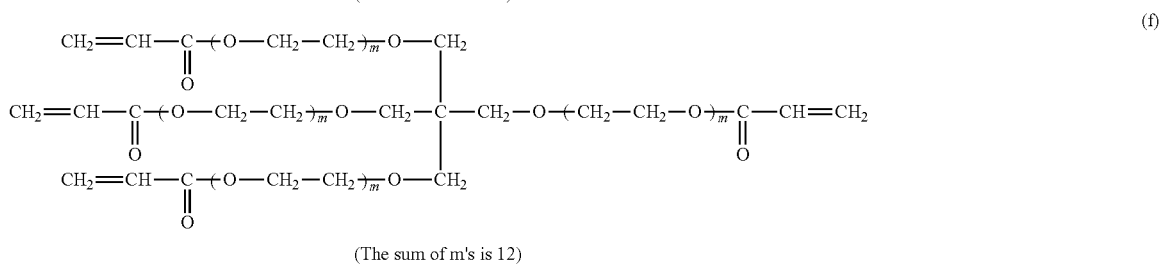

(f) (The sum of m's is 12)

Examples of a commercially available product of the polymerizable compound represented by Formula (Z-4) or (Z-5) include SR-494 (manufactured Sartomer) which is a tetrafunctional acrylate having four ethyleneoxy chains, DPCA-60 (manufactured by Nippon Kayaku Co., Ltd.) which is a hexafunctional acrylate having six pentyleneoxy chains, and TPA-330 (manufactured by Nippon Kayaku Co., Ltd.) which is a trifunctional acrylate having three isobutyleneoxy chains.

Further, as the polymerizable compound, a compound which is described in "Journal of the Adhesion Society of Japan Vol. 20, No. 7 (pp. 300 to 308)" as a photocurable monomer and an oligomer.

The content of the polymerizable compound in the coloring composition is preferably 2 to 50 mass %, more preferably 2 to 30 mass %, and still more preferably 2 to 25 mass % with respect to the total solid content of the coloring composition.

<<Polyfunctional Thiol Compound>>

In order to promote a reaction of the polymerizable compound, the coloring composition according to the present invention may include a polyfunctional thiol compound having two or more mercapto groups in a molecule. The polyfunctional thiol compound is preferably a secondary alkanethiol and more preferably a compound having a structure represented by the following Formula (I).

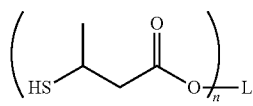

Formula (I)

(In Formula (I), n represents an integer of 2 to 4, and L represents a divalent to tetravalent linking group.

In Formula (I), it is preferable that a linking group L is an aliphatic group having 2 to 12 carbon atoms, and it is more preferable that n represents 2 and L represents an alkylene group having 2 to 12 carbon atoms. Specific examples of the polyfunctional thiol compound include compounds represented by the following Structural Formulae (II) to (IV). Among these, a compound represented by Structural Formula (II) is preferable. Among these polyfunctional thiols, one kind may be used alone, or two or more kinds may be used in combination.

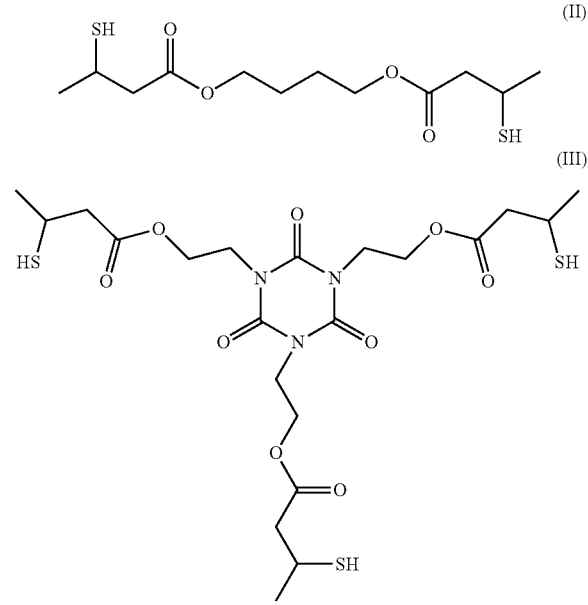

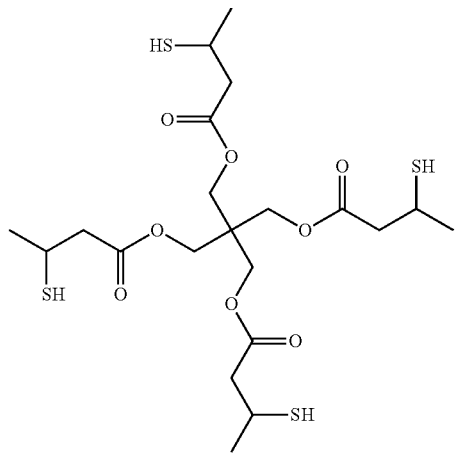

The amount of the polyfunctional thiol compound added to the coloring composition is preferably 0.3 to 8.9 mass % and more preferably 0.8 to 6.4 mass % with respect to the total solid content of the coloring composition excluding a solvent.

Among the polyfunctional thiol compounds, one kind may be used alone, or two or more kinds may be used in combination. In a case where two or more polyfunctional thiol compounds are used, it is preferable that the total content of the two or more polyfunctional thiol compounds is in the above-described range.

In addition, the polyfunctional thiol compound may be added in order to improve stability, odor, resolution, developability, adhesiveness, and the like.

<<Photopolymerization Initiator>>

It is preferable that the coloring composition according to the present invention includes a photopolymerization initiator.

As the photopolymerization initiator, examples described below which are known as photopolymerization initiators can be used.

The photopolymerization initiator is not particularly limited as long as it has an ability to initiate the polymerization of the polymerizable compound, and can be selected from well-known photopolymerization initiators. For example, a photopolymerization initiator having photosensitivity to light rays in a range from the ultraviolet region to the visible region is preferable. In addition, the photopolymerization initiator may be an activator which causes an action with a photo-excited sensitizer to generate active radicals, or may be an initiator which initiates cation polymerization depending on the kinds of monomers.

In addition, it is preferable that the photopolymerization initiator at least one compound having a molecular absorption coefficient of at least 50 in a range of about 300 nm to 800 nm (preferably 330 nm to 500 nm).

Examples of the photopolymerization initiator include: a halogenated hydrocarbon derivative (having, for example, a triazine skeleton or an oxadiazole skeleton); an acylphosphine compound such as acylphosphine oxide; an oxime compound such as hexaarylbiimidazole or an oxime derivative; an organic peroxide, a thio compound, a ketone compound (for example, benzophenone, 2-methylbenzophenone, 4,4'-bis(diethylamino)benzophenone, 2-methyl-1-[4-(methylthio)phenyl]-2-morpholino-1-propane, benzoin, benzoin methyl ether, acridone, or N-methylacridone), an aromatic onium salt, keto oxime ether, an aminoacetophenone compound, and hydroxyacetophenone. Among these, an oxime compound is preferable.

Examples of the halogenated hydrocarbon compound having a triazine skeleton include a compound described in Bull. Chem. Soc. Japan, 42, 2924 (1969) by Wakabayshi et al., a compound described in Great Britain Patent No. 1388492, a compound described in JP1978-133428A (JP-S53-133428A), a compound described in Great German Patent No. 3337024, a compound described in J. Org. Chem.; 29, 1527 (1964) by F. C. Schaefer et al., a compound described in JP1987-58241A (JP-S62-58241A), a compound described in JP1993-281728A (JP-H05-281728A), a compound described in JP1993-34920A (JP-S05-34920A), and a compound described in U.S. Pat. No. 4,212,976A (for example, a compound having an oxadiazole skeleton).

In addition, examples of the photopolymerization initiator other than the above-described examples include an acridine derivative (for example, 9-phenylacridine or 1,7-bis(9,9'-acridinyl)heptane), N-phenylglycine, a polyhalogen compound (for example, carbon tetrabromide, phenyl tribromomethyl sulfone, or phenyl trichloromethyl ketone), a coumarin (for example, 3-(2-benzofuranoyl)-7-diethylaminocoumarin, 3-(2-benzofuroyl)-7-(1-pyrrolidinyl)coumarin, 3-benzoyl-7-diethylaminocoumarin, 3-(2-methoxybenzoyl)-7-diethylaminocoumarin, 3-(4-dimethylaminobenzoyl)-7-diethylaminocoumarin, 3,3'-carbonylbis(5,7-di-n-propoxycoumarin), 3,3'-carbonylbis(7-diethylaminocoumarin), 3-benzoyl-7-methoxycoumarin, 3-(2-furoyl)-7-diethylaminocoumarin, 3-(4-diethylaminocinnamoyl)-7-diethylaminocoumarin, 7-methoxy-3-(3-pyridylcarbonyl)coumarin, 3-benzoyl-5,7-dipropoxycoumarin, 7-benzotriazol-2-ylcoumarin, or a coumarin compound described in JP1993-19475A (JP-H05-19475A), JP1995-271028A (JP-H07-271028A), JP2002-363206A, JP2002-363207A, JP2002-363208A, or JP2002-363209A), an acylphosphine oxide (for example, bis(2,4,6-trimethylbenzoyl)-phenylphosphine oxide, bis(2,6-dimethoxybenzoyl)-2,4,4-trimethyl-pentylphenylphosphine oxide, or Lucirin TPO), a metallocene (for example, bis(η5-2,4-cyclopentadien-1-yl)-bis(2,6-difluoro-3-(1H-pyrrol-1-yl)-phenyl)titanium or η5-cyclopentadienyl-η6-cumenyl-iron(1+)-hexafluorophosphate (1−)), a compound described in JP1978-133428A (JP-S53-133428A), JP1982-1819B (JP-S57-1819B), JP1982-6096B (JP-S57-6096B), or U.S. Pat. No. 3,615,455A.

As the photopolymerization initiator, a hydroxyacetophenone compound, an aminoacetophenone compound, or an acylphosphine compound can also be preferably used. More specifically, for example, an aminoacetophenone initiator described in JP1998-291969A (JP-H10-291969A) or an acylphosphine oxide initiator described in JP4225898B can also be used.

As the hydroxyacetophenone initiator, for example, IRGACURE-184, DAROCUR-1173, IRGACURE-500, IRGACURE-2959, or IRAGACURE-127 (trade name, all of which are manufactured by BASF SE) can be used. As the aminoacetophenone initiator, IRGACURE-907, IRGACURE-369, or IRGACURE-379 (trade name, all of which are manufactured by BASF SE) which is a commercially available product can be used. As the aminoacetophenone initiator, a compound described in JP2009-191179A whose absorption wavelength is adjusted to match with that of a light source having a long wavelength of, for example, 365 nm or 405 nm can also be used. As the acylphosphine initiator, IRGACURE-819, or DAROCUR-TPO (trade name, all of which are manufactured by BASF SE) which is a commercially available product can be used.

As the photopolymerization initiator, for example, an oxime compound is more preferable.

By the coloring composition including an oxime compound as a photopolymerization initiator, the dependence (also referred to as "PCD dependence") of a pattern on a period of time from coating to exposure of the coloring composition (post coating delay: PCD) is improved.

Specific examples of the oxime compound include a compound described in JP2001-233842A, a compound described in JP2000-80068A, and a compound described in JP2006-342166A.

Examples of the oxime compound which can be preferably used as a photopolymerization initiator include 3-benzoyloxyiminobutane-2-one, 3-acetoxyiminobutane-2-one, 3-propionyloxyiminobutane-2-one, 2-acetoxyiminopentane-3-one, 2-acetoxyimino-1-phenylpropane-1-one, 2-benzoyloxyimino-1-phenylpropane-1-one, 3-(4-toluene sulfonyloxy)iminobutane-2-one, and 2-ethoxycarbonyloxyimino-1-phenylpropane-1-one.

Examples of the oxime compound include a compound described in J.C.S. Perkin II (1979), pp. 1653-1660; J.C.S. Perkin II (1979), pp. 156-162 and Journal of Photopolymer Science and Technology (1995), pp. 202-232; a compound described in JP2000-66385A, and a compound described in JP2000-80068A, JP2004-534797A, or JP2006-342166A.

Examples of a commercially available product which can be preferably used include: IRGACURE OXE-01 (manufactured by BASF SE) and IRGACURE OXE-02 (manufactured by BASF SE); TRONLY TR-PBG-304, TRONLY TR-PBG-309, and TRONLY TR-PBG-305, (all of which are manufactured by Changzhou Tronly New Electronic Materials Co., Ltd.); and ADEKA ARKLS NCI-831 and ADEKA ARKLS NCI-930 (all of which are manufactured by ADEKA Corporation).

In addition, in addition to the above-described oxime compounds, for example, a compound described in JP2009-519904A in which oxime is linked to a N-position of carbazole, a compound described in U.S. Pat. No. 7,626,957B in which a hetero substituent is introduced into the benzophenone site, a compound described in JP2010-15025A or US2009/292039A in which a nitro group is introduced into a dye structure, a ketoxime compound described in WO2009/131189A, a compound described in U.S. Pat. No. 7,556,910B having a triazine skeleton and an oxime skeleton in the same molecule, a compound described in JP2009-221114A having an absorption maximum at 405 nm and having excellent sensitivity to a light source of g-rays may be used.

Preferably, a cyclic oxime compound described in JP2007-231000A or JP2007-322744A can also be preferably used. Among the cyclic oxime compounds, in particular, a cyclic oxime compound described in JP2010-32985A or JP2010-185072A which is ring-fused to a carbazole colorant is preferable from the viewpoints of high light absorptivity and high sensitivity.

In addition, a compound described in JP2009-242469A having an unsaturated bond at a specific site of an oxime compound can be preferably used because active radicals can be regenerated from polymerization inactive radicals such that sensitivity is improved.

For example, an oxime compound having a specific substituent described in JP2007-269779A or an oxime compound having a thioaryl group described in JP2009-191061A is most preferable.

Specifically, as the oxime compound, a compound represented by the following Formula (OX-1) is preferable. In the oxime compound, an N—O bond of oxime may form an (E) isomer, a (Z) isomer, or a mixture of an (E) isomer and a (Z) isomer.

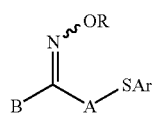
(OX-1)

In Formula (OX-1), R and B each independently represent a monovalent substituent, A represents a divalent organic group, and Ar represents an aryl group.

In Formula (OX-1), it is preferable that the monovalent substituent represented by R is a monovalent non-metal atomic group.

Examples of the monovalent non-metal atomic group include an alkyl group, an aryl group, an acyl group, an alkoxycarbonyl group, an aryloxycarbonyl group, a heterocyclic group, an alkylthiocarbonyl group, and an arylthiocarbonyl group. In addition, these groups may have one or more substituents. In addition, the above-described substituent may have another substituent.

Examples of the substituent include a halogen atom, an aryloxy group, an alkoxycarbonyl group or aryloxycarbonyl group, an acyloxy group, an acyl group, an alkyl group, and an aryl group.

As the alkyl group which may have a substituent, an alkyl group having 1 to 30 carbon atoms is preferable, and specific examples thereof include a methyl group, an ethyl group, a propyl group, a butyl group, a hexyl group, an octyl group, a decyl group, a dodecyl group, an octadecyl group, an isopropyl group, an isobutyl group, a sec-butyl group, a t-butyl group, a 1-ethylpentyl group, a cyclopentyl group, a cyclohexyl group, a trifluoromethyl group, a 2-ethylhexyl group, a phenacyl group, a 1-naphthoylmethyl group, a 2-naphthoylmethyl group, a 4-methylsulfanyl phenacyl group, a 4-phenylsulfanyl phenacyl group, a 4-dimethylamino phenacyl group, a 4-cyano phenacyl group, a 4-methyl phenacyl group, a 2-methyl phenacyl group, a 3-fluoro phenacyl group, a 3-trifluoromethyl phenacyl group, and a 3-nitro phenacyl group.

As the aryl group which may have a substituent, an aryl group having 6 to 30 carbon atoms is preferable, and specific examples thereof include a phenyl group, a biphenyl group, a 1-naphthyl group, a 2-naphthyl group, a 9-anthryl group, a 9-phenanthryl group, a 1-pyrenyl group, a 5-naphthacenyl group, a 1-indenyl group, a 2-azulenyl group, a 9-fluorenyl group, a terphenyl group, a quarter phenyl group, an o-tolyl group, a m-tolyl group, a p-tolyl group, a xylyl group, an o-cumenyl group, a m-cumenyl group, a p-cumenyl group, a mesityl group, a pentalenyl group, a binaphthalenyl group, a ternaphthalenyl group, a quarter naphthalenyl group, a heptalenyl group, a biphenylenyl group, an indacenyl group, a fluoranthenyl group, an acenaphthylenyl group, an aceanthrylenyl group, a phenalenyl group, a fluorenyl group, an anthryl group, a bianthracenyl group, a teranthracenyl group, a quarter anthracenyl group, an anthraquinolyl group, a phenanthryl group, a triphenylenyl group, a pyrenyl group, a chrysenyl group, a naphthacenyl group, a pleiadenyl group, a picenyl group, a perylenyl group, a pentaphenyl group, a pentacenyl group, a tetraphenylenyl group, a hexaphenyl group, a hexacenyl group, a rubicenyl group, a coronenyl group, a trinaphthylenyl group, a heptaphenyl group, a heptacenyl group, a pyranthrenyl group, and an ovalenyl group.

As the acyl group which may have a substituent, an acyl group having 2 to 20 carbon atoms is preferable, and specific examples thereof include an acetyl group, a propanoyl group, a butanoyl group, a trifluoroacetyl group, a pentanoyl group, a benzoyl group, a 1-naphthoyl group, a 2-naphthoyl group, a 4-methylsulfanylbenzoyl group, a 4-phenylsulfanylbenzoyl group, a 4-dimethylaminobenzoyl group, a 4-diethylaminobenzoyl group, a 2-chlorobenzoyl group, a 2-methylbenzoyl group, a 2-methoxybenzoyl group, a 2-butoxybenzoyl group, a 3-chlorobenzoyl group, a 3-trifluoromethylbenzoyl group, a 3-cyanobenzoyl group, a 3-nitrobenzoyl group, a 4-fluorobenzoyl group, a 4-cyanobenzoyl group, and a 4-methoxybenzoyl group.

As the alkoxycarbonyl group which may have a substituent, an alkoxycarbonyl group having 2 to 20 carbon atoms is preferable, and specific examples thereof include a methoxycarbonyl group, an ethoxycarbonyl group, a propoxycarbonyl group, a butoxycarbonyl group, a hexyloxycarbonyl group, an octyloxycarbonyl group, a decyloxycarbonyl group, an octadecyloxycarbonyl group, and a trifluoromethyloxycarbonyl group.

Specific examples of the aryloxycarbonyl group which may have a substituent include a phenoxycarbonyl group, a 1-naphthyloxycarbonyl group, a 2-naphthyloxycarbonyl group, a 4-methylsulfanylphenyloxycarbonyl group, a 4-phenylsulfanylphenyloxycarbonyl group, a 4-dimethylaminophenyloxycarbonyl group, a 4-diethylaminophenyloxycarbonyl group, a 2-chlorophenyloxycarbonyl group, a 2-methylphenyloxycarbonyl group, a 2-methoxyphenyloxycarbonyl group, a 2-butoxyphenyloxycarbonyl group, a 3-chlorophenyloxycarbonyl group, a 3-trifluoromethylphenyloxycarbonyl group, a 3-cyanophenyloxycarbonyl group, a 3-nitrophenyloxycarbonyl group, a 4-fluorophenyloxycarbonyl group, a 4-cyanophenyloxycarbonyl group, and a 4-methoxyphenyloxycarbonyl group.

As the heterocyclic group which may have a substituent, an aromatic or aliphatic heterocycle having a nitrogen atom, an oxygen atom, a sulfur atom, or a phosphorus atom is preferable.

Specific examples of the aromatic or aliphatic heterocycle include a thienyl group, a benzo[b]thienyl group, a naphtho[2,3-b]thienyl group, a thianthrenyl group, a furyl group, a pyranyl group, an isobenzofuranyl group, a chromenyl group, a xanthenyl group, a phenoxathiinyl group, a 2H-pyrrolyl group, a pyrrolyl group, an imidazolyl group, a pyrazolyl group, a pyridyl group, a pyrazinyl group, a pyrimidinyl group, a pyridazinyl group, an indolizinyl group, an isoindolyl group, a 3H-indolyl group, an indolyl group, a 1H-indazolyl group, a purinyl group, a 4H-quinolizinyl group, an isoquinolyl group, a quinolyl group, a phthalazinyl group, a naphthyridinyl group, a quinoxalinyl group, a quinazolinyl group, a cinnolinyl group, a pteridinyl group, a 4aH-carbazolyl group, a carbazolyl group, a 3-carbolinyl group, a phenanthridinyl group, an acrindinyl group, a perimidinyl group, a phenanthrolinyl group, a phenazinyl group, a phenarsazinyl group, an isothiazolyl group, a phenothiazinyl group, an isoxazolyl group, a furazanyl group, a phenoxazinyl group, an isochromanyl group, a chromanyl group, a pyrrolidinyl group, a pyrrolinyl group, an imidazolidinyl group, an imidazolinyl group, a pyrazolidinyl group, a pyrazolinyl group, a piperidyl group, a piperazinyl group, an indolinyl group, an isoindolinyl group, a quinuclidinyl group, a morpholinyl group, and a thioxanthonyl group.

Specific examples of the alkylthiocarbonyl group which may have a substituent include a methylthiocarbonyl group, a propylthiocarbonyl group, a butylthiocarbonyl group, a hexylthiocarbonyl group, an octylthiocarbonyl group, a decylthiocarbonyl group, an octadecylthiocarbonyl group, and a trifluoromethylthiocarbonyl group.

Specific examples of the arylthiocarbonyl group which may have a substituent include a 1-naphthylthiocarbonyl group, a 2-naphthylthiocarbonyl group, a 4-methylsulfanyl-phenylthiocarbonyl group, a 4-phenylsulfanylphenylthiocarbonyl group, a 4-dimethylaminophenylthiocarbonyl group, a 4-diethylaminophenylthiocarbonyl group, a 2-chlorophenylthiocarbonyl group, a 2-methylphenylthiocarbonyl group, a 2-methoxyphenylthiocarbonyl group, a 2-butoxyphenylthiocarbonyl group, a 3-chlorophenylthiocarbonyl group, a 3-trifluoromethylphenylthiocarbonyl group, a 3-cyanophenylthiocarbonyl group, a 3-nitrophenylthiocarbonyl group, a 4-fluorophenylthiocarbonyl group, a 4-cyanophenylthiocarbonyl group, and a 4-methoxyphenylthiocarbonyl group.

In Formula (OX-1), the monovalent substituent represented by B is an aryl group, a heterocyclic group, an arylcarbonyl group, or a heterocyclic carbonyl group. In addition, these groups may have one or more substituents. Examples of the substituent are as described above. In addition, the above-described substituent may have another substituent.

In the present invention, an oxime compound having a fluorine atom can also be used as the photopolymerization initiator. Specific examples of the oxime compound having a fluorine atom include a compound described in JP2010-262028A, Compound 24 and 36 to 40 described in JP2014-500852A, and Compound (C-3) described in JP2013-164471A. The content is incorporated herein by reference.

In the present invention, a compound represented by the following Formula (1) or (2) can also be used as the photopolymerization initiator.

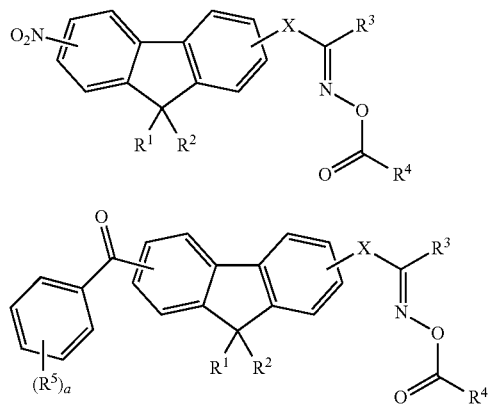

In Formula (1), $R^1$ and $R^2$ each independently represent an alkyl group having 1 to 20 carbon atoms, an alicyclic hydrocarbon group having 4 to 20 carbon atoms, an aryl group having 6 to 30 carbon atoms, or an arylalkyl group having 7 to 30 carbon atoms; in a case where $R^1$ and $R^2$ represent a phenyl group, the phenyl groups may be bonded to each other to form a fluorene group; $R^3$ and $R^4$ each independently represent a hydrogen atom, an alkyl group having 1 to 20 carbon atoms, an aryl group having 6 to 30 carbon atoms, an arylalkyl group having 7 to 30 carbon atoms, or a heterocyclic group having 4 to 20 carbon atoms; and X represents a direct bond or a carbonyl group.

In Formula (2), $R^1$, $R^2$, $R^3$, and $R^4$ have the same definitions as those of $R^1$, $R^2$, $R^3$, and $R^4$ in Formula (1); $R^5$ represents $—R^6$, $—OR^6$, $—SR^6$, $—COR^6$, $—CONR^6R^6$, $—NR^6COR^6$, $—OCOR^6$, $—COOR^6$, $—SCOR^6$, $—OCSR^6$, $—COSR^6$, $—CSOR^6$, $—CN$, a halogen atom, or a hydroxyl group; $R^6$ represents an alkyl group having 1 to 20 carbon atoms, an aryl group having 6 to 30 carbon atoms, an arylalkyl group having 7 to 30 carbon atoms, or a heterocyclic group having 4 to 20 carbon atoms; and X represents a direct bond or a carbonyl group; and a represents an integer of 0 to 4.

In Formulae (1) and (2), it is preferable that $R^1$ and $R^2$ each independently represent a methyl group, an ethyl group, an n-propyl group, i-propyl group, a cyclohexyl group, or a phenyl group. It is preferable that $R^3$ represents a methyl group, an ethyl group, a phenyl group, a tolyl group, or a xylyl group. It is preferable that $R^4$ represents an alkyl group having 1 to 6 carbon atoms or a phenyl group. It is preferable that $R^5$ represents a methyl group, an ethyl group, a phenyl group, a tolyl group, or a naphthyl group. It is preferable that X represents a direct bond.

Specific examples of the compounds represented by Formulae (1) and (2) include compounds described in paragraphs "0076" to "0079" of JP2014-137466A. The content is incorporated herein by reference.

Hereinafter, specific examples of the oxime compound which are preferably used are shown below, but the present invention is not limited thereto.

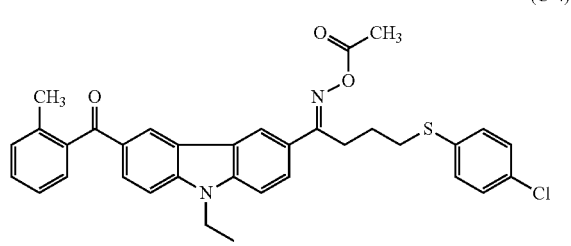

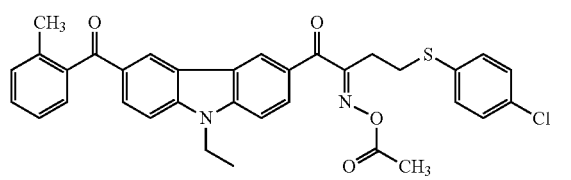

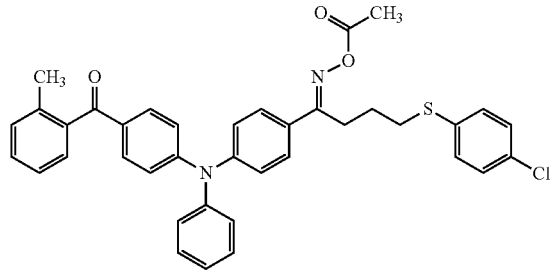

(C-7)
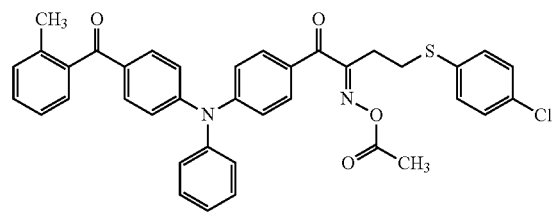

(C-8)
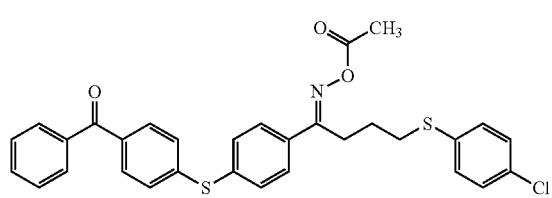

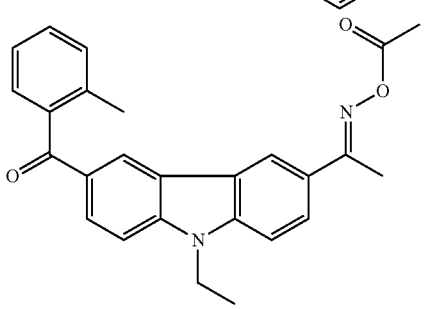

(C-9)
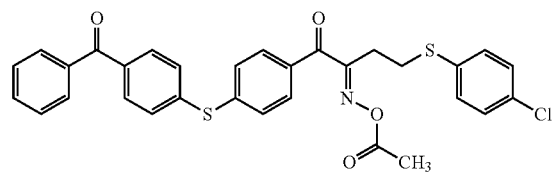

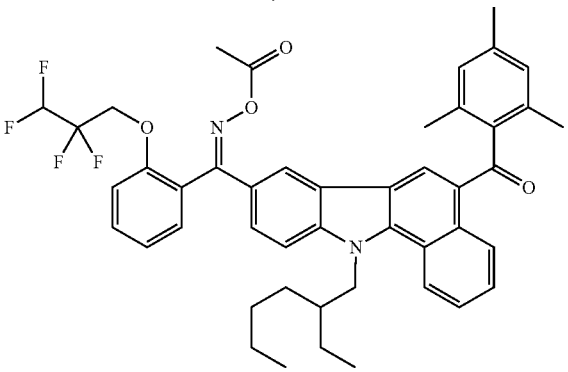

(C-10)
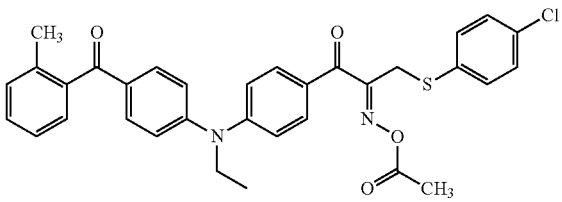

(C-11)
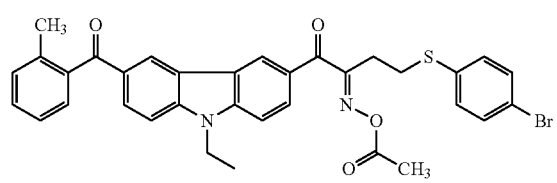

(C-12)
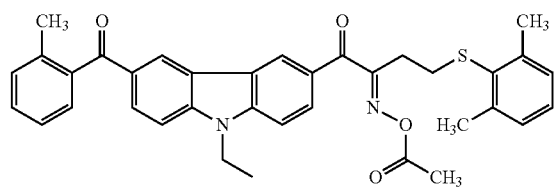

(C-13)
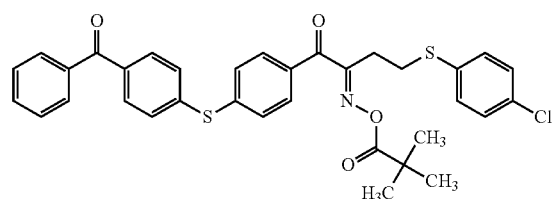

The oxime compound has an absorption maximum in a wavelength range of 350 nm to 500 nm, preferably has an absorption wavelength in a wavelength range of 360 nm to 480 nm, and more preferably has a high absorbance at 365 nm and 455 nm.

The molecular absorption coefficient of the oxime compound at 365 nm or 405 nm is preferably 1000 to 300000, more preferably 2000 to 300000, and still more preferably 5000 to 200000 from the viewpoint of sensitivity.

The molecular absorption coefficient of the compound can be measured using a well-known method. Specifically, for example, the molecular absorption coefficient of the compound can be measured using an ultraviolet-visible spectrophotometer (Cary-5 spectrophotometer, manufactured by Varian Medical Systems, Inc.) and an ethyl acetate solvent at a concentration of 0.01 g/L.

Optionally, two or more photopolymerization initiators may be used in combination.

The content of the photopolymerization initiator in the coloring composition (in a case where two or more photopolymerization initiators are used, the total content thereof) is preferably 0.1 to 20 mass %, more preferably 0.5 to 10 mass %, and still more preferably 1 to 8 mass % with respect to the total solid content of the coloring composition. In the above-described range, excellent sensitivity and pattern formability can be obtained.

<<Ultraviolet Absorber>>

The coloring composition according to the present invention can include a ultraviolet absorber.

The ultraviolet absorber is a compound having an absorption coefficient of higher than 100 per gram at a wavelength of 365 nm and having an absorption coefficient of 10 or lower per gram at a wavelength of 400 nm or longer. The absorption coefficient can be measured using an ultraviolet-visible spectrophotometer (Cary-5 spectrophotometer, manufactured by Varian Medical Systems, Inc.) and an ethyl acetate solvent at a concentration of 0.01 g/L.

It is not preferable that the absorption coefficient per gram at a wavelength of 365 nm is 100 or lower because the addition amount of the ultraviolet absorber for obtaining an ultraviolet absorbing effect increases, and thus the formulation likelihood decreases. It is not preferable that the absorption coefficient per gram at a wavelength of 400 nm or higher is higher than 10 because there is an effect on the device spectrum in the visible region.

As the ultraviolet absorber, a compound represented by the following Formula (I) which is a conjugated diene compound is preferable. In a case where this conjugated diene compound is used, a variation in development performance especially after low-illuminance exposure can be suppressed, and the dependence on exposure illuminance relating to pattern formability such as a line width of a pattern, a film thickness, or an optical spectrum can be more effectively suppressed.

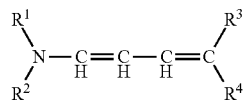

Formula (I)

In Formula (I), $R^1$ and $R^2$ each independently represent a hydrogen atom, an alkyl group having 1 to 20 carbon atoms, or an aryl group having 6 to 20 carbon atoms. $R^1$ and $R^2$ may be the same as or different from each other but do not represent a hydrogen atom at the same time.

Hereinafter, specific examples (Exemplary Compounds (1) to (14)) of the compound represented by Formula (I) will be shown. However, the present invention is not limited to these exemplary compounds.

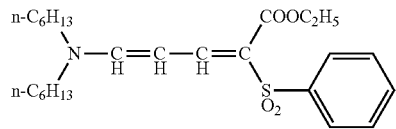

(1)

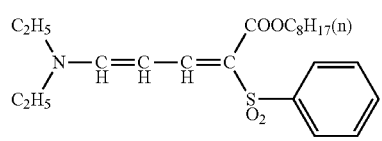

(2)

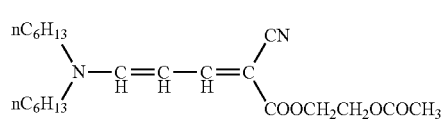

(3)

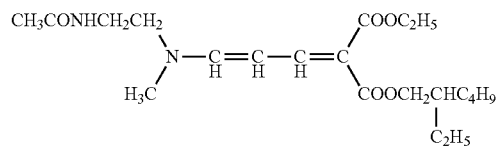

(4)

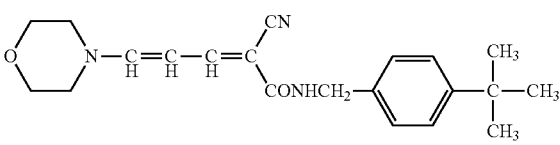

(5)

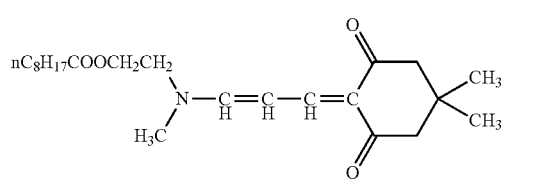

(6)

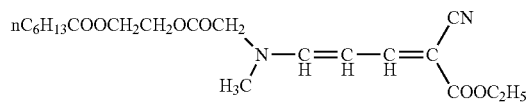

(7)

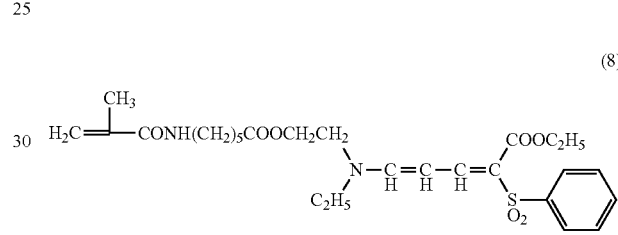

(8)

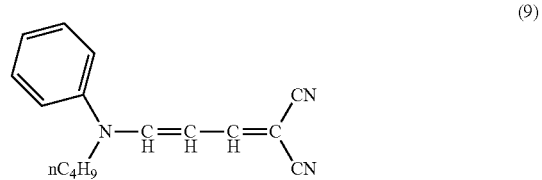

(9)

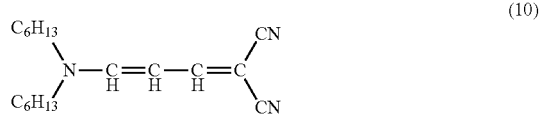

(10)

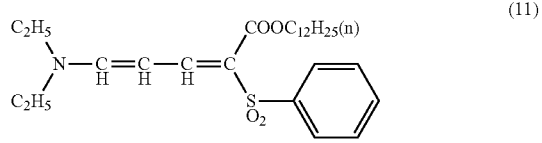

(11)

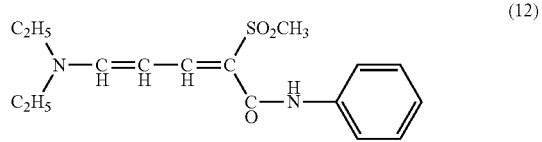

(12)

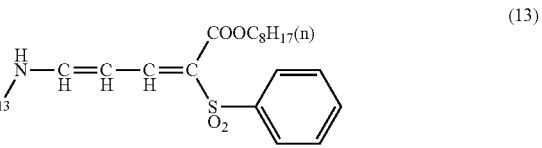

(13)

-continued

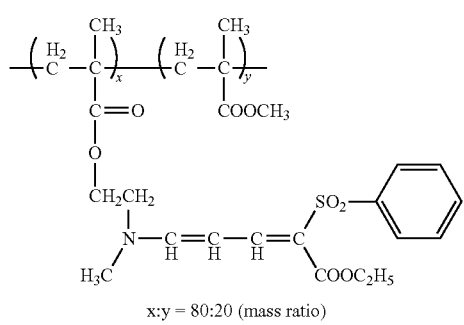

x:y = 80:20 (mass ratio)

The compound represented by Formula (I) can be synthesized using a method described in JP1969-29620B (JP-S44-29620B), JP1978-128333A (JP-S53-128333A), JP1986-169831A (JP-S61-169831A), JP1988-53543A (JP-S63-53543A), JP1988-53544A (JP-S63-53544A), or JP1988-56651A (JP-S63-56651A).

Among various ultraviolet absorbers, one kind may be used alone, or two or more kinds may be used in combination.

The coloring composition according to the present invention may or may not include a ultraviolet absorber. In a case where the coloring composition according to the present invention includes a ultraviolet absorber, the content of the ultraviolet absorber in the coloring composition is preferably 0.01 to 10 mass % and more preferably 0.01 to 5 mass % with respect to the mass of the total solid content of the coloring composition according to the present invention.

In a case where the content of the ultraviolet absorber is in the above-described range, the sensitivity is excellent, and a fine pattern shape (in particular, a rectangular shape) can be formed with higher accuracy.

A mass ratio (D/B) of the ultraviolet absorber to the photopolymerization initiator is in a range of preferably 0.25 to 1.25, more preferably 0.3 to 1.1, and still more preferably 0.4 to 1.0. In a case where the ratio is in the above-described range, the sensitivity is excellent, and a fine pattern shape (in particular, a rectangular shape) can be formed with higher accuracy.

<<Organic Solvent>>

The coloring composition according to the present invention can include an organic solvent. Basically, the organic solvent is not particularly limited as long as it satisfies the solubility of each component and the application properties of the coloring composition. However, it is preferable that the organic solvent is selected in consideration of the solubility of the ultraviolet absorber, the alkali-soluble resin, and the like, the application properties of the coloring composition, and safety.

Examples of the organic solvent are as follows:

an ester, for example, ethyl acetate, n-butyl acetate, isobutyl acetate, cyclohexyl acetate, amyl formate, isoamyl acetate, butyl propionate, isopropyl butyrate, ethyl butyrate, butyl butyrate, methyl lactate, ethyl lactate, an alkyl oxyacetate (for example, methyl oxyacetate, ethyl oxyacetate, or butyl oxyacetate (for example, methyl methoxyacetate, ethyl methoxyacetate, butyl methoxyacetate, methyl ethoxyacetate, or ethyl ethoxyacetate)), a 3-oxypropionic acid alkyl ester (for example, 3-methyl oxypropionate or 3-ethyl oxypropionate (for example, methyl 3-methoxypropionate, ethyl 3-methoxypropionate, methyl 3-ethoxypropionate, or ethyl 3-ethoxypropionate)), a 2-oxypropionic acid alkyl ester (for example, 2-methyl oxypropionate, 2-ethyl oxypropionate, or 2-propyl oxypropionate (for example, 2-methyl methoxypropionate, 2-ethyl methoxypropionate, 2-propyl methoxypropionate, 2-methyl ethoxypropionate or 2-ethyl ethoxypropionate)), 2-oxy-2-methyl methylpropionate or 2-oxy-2-ethyl methylpropionate (for example, 2-methoxy-2-methyl methylpropionate or 2-ethoxy-2-ethyl methylpropionate), methyl pyruvate, ethyl pyruvate, propyl pyruvate, methyl acetoacetate, ethyl acetoacetate, 2-methyl oxobutanoate, or 2-ethyl oxobutanoate;

an ether, for example, diethylene glycol dimethyl ether, tetrahydrofuran, ethylene glycol monomethyl ether, ethylene glycol monoethyl ether, methyl cellosolve acetate, ethyl cellosolve acetate, diethylene glycol monomethyl ether, diethylene glycol monoethyl ether, diethylene glycol monobutyl ether, propylene glycol monomethyl ether, propylene glycol monomethyl ether acetate, propylene glycol monoethyl ether acetate, or propylene glycol monopropyl ether acetate;

a ketone, for example, methyl ethyl ketone, cyclohexanone, cyclopentanone, 2-heptanone, or 3-heptanone; and an aromatic hydrocarbon, for example, toluene or xylene.

Among these organic solvents, one kind may be used alone, or two or more kinds may be used in combination.

In a case where two or more organic solvents are used in combination, in particular, a mixed solution is preferable, the mixed solution including two or more organic solvents selected from the group consisting of methyl 3-ethoxypropionate, ethyl 3-ethoxypropionate, ethyl cellosolve acetate, ethyl lactate, diethylene glycol dimethyl ether, butyl acetate, methyl 3-methoxypropionate, 2-heptanone, cyclohexanone, ethyl carbitol acetate, butyl carbitol acetate, propylene glycol methyl ether, and propylene glycol methyl ether acetate.

In the present invention, as the organic solvent, an organic solvent containing 0.8 mmol/L or lower of a peroxide is preferable, and an organic solvent containing no peroxide is more preferable.

The amount of the organic solvent included in the coloring composition is preferably 10 to 90 mass %, more preferably 20 to 80 mass %, and still more preferably 25 to 75 mass % with respect to the total mass of the coloring composition.

<<Sensitizer>>

The coloring composition according to the present invention may include a sensitizer in order to improve the radical generation efficiency of the photopolymerization initiator and to increase a photosensitive wavelength.

As the sensitizer, for example, a sensitizer having an absorption wavelength in a wavelength range of 300 nm to 450 nm is used. It is preferable that the sensitizer sensitizes the photopolymerization initiator using an electron☐transfer mechanism or an energy-transfer mechanism.

Examples of the sensitizer include: a polynuclear aromatic compound such as phenanthrene, anthracene, pyrene, perylene, triphenylene, or 9,10-dialkoxyanthracene; a xanthene such as fluorescein, eosin, erythrosine, Rhodamine B, or Rose Bengal; a thioxanthone; a cyanine; a merocyanine; a phthalocyanine; a thiazine such as thionine, methylene blue, or toluidine blue; an acridine; an anthraquinone; a squaylium; a coumarin; a phenothiazine; a phenazine; a styrylbenzene; an azo compound; diphenylmethane; triphenylmethane; a distyrylbenzene; a carbazole; porphyrin; a spiro compound; quinacridone; indigo; styryl; a pyrylium compound; a pyrromethene compound; a pyrazolotriazole compound; a benzothiazole compound; a barbituric acid derivatives; a thiobarbituric acid derivatives; an aromatic ketone compound such as acetophenone, benzophenone, or Michler's ketone; and a heterocyclic compound such as N-aryloxazolidinone.

In addition, for example, a compound described in paragraphs "0101" to "0154" of JP2008-32803A can be used.

The content of the sensitizer in the coloring composition is preferably 0.1 to 20 mass % and more preferably 0.5 to 15 mass % in terms of solid content from the viewpoints of light absorption efficiency in a deep region and initiation decomposition efficiency.

Among the sensitizers, one kind may be used alone, or two or more kinds may be used. In a case where two or more sensitizers are used in combination, it is preferable that the total content of the sensitizers is in the above-described range.

<<Chain Transfer Agent>>

Depending on the photopolymerization initiator used, it is preferable that a chain transfer agent is added to the coloring composition according to the present invention. Examples of the chain transfer agent include N,N-dialkylamino benzoic acid alkyl ester and a thiol compound, and Examples of the thiol compound include 2-mercapto-benzothiazole, 2-mercapto-1-phenyl benzimidazole, and 3-mercaptopropionic acid. Among these chain transfers, one kind may be used alone, or a mixture of two or more kinds may be used.

<<Polymerization Inhibitor>>

The coloring composition according to the present invention may include a polymerization inhibitor in order to prevent unnecessary thermal polymerization of the polymerizable compound during the manufacturing or storage of the coloring composition.

Examples of the polymerization inhibitor include hydroquinone, p-methoxyphenol, di-t-butyl-p-cresol, pyrogallol, t-butylcatechol, benzoquinone, 4,4'-thiobis(3-methyl-6-t-butylphenol), 2,2'-methylenebis(4-methyl-6-t-butylphenol), and N-nitrosophenylhydroxylamine cerium (I) salt. Among these, p-methoxyphenol is preferable.

The addition amount of the polymerization inhibitor is preferably 0.01 to 5 mass % with respect to the mass of the coloring composition.

<<Substrate Adhesive>>

The coloring composition according to the present invention may include a substrate adhesive in order to improve substrate adhesiveness.

As the substrate adhesive, a silane coupling agent, a titanate coupling agent, or an aluminum coupling agent can be preferably used.

Examples of the silane coupling agent include γ-methacryloxypropyl trimethoxy silane, γ-methacryloxypropyl triethoxy silane, γ-acryloxy propyl trimethoxy silane, γ-acryloxy propyl triethoxy silane, γ-mercaptopropyl trimethoxysilane, γ-aminopropyl triethoxysilane, and phenyl trimethoxysilane. Among these, γ-methacryloxypropyl trimethoxy silane is preferable as the substrate adhesive.

In addition, as the silane coupling agent, a silane coupling agent Y having at least a silicon atom, a nitrogen atom, and a curable functional group in a molecule and having a hydrolyzable group bonded to a silicon atom can also be used.

The hydrolyzable group refers to a substituent directly linked to a silicon atom and capable of forming a siloxane bond due to a hydrolysis reaction or a condensation reaction. Examples of the hydrolyzable group include a halogen atom, an alkoxy group, an acyloxy group, and an alkenyloxy group. In a case where the hydrolyzable group has carbon atoms, the number of carbon atoms is preferably 6 or less and more preferably 4 or less. In particular, an alkoxy group having 4 or less carbon atoms or an alkenyloxy group having 4 or less carbon atoms is preferable.

The silane coupling agent Y is not particularly limited as long as it has at least one silicon atom in a molecule thereof, and the silicon atom can be bonded to the following atoms and substituents. These atoms and substituents may be the same as or different from each other. Examples of the atoms and substituents bonded to the silicon atom include a hydrogen atom, a halogen atom, a hydroxyl group, an alkyl group having 1 to 20 carbon atoms, an alkenyl group, an alkynyl group, an aryl group, an amino group which can be substituted with an alkyl group and/or an aryl group, a silyl group, an alkoxy group having 1 to 20 carbon atoms, and an aryloxy group. These substituents may be further substituted with a silyl group, an alkenyl group, an alkynyl group, an aryl group, an alkoxy group, an aryloxy group, a thioalkoxy group, an amino group which can be substituted with an alkyl group and/or an aryl group, a halogen atom, a sulfonamido group, an alkoxycarbonyl group, an amido group, a urea group, an ammonium group, an alkylammonium group, a carboxyl group or a salt thereof, or a sulfo group or a salt thereof.

At least one hydrolyzable group is bonded to the silicon atom. The definition of the hydrolyzable group is as described above.

The silane coupling agent Y may include a group represented by the following Formula (Z).

$$*—Si(R^{z1})_{3-m}(R^{z2})_m \quad \text{Formula (Z)}$$

$R^{z1}$ represents an alkyl group, $R^{z2}$ represents a hydrolyzable group, and m represents an integer of 1 to 3. The number of carbon atoms in the alkyl group represented by $R^{z1}$ is preferably 1 to 5 and more preferably 1 to 3. The definition of the hydrolyzable group represented by $R^{z2}$ is as described above.

The silane coupling agent Y includes at least one nitrogen atom in a molecule thereof. It is preferable that the nitrogen atom is present in the form of a secondary amino group or a tertiary amino group, that is, it is preferable that the nitrogen atom has at least one organic group as a substituent. Regarding the structure of the amino group, the amino group may be present in a molecule in the form of a partial structure of a nitrogen-containing heterocycle, or may be present as an substituted amino group such as aniline. Here, examples of the organic group include an alkyl group, an alkenyl group, an alkynyl group, an aryl group, and a combination thereof. These organic groups may further have a substituent, and examples of the substituent which can be introduced include a silyl group, an alkenyl group, an alkynyl group, an aryl group, an alkoxy group, an aryloxy group, a thioalkoxy group, an amino group, a halogen atom, a sulfonamido group, an alkoxycarbonyl group, a carbonyloxy group, an amido group, a urea group, an alkyleneoxy group, an ammonium group, an alkylammonium group, a carboxyl group or a salt thereof, and a sulfo group.

In addition, it is preferable that the nitrogen atom is bonded to a curable functional group through an arbitrary organic linking group. Preferable examples of the organic linking group include the above-described substituents which can be introduced into the nitrogen atom and the organic group bonded to the nitrogen atom.

The curable functional group included in the silane coupling agent Y is preferably one or more groups selected from the group consisting of a (meth)acryloyloxy group, an epoxy group, an oxetanyl group, an isocyanate group, a hydroxyl group, an amino group, a carboxyl group, a thiol group, an alkoxysilyl group, a methylol group, a vinyl group, a (meth)

acrylamido group, a styryl group, and a maleimide group, more preferably one or more groups selected from the group consisting of a (meth)acryloyloxy group, an epoxy group, and an oxetanyl group.

The silane coupling agent Y is not particularly limited as long as it has at least one curable functional group in a molecule thereof. However, the silane coupling agent Y may have two or more curable functional groups. From the viewpoints of sensitivity and stability, the number of curable functional groups in a molecule is preferably 2 to 20, more preferably 4 to 15, and most preferably 6 to 10.

Examples of the silane coupling agent Y include a compound represented by the following Formula (Y).

$$(R^{y3})_n\text{-LN-Si}(R^{y1})_{3-m}(R^{y2})_m \qquad \text{Formula (Y)}$$

$R^{y1}$ represents an alkyl group, $R^{y2}$ represents a hydrolyzable group, and $R^{y3}$ represents a curable functional group.

LN represents a (n+1) valent linking group having a nitrogen atom.

m represents an integer of 1 to 3, and n represents an integer of 1 or more.

$R^{y1}$, $R^{y2}$, $R^{y3}$, and m in Formula (Y) have the same definitions and the same preferable ranges as those of $R^{z1}$, $R^{z2}$, $R^{z3}$, and m in Formula (W).

n in Formula (Y) represents an integer of 1 or more. The upper limit is, for example, preferably 20 or less, more preferably 15 or less, and still more preferably 10 or less. The lower limit is, for example, preferably 2 or more, more preferably 4 or more, and still more preferably 6 or more. In addition, n may represent 1.

LN in Formula (Y) represents a group having a nitrogen atom.

Examples of the group having a nitrogen atom include at least one group selected from groups represented by the following Formula (LN-1) to (LN-4), and a group of a combination of at least one group selected from groups represented by the following Formula (LN-1) to (LN-4), —CO—, CO₂, —O—, —S—, and —SO₂—. The alkylene group may be linear or branched. The alkylene group and the arylene group may have a substituent or may be unsubstituted. Examples of the substituent include a halogen atom and a hydroxyl group.

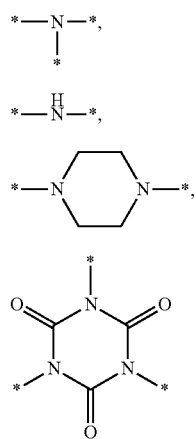

In the formula, * represents a direct bond.

Specific examples of the silane coupling agent Y include the following compounds. In the formula, Et represents an ethyl group. Other examples of the silane coupling agent Y include a compound described in paragraphs "0018" to "0036" of JP2009-288703A, the content of which is incorporated herein by reference.

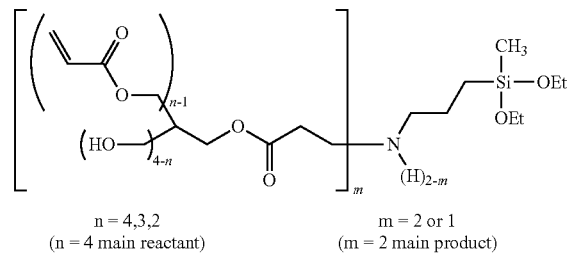

n = 4,3,2
(n = 4 main reactant)

m = 2 or 1
(m = 2 main product)

From the viewpoint of preventing a residue from remaining in a non-exposed portion when the coloring composition is exposed and developed, the content of the substrate adhesive is preferably 0.1 to 30 mass %, more preferably 0.5 to 20 mass %, and still more preferably 1 to 10 mass % with respect to the total solid content of the coloring composition.

<<Surfactant>>

The coloring composition according to the present invention may include various surfactants from the viewpoint of further improving application properties. As the surfactants, various surfactants such as a fluorine surfactant, a nonionic surfactant, a cationic surfactant, an anionic surfactant, or a silicone surfactant can be used.

By the coloring composition containing a fluorine surfactant, liquid characteristics (for example, fluidity) of a coating solution prepared from the coloring composition are further improved, and the uniformity in coating thickness and liquid saving properties can be further improved.

That is, in a case where a film is formed using a coating solution prepared using the coloring composition including a fluorine surfactant, the interfacial tension between a coated surface and the coating solution decreases, the wettability on the coated surface is improved, and the application properties on the coated surface is improved. Therefore, a film having a uniform thickness with reduced unevenness in thickness can be formed more suitably.

The fluorine content in the fluorine surfactant is preferably 3 to 40 mass %, more preferably 5 to 30 mass %, and still more preferably 7 to 25 mass %. The fluorine surfactant in which the fluorine content is in the above-described range is effective from the viewpoints of the uniformity in the thickness of the coating film and liquid saving properties, and the solubility thereof in the composition is also excellent.

Examples of the fluorine surfactant include: MEGAFAC F171, F172, F173, F176, F177, F141, F142, F143, F144, R30, F437, F475, F479, F482, F554, F780, and F781F (all of which are manufactured by DIC Corporation); FLUO-RAD FC430, FC431, and FC171 (all of which are manufactured by Sumitomo 3M Ltd.); SURFLON S-382, SC-101, SC-103, SC-104, SC-105, SC-1068, SC-381, SC-383, S-393, and KH-40 (all of which are manufactured by Asahi Glass Co., Ltd.); and PF636, PF656, PF6320, PF6520, and PF7002 (all of which are manufactured by OMNOVA Solutions Inc.). As the fluorine surfactant, a block polymer can also be used, and specific examples thereof include a compound described in JP2011-89090A.

Specific examples of the nonionic surfactant include glycerol, trimethylolpropane, trimethylolethane, an ethoxylate and a propoxylate thereof (for example, glycerol propoxylate or glycerin propoxylate), polyoxyethylene lauryl ether, polyoxyethylene stearyl ether, polyoxyethylene oleyl ether, polyoxyethylene octylphenyl ether, polyoxyethylene nonylphenyl ether, polyethylene glycol dilaurate, polyethylene glycol distearate, and sorbitan fatty acid esters (PLURONIC L10, L31, L61, L62, 10R5, 17R2, and 25R2 and TETRONIC 304, 701, 704, 901, 904, and 150R1 (all of which are manufactured by BASF SE)); and SOLSPERSE 20000 (manufactured by Lubrication Technology Inc.). In addition, NCW-101, NCW-1001, or NCW-1002 (manufactured by Wako Pure Chemical Industries, Ltd.) can also be used.

Specific examples of the cationic surfactant include a phthalocyanine derivative (trade name: EFKA-745, manufactured by Morishita Co.,Ltd.), an organosiloxane polymer KP341 (manufactured by Shin-Etsu Chemical Co., Ltd.), a (meth)acrylic acid (co)polymer POLYFLOW No. 75, No. 90, or No. 95 (manufactured by Kyoeisha Chemical Co., Ltd.), and W001 (manufactured by Yusho Co. Ltd.).

Specific examples of the anionic surfactant include W004, W005, and W017 (manufactured by Yusho Co. Ltd.).

Examples of the silicone surfactant include: TORAY SILICONE DC3PA, TORAY SILICONE SH7PA, TORAY SILICONE DC11PA, TORAY SILICONE SH21PA, TORAY SILICONE SH28PA, TORAY SILICONE SH29PA, TORAY SILICONE SH30PA, and TORAY SILICONE SH8400 (all of which are manufactured by Dow Corning Corporation); TSF-4440, TSF-4300, TSF-4445, TSF-4460, and TSF-4452 (all of which are manufactured by Momentive Performance Materials Inc.); KP341, KF6001, and KF6002 (all of which are manufactured by Shin-Etsu Chemical Co., Ltd.); and BYK307, BYK323, and BYK330 (all of which are manufactured by BYK-Chemie Japan K.K.).

Among these surfactants, one kind may be used alone, or two or more kinds may be used in combination.

The addition amount of the surfactant is preferably 0.001 to 2.0 mass % and more preferably 0.005 to 1.0 mass % with respect to the total mass of the coloring composition.

<Other Components>

The coloring composition according to the present invention optionally includes various additives including: a chain transfer agent such as N,N-dialkylamino benzoic acid alkyl ester or 2-mercapto-benzothiazole; a thermal polymerization initiator such as an azo compound or a peroxide compound; a polyfunctional thiol or an epoxy compound for improving the strength and sensitivity of a thermal polymerization component and a film; an ultraviolet absorber such as alkoxy benzophenone; a plasticizer such as dioctyl phthalate; a developability improving agent such as a low molecular weight organic carboxylic acid; other fillers; a polymer compound other than the above-described binders and alkali-soluble resins; an antioxidant; and an aggregation inhibitor.

In addition, in order to increase the degree of cure of a film during heating after development, a thermal curing agent can be added. Examples of the thermal curing agent include a thermal polymerization initiator such as an azo compound or a peroxide, a novolac resin, a resol resin, an epoxy compound, and a styrene compound.

Depending on materials used and the like, the coloring composition may include a metal element. From the viewpoint of, for example, suppressing the generation of defects, the content of a Group 2 element (for example, calcium or magnesium) in the coloring composition is controlled to be preferably 50 ppm or lower and more preferably 0.01 to 10 ppm. In addition, the total amount of inorganic metal salts in the coloring composition is controlled to be preferably 100 ppm or lower and more preferably 0.5 to 50 ppm.

<Preparation of Coloring Composition>

The coloring composition can be prepared by mixing the above-described respective components with each other.

During the preparation of the coloring composition, the respective components constituting the coloring composition may be mixed with each other collectively, or may be mixed with each other sequentially after dissolved and dispersed in a solvent. In addition, during mixing, the order of addition or working conditions are not particularly limited. For example, all the components may be dissolved and dispersed in a solvent at the same time to prepare the coloring composition. Optionally, two or more solutions or dispersions may be appropriately prepared using the respective components, and the solutions or dispersions may be mixed with each other during use (during application) to prepare the coloring composition.

It is preferable that the coloring composition according to the present invention is filtered through a filter, for example, in order to remove foreign matter or to remove defects.

As the filter used for filtering, any filter which is used in the related art for filtering or the like can be used without any particular limitation.

Examples of a material of the filter include: a fluororesin such as polytetrafluoroethylene (PTFE); a polyamide resin such as nylon-6 or nylon-6,6; and a polyolefin resin (including a high-density polyolefin resin and an ultrahigh molecular weight polyolefin resin) such as polyethylene or polypropylene (PP). Among these materials, polypropylene (including high-density polypropylene) is preferable.

The pore diameter of the filter is not particularly limited and is, for example, preferably 0.01 to 7.0 μm, more preferably 0.01 to 2.5 μm, and still more preferably 0.01 to 2.0 μm. By adjusting the pore size of the filter to be in the above-described range, fine particles can be removed more effectively, and the turbidity can be further reduced.

Here, the pore size of the filter can refer to a nominal value of a manufacturer of the filter. A commercially available filter can be selected from various filters manufactured by Pall Corporation, Toyo Roshi Kaisha, Ltd., Entegris Japan Co., Ltd. (former Mykrolis Corporation), or Kits Microfilter Corporation.

During filtering, two or more filters may be used in combination.

For example, first, filtering is performed using a first filter and then filtering is further performed using a second filter having a different pore size than the first filter.

At this time, the filtering using the first filter and the filtering using the second filter may be performed once, or twice or more, respectively.

The second filter may be formed of the same material as that of the first filter.

When a film having a thickness of 0.5 to 50 μm after drying is formed using the coloring composition according to the present invention, it is preferable that, at least one value in the above film thickness range, a light transmittance in a thickness direction of the film has a maximum value of 20% or lower in a wavelength range of 400 to 830 nm and has a minimum value of 70% or higher in a wavelength range of 1000 to 1300 nm.

It is preferable that, at least one value in the above film thickness range, the maximum value of the light transmittance in the thickness direction of the film in a wavelength range of 400 to 830 nm is preferably 20% or lower, more preferably 10% or lower, and still more preferably 5% or lower.

It is preferable that, at least one value in the above film thickness range, the minimum value of the light transmittance in the thickness direction of the film in a wavelength range of 1000 to 1300 nm is preferably 70% or higher, more preferably 80% or higher, and still more preferably 90% or higher.

More specifically, it is preferable that, at least one value in the above film thickness range, the film has the following spectral characteristics.

It is preferable that the coloring composition according to the present invention satisfies at least one of the following spectral characteristics (1) to (4).

(1) When a film having a thickness of 1 µm after drying is formed using the composition according to the present invention, a light transmittance in a thickness direction of the film has a maximum value of 20% or lower in a wavelength range of 400 to 830 nm and has a minimum value of 70% or higher in a wavelength range of 1000 to 1300 nm. The maximum value in a wavelength range of 400 to 830 nm is more preferably 20% or lower and still more preferably 10% or lower. The minimum value in a wavelength range of 1000 to 1300 nm is more preferably 70% or higher and still more preferably 80% or higher.

(2) When a film having a thickness of 2 µm after drying is formed using the composition according to the present invention, a light transmittance in a thickness direction of the film has a maximum value of 20% or lower in a wavelength range of 400 to 830 nm and has a minimum value of 70% or higher in a wavelength range of 1000 to 1300 nm. The maximum value in a wavelength range of 400 to 830 nm is more preferably 20% or lower and still more preferably 10% or lower. The minimum value in a wavelength range of 1000 to 1300 nm is more preferably 70% or higher and still more preferably 80% or higher.

(3) When a film having a thickness of 3 µm after drying is formed using the composition according to the present invention, a light transmittance in a thickness direction of the film has a maximum value of 20% or lower in a wavelength range of 400 to 830 nm and has a minimum value of 70% or higher in a wavelength range of 1000 to 1300 nm. The maximum value in a wavelength range of 400 to 830 nm is more preferably 20% or lower and still more preferably 10% or lower. The minimum value in a wavelength range of 1000 to 1300 nm is more preferably 70% or higher and still more preferably 80% or higher.

(4) When a film having a thickness of 5 µm after drying is formed using the composition according to the present invention, a light transmittance in a thickness direction of the film has a maximum value of 20% or lower in a wavelength range of 400 to 830 nm and has a minimum value of 70% or higher in a wavelength range of 1000 to 1300 nm. The maximum value in a wavelength range of 400 to 830 nm is more preferably 20% or lower and still more preferably 10% or lower. The minimum value in a wavelength range of 1000 to 1300 nm is more preferably 70% or higher and still more preferably 80% or higher.

In addition, at least one value in the above film thickness range, the minimum value A of the absorbance in a wavelength range of 400 to 830 nm is, for example, preferably 0.1 to 5 and more preferably 0.3 to 3. In addition, the maximum value B of the absorbance in a wavelength range of 1000 to 1300 nm is, for example, preferably 0.01 to 0.5 and more preferably 0.02 to 0.3.

<Film>

Next, a film according to an aspect to of the present invention will be described.

The film is characterized in that a light transmittance in a thickness direction of the film has a maximum value of 20% or lower in a wavelength range of 400 to 830 nm and has a minimum value of 70% or higher in a wavelength range of 1000 to 1300 nm.

The maximum value of the light transmittance in the thickness direction of the film in a wavelength range of 400 to 830 nm is preferably 20% or lower and more preferably 10% or lower.

The minimum value of the light transmittance in the thickness direction of the film in a wavelength range of 1000 to 1300 nm is preferably 70% or higher and more preferably 80% or higher.

The spectral characteristics of the film are values obtained by measuring the transmittance in a wavelength range of 300 to 1300 nm using a spectrophotometer (ref. the glass substrate) of an ultraviolet-visible-near infrared spectrophotometer (U-4100, manufactured by Hitachi High-Technologies Corporation).

The thickness of the film is not particularly limited and is preferably 0.1 to 20 µm and more preferably 0.5 to 10 µm.

It is preferable that the film is formed by curing the coloring composition according to the present invention. By using the coloring composition according to the present invention, a film having the above-described spectral characteristics can be formed. The formed film is preferably used in a color filter.

<Pattern Forming Method, Color Filter, and Method of Manufacturing Color Filter>

Next, a pattern forming method and a color filter according to aspects of the present invention will be described in detail using a manufacturing method thereof. In addition, a method of manufacturing a color filter according to an aspect of the present invention in which the pattern forming method is used will also be described.

The pattern forming method includes: a step of applying the coloring composition to a support to form a coloring composition layer; a step of exposing the coloring composition layer in a pattern shape; and a step of forming a colored pattern by removing a non-exposed portion by development.

This pattern forming method is used for manufacturing a colored layer of a color filter. That is, this specification also discloses the method of manufacturing a color filter including the pattern forming method.

Hereinafter, the details will be described.

Hereinafter, each step of the pattern forming method will be described in detail through the method of manufacturing a color filter for a solid image pickup element. However, the present invention is not limited to this method. Hereinafter, the color filter for a solid image pickup element will be referred to simply as "color filter".

<<Step of Forming Coloring Composition Layer>>

In the step of forming a coloring composition layer, the coloring composition according to the present invention is applied to a support to form a coloring composition layer thereon.

Examples of the support used in the present step include a photoelectric conversion substrate or a silicon substrate of a CCD, a CMOS, or an organic CMOS used for a solid image pickup element; non alkali glass, soda glass, PYREX (registered trade name) glass, or quartz glass which is used in a liquid crystal display apparatus; and a substrate obtained by attaching a transparent conductive film to the above-described substrate. In these substrates, a black matrix may be formed to separate pixels from each other.

In addition, optionally, an undercoat layer may be provided on the support to improve adhesion with a layer above the support, to prevent diffusion of materials, or to make a surface of the substrate flat.

Examples of a method of applying the coloring composition according to the present invention to the support include various coating methods such as slit coating, an ink jet method, spin coating, cast coating, roll coating, or screen printing method.

The coloring composition layer applied to the support can be dried (pre-baked) using, for example, a hot plate or an oven at a temperature of 50° C. to 140° C. for 10 seconds to 300 seconds.

The thickness of the dried (pre-baked) colored layer is preferably 0.55 to 1.8 µm, more preferably 0.60 to 1.8 µm, still more preferably 0.70 to 1.6 µm, and even still more preferably 0.80 µm to 1.4 µm.

<<Exposure Step>>

In the exposure step, the coloring composition layer which is formed in the coloring composition layer forming step is exposed in a pattern shape using an exposure device such as a stepper through a mask having a predetermined mask pattern. As a result, a cured film is obtained.

As radiation (light) used during the exposure, in particular, ultraviolet rays such as g-rays or i-rays are preferably used (i-rays are more preferably used). The irradiation intensity (exposure intensity) is preferably 30 mJ/cm$^2$ to 1500 mJ/cm$^2$, more preferably 50 mJ/cm$^2$ to 1000 mJ/cm$^2$, and still more preferably 80 mJ/cm$^2$ to 500 mJ/cm$^2$.

<<Development Step>>

After the exposure step, an alkali development treatment (development step) is performed such that a non-cured portion after exposure is eluted into a developer and a photo-cured portion remains. Through this development step, a pattern-shaped film including colored pixels can be formed.

The development method may be any one of a dipping method, a shower method, a spray method, or a puddle method which may be used in combination with a swing method, a spin method, an ultrasonic method, or the like.

Before contact with the developer, a surface to be developed may be wetted with water or the like in advance to prevent unevenness in development.

As the developer, an organic alkali developer which does not cause damages to an undercoat circuit or the like is desired. A developing temperature is typically 20° C. to 30° C., and a developing time is 20 to 90 seconds.

Examples of an alkaline agent including a developer include: an organic alkaline compound such as ammonia water, ethylamine, diethylamine, dimethylethanolamine, tetramethylammonium hydroxide, tetraethylammonium hydroxide, tetrabutylammonium hydroxide, benzyltrimethylammonium hydroxide, choline, pyrrole, piperidine, or 1,8-diazabicyclo-[5,4,0]-7-undecene; and an inorganic compound such as sodium hydroxide, potassium hydroxide, sodium bicarbonate, or potassium bicarbonate.

In addition, a surfactant may be used as the developer. Examples of the surfactant include the surfactants described above regarding the coloring composition. Among these, a nonionic surfactant is preferable.

As the developer, an alkaline aqueous solution is preferably used in which the above alkaline agent is diluted with pure water such that a concentration thereof is 0.001 to 10 mass % and preferably 0.01 to 1 mass %. In a case where a developer including the alkaline aqueous solution is used, in general, it is preferable that the film is rinsed with pure water to remove a residual developer after development and dried.

After the exposure step and the drying, a heat treatment (post-baking) or a curing step of curing the film by post-exposure may be performed. Post-baking is a heat treatment which is performed after development to completely cure the film, in which a thermal curing treatment is performed typically at 100° C. to 270° C.

The coating film after the development is post-baked continuously or batchwise using heating means such as a hot plate, a convection oven (hot air circulation dryer), a high-frequency heater under the above-described conditions.

In a case where light is used for post-baking, for example, g-rays, h-rays, i-rays, excimer laser such as KrF or ArF, electron rays, or X-rays can be used. It is preferable that post-baking is performed using an existing high-pressure mercury lamp at a low temperature of about 20° C. to 50° C., and the irradiation time is 10 seconds to 180 seconds and preferably 30 seconds to 60 seconds. In a case where post-exposure and post-heating are performed in combination, it is preferable that post-exposure is performed before post-heating.

By performing the above-described respective steps, a color filter is prepared.

The color filter may consist of only colored pixels having the above-described specific spectral characteristics, or may include not only the colored pixels having the above-described specific spectral characteristics but also colored pixels of red, green, blue, magenta, yellow, cyan, black, or transparent color. In a case where the color filter includes not only the colored pixels having the specific spectral characteristics but also other color pixels, the colored pixels having the specific spectral characteristics may be provided before or after the other color pixels.

In a case where the coloring composition according to the present invention is attached to a nozzle of an ejecting unit of a coater, a pipe of a coater, or an inside portion of a coater, the coloring composition be easily removed by rinsing with a well-known cleaning solution. In this case, in order to more effectively remove the coloring composition by rising, it is preferable that the organic solvent described above as the organic solvent included in the coloring composition is used as the cleaning solution.

In addition, as the cleaning solution for removing the coloring composition according to the present invention by rinsing, a cleaning solution described in JP1995-128867A (JP-H07-128867A), JP1995-146562A (JP-H07-146562A), JP1996-278637A (JP-H08-278637A), JP2000-273370A, JP2006-85140A, JP2006-291191A, JP2007-2101A, JP2007-2102A, or JP2007-281523A can be preferably used.

As the cleaning solution, alkylene glycol monoalkyl ether carboxylate, or alkylene glycol monoalkyl ether is preferably used.

Among these organic solvents which can be used as the cleaning solution, one kind may be used alone, or a mixture of two or more kinds may be used.

In a case where a mixture of two or more organic solvents is used, a mixed solvent obtained by mixing an organic solvent having a hydroxyl group and an organic solvent having no hydroxyl group with each other is preferable. A mass ratio of the organic solvent having a hydroxyl group to the organic solvent having no hydroxyl group is 1/99 to 99/1, preferably 10/90 to 90/10, and more preferably 20/80 to 80/20. As the mixed solvent, a mixed solvent obtained by mixing propylene glycol monomethyl ether acetate (PGMEA) and propylene glycol monomethyl ether (PGME) with each other at a ratio of 60/40 is more preferable.

In order to improve the permeability of the cleaning solution into the coloring composition, the surfactant described above as the surfactant which may be included in the coloring composition may be added to the cleaning solution.

This color filter can be suitably mounted on a solid image pickup element such as a CCD image sensor, a CMOS image sensor, an organic CMOS image sensor, or a CIGS image sensor. In particular, it is preferable that the color filter is mounted on a high-resolution solid image pickup element including more than 1000000 pixels. For example, the color filter can be disposed between a light receiving section of each of pixels constituting a CCD image sensor and a microlens for collecting light.

<Solid Image Pickup Element>

A solid image pickup element according to an aspect of the present invention includes the color filter for a solid image pickup element. The solid image pickup element is configured to include the color filter according to the aspect of the present invention as a color filter for a solid image pickup element. The configuration of the solid image pickup element is not particularly limited as long as the solid image pickup element functions. For example, the following configuration can be adopted.

The solid image pickup element includes plural photodiodes and transfer electrodes on the support, the photodiodes constituting a light receiving area of the solid image pickup element (for example, a CCD image sensor or a CMOS image sensor), and the transfer electrode being formed of polysilicon or the like. In the solid image pickup element, a light shielding film formed of tungsten or the like which has openings through only light receiving sections of the photodiodes is provided on the photodiodes and the transfer electrodes, a device protection film formed of silicon nitride or the like is formed on the light shielding film so as to cover the entire surface of the light shielding film and the light receiving sections of the photodiodes, and the color filter for a solid image pickup element is formed on the device protection film.

Further, a configuration in which light collecting means (for example, a microlens; hereinafter, the same shall be applied) is provided above the device protection film and below the color filter for a solid image pickup element (on a side thereof close the support), or a configuration in which light collecting means is provided on the color filter for a solid image pickup element may be adopted.

<Infrared Sensor>

An infrared sensor according to an aspect of the present invention includes the color filter. The infrared sensor is configured to include the color filter according to the aspect of the present invention. The configuration of the infrared sensor is not particularly limited as long as the solid image pickup element functions. For example, the following configuration can be adopted.

The infrared sensor includes plural photodiodes and transfer electrodes on a substrate, the photodiodes constituting a light receiving area of a solid image pickup element (for example, a CCD image sensor, a CMOS image sensor, or an organic CMOS sensor), and the transfer electrode being formed of polysilicon or the like. In the infrared sensor, a light shielding film formed of tungsten or the like which has openings through only light receiving sections of the photodiodes is provided on the photodiodes and the transfer electrodes, a device protection film formed of silicon nitride or the like is formed on the light shielding film so as to cover the entire surface of the light shielding film and the light receiving sections of the photodiodes, and the color filter for a solid image pickup element is formed on the device protection film.

Further, a configuration in which light collecting means (for example, a microlens; hereinafter, the same shall be applied) is provided above the device protection film and below the color filter (on a side thereof close the substrate), or a configuration in which light collecting means is provided on the color filter may be adopted.

An organic CMOS sensor has a two-layer hybrid structure including: a thin panchromatic organic photoelectric conversion film which is a photoelectric conversion layer; and a CMOS signal read-out substrate, in which an organic material servers to trap light and to convert the trapped light to an electric signal, and an inorganic material serves to extract the electric signal to the outside. In this structure, the aperture ratio can be set as 100% with respect to incident rays in principle. The organic photoelectric conversion layer is a structure-free continuous film, and can be provided on the CMOS signal read-out substrate. Therefore, the organic photoelectric conversion layer does not require an expensive microfabrication process and is suitable for reducing the pixel size.

Hereinafter, an embodiment of the infrared sensor will be described using FIG. 1.

As shown in FIG. 1, an infrared sensor 100 includes a solid image pickup element 110.

In an imaging region provided on the solid image pickup element 110, near infrared absorbing filters 111 and color filters 112 are provided.

The near infrared absorbing filters 111 are configured to allow transmission of light in the visible region (for example light having a wavelength of 400 to 700 nm) and to shield light in the infrared region (for example, light having a wavelength of 800 to 1300 nm, preferably light having a wavelength of 900 to 1200 nm, and more preferably light having a wavelength of 900 to 1000 nm).

In the color filters 112, pixels which allow transmission of light having a specific wavelength in the visible region and absorbs the light. For example, pixels of red (R), green (G), and blue (B) are formed in the color filters 112.

Regions 114 where the near infrared absorbing filters 111 are not formed are provided between near infrared transmitting filters 113 and the solid image pickup element 110. In the regions 114, resin layers (for example, transparent resin layers) capable of allowing transmission of light having a wavelength which has passed through the near infrared transmitting filters 113 are disposed.

The near infrared transmitting filters 113 have visible ray shielding properties, allow transmission of infrared rays having a specific wavelength, and are formed of the above-described color filter having the spectral characteristics. For example, it is preferable that the near infrared transmitting filters 113 shield light having a wavelength of 400 to 830 nm and allow transmission of light having a wavelength of 900 to 1300 nm.

Microlenses 115 are disposed on incident rays hv side of the color filters 112 and the near infrared transmitting filters 113. A planarizing layer 116 is formed so as to cover the microlenses 115.

In the embodiment shown in FIG. 1, the resin layers are disposed in the regions 114. However, the near infrared transmitting filters 113 may be formed in the regions 114. That is, the near infrared transmitting filters 113 may be formed on the solid image pickup element 110.

In addition, in the embodiment shown in FIG. 1, the thickness of the color filters 112 is the same as the thickness of the near infrared transmitting filters 113. However, the thickness of the color filters 112 may be different from the thickness of the near infrared transmitting filters 113.

In addition, in the embodiment shown in FIG. 1, the color filters 112 are provided on the incident rays hv side compared to the near infrared absorbing filters 111. The lamination order of the near infrared absorbing filters 111 and the color filters 112 may be reversed, and the near infrared absorbing filters 111 may be provided on the incident rays hv side compared to the color filters 112.

In addition, in the embodiment shown in FIG. 1, the near infrared absorbing filters 111 and the color filters 112 are laminated adjacent to each other. However, the near infrared absorbing filters 111 and the color filters 112 are not necessarily provided adjacent to each other, and another layer may be provided therebetween.

According to this infrared sensor, image information can be acquired at the same time. Therefore, the infrared sensor can be used for motion sensing in a case where a motion detecting target is recognized. Further, since distance information can be acquired, for example, an image including 3D information can be obtained.

Next, an imaging apparatus will be described as an example to which the infrared sensor is applied. Examples of the imaging apparatus include a camera module.

Figure 2:
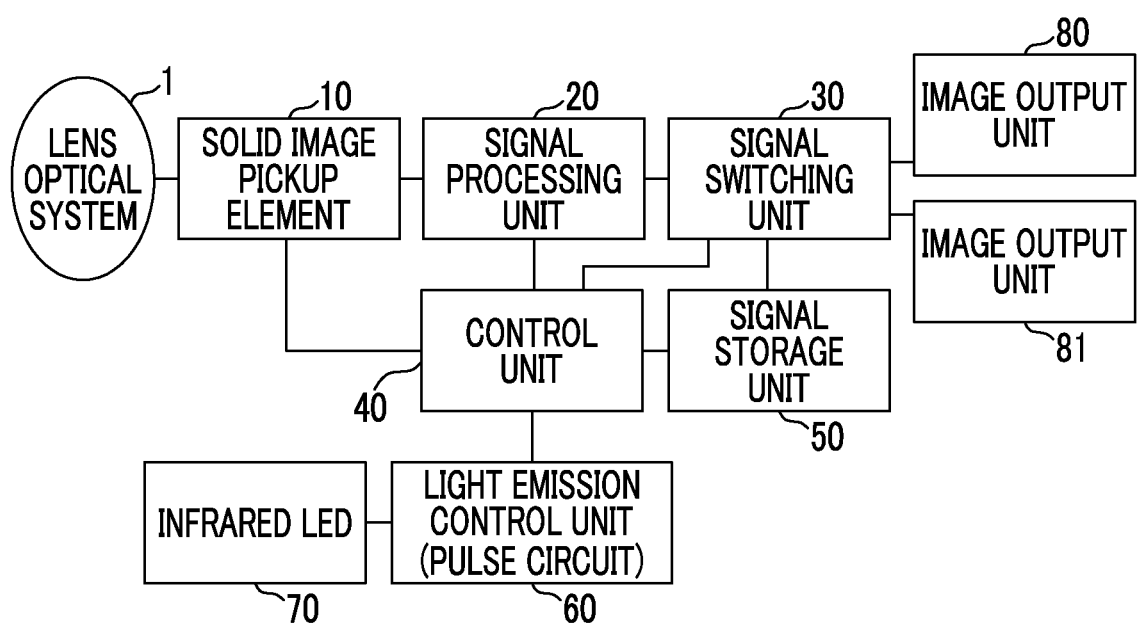
FIG. 2 is a functional block diagram showing an imaging apparatus to which the infrared sensor is applied.

FIG. 2 is a functional block diagram showing the imaging apparatus. The imaging apparatus includes a lens optical system 1, a solid image pickup element 10, a signal processing unit 20, a signal switching unit 30, a control unit 40, a signal storage unit 50, a light emission control unit 60, an infrared light emitting diode (LED) 70 of a light emitting element which emits infrared rays, image output units 80 and 81. As the solid image pickup element 10, the above-described infrared sensor 100 can be used. In addition, a part or all of other components of the imaging apparatus excluding the solid image pickup element 10 and the lens optical system 1 may be formed on the same semiconductor substrate. The respective configurations of the imaging apparatus can be found in paragraphs "0032" to "0036" of JP2011-233983A, the content of which is incorporated herein by reference.

EXAMPLES

Hereinafter, the present invention will be described using examples. However, the present invention is not limited to the following examples as long as it does not depart from the scope of the present invention. Unless specified otherwise, "part(s)" and "%" represent "part(s) by mass" and "% by mass".

Test Example 1

Preparation of Pigment Dispersions 1-1 to 1-7

A mixed solution having a composition shown in Table 1 below was mixed and dispersed using a bead mill (a high-pressure dispersing machine with a pressure reducing mechanism, NANO-3000-10 (Nippon BEE Chemical Co., Ltd.)) in which zirconia beads having a diameter of 0.3 mm were used. As a result, a pigment dispersion was prepared. In addition, each of Pigment Dispersions 1-1 to 1-3 was prepared by mixing and dispersing a mixed solution shown in Table 1 until an average particle size of an IR colorant was as shown in Table 1. Table 1 shows the amount (unit: part(s) by mass) of the corresponding component.

The volume average particle size of a pigment in the pigment dispersion was measured using MICROTRAC UPA 150 (manufactured by Nikkiso Co., Ltd.). The measurement results are shown in Table 1.

[Preparation of Pigment Dispersions 2-1 to 2-6]

A mixed solution having a composition shown in Table 1 below was mixed and dispersed for 3 hours using a bead mill (a high-pressure dispersing machine with a pressure reducing mechanism, NANO-3000-10 (Nippon BEE Chemical Co., Ltd.)) in which zirconia beads having a diameter of 0.3 mm were used. As a result, a pigment dispersion was prepared. Table 1 shows the amount (unit: part(s) by mass) of the corresponding component.

TABLE 1

| | Colorants | | | | |
|---|---|---|---|---|---|
| | First Colorant | | | | |
| | Kind | Average Particle Size (nm) | Second Colorant | Resin | Organic Solvent |
| Pigment Dispersion 1-1 | Pyrrolopyrrole Pigment 1 (13.5) | 75 | — | Dispersion Resin 1 (4.0) | PGMEA (82.5) |
| Pigment Dispersion 1-2 | Pyrrolopyrrole Pigment 1 (13.5) | 150 | — | Dispersion Resin 1 (4.0) | PGMEA (82.5) |
| Pigment Dispersion 1-3 | Pyrrolopyrrole Pigment 2 (13.5) | 200 | — | Dispersion Resin 1 (4.0) | PGMEA (82.5) |
| Pigment Dispersion 1-4 | IR Colorant 1 (13.5) | — | — | Dispersion Resin 1 (4.0) | PGMEA (82.5) |
| Pigment Dispersion 1-5 | IR Colorant 2 (13.5) | — | — | Dispersion Resin 1 (4.0) | PGMEA (82.5) |
| Pigment Dispersion 1-6 | Carbon Black (20.0) | — | — | Dispersion Resin 1 (3.3) | PGMEA (76.7) |
| Pigment Dispersion 1-7 | Titanium Black (23.3) | — | — | Dispersion Resin 1 (2.3) | PGMEA (74.4) |
| Pigment Dispersion 2-1 | | — | PR254 (13.5) | Dispersion Resin 2 (2.0) Alkali-Soluble Resin 1 (2.0) | PGMEA (82.5) |
| Pigment Dispersion 2-2 | | — | PB15:6 (13.5) | Dispersion Resin 3 (4.0) | PGMEA (82.5) |
| Pigment Dispersion 2-3 | | — | PY139 (14.8) | Dispersion Resin 1 (3.0) Alkali-Soluble Resin 1 (2.2) | PGMEA (80.0) |
| Pigment Dispersion 2-4 | | — | PV23 (14.8) | Dispersion Resin 1 (3.0) Alkali-Soluble Resin 1 (2.2) | PGMEA (80.0) |
| Pigment Dispersion 2-5 | | — | Black Material (14.8) | Dispersion Resin 1 (5.2) | PGMEA (80.0) |
| Pigment Dispersion 2-6 | | — | PG36 (14.8) | Dispersion Resin 4 (5.2) | PGMEA (80.0) |

In the table, an abbreviation of each component is as follows.

[IR Colorant]

Pyrrolopyrrole Pigment 1: the following structure (which was synthesized using a method described in JP2009-263614A) (a colorant having an absorption maximum in a wavelength range of 800 to 900 nm)

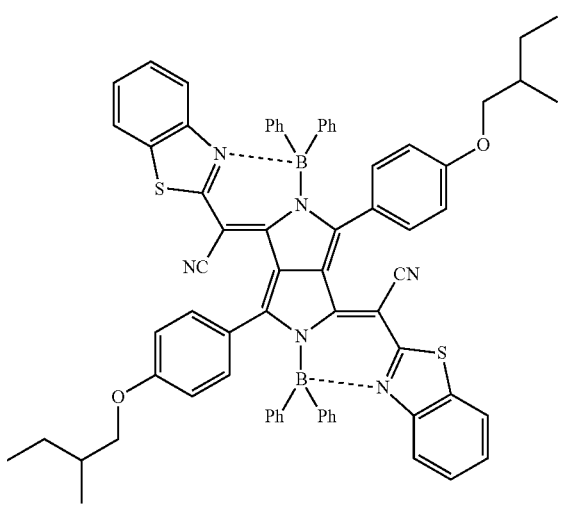

Pyrrolopyrrole Pigment 2: the following structure (which was synthesized using a method described in JP2009-263614A) (a colorant having an absorption maximum in a wavelength range of 800 to 900 nm)

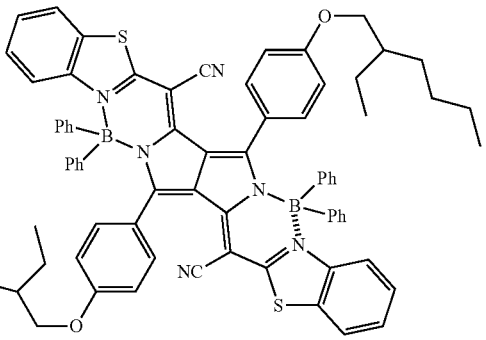

IR Colorant 1: IRA 842 (trade name; manufactured by Exiton, Inc.)
IR Colorant 2: FD-25 (trade name; manufactured by Yamada Chemical Co., Ltd.)
Carbon Black: Pigment Black 7 (trade name)
Titanium Black: trade name (manufactured by Mitsubishi Materials Corporation)

[Second Colorants (Colorants Having Absorption Maximum in Wavelength Range of 400 to 700 nm)]
PR254: Pigment Red 254
PB15:6: Pigment Blue 15:6
PY139: Pigment Yellow 139
PV23: Pigment Violet 23
PG36: Pigment Green 36
Black Material: (Irgaphoa BK (manufactured by BASF SE))

[Resin]
Dispersion Resin 1: BYK-111 (trade name; manufactured by BYK)
Dispersion Resin 2: the following structure (Mw: 7950)

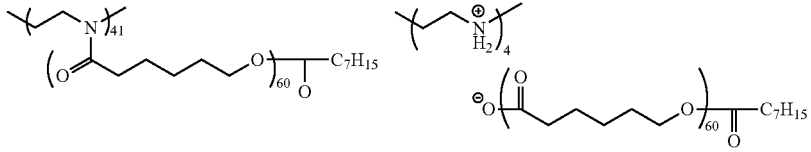

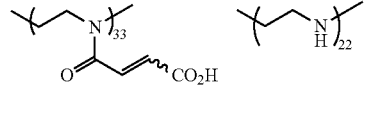

Dispersion Resin 3: the following structure (Mw: 30000)

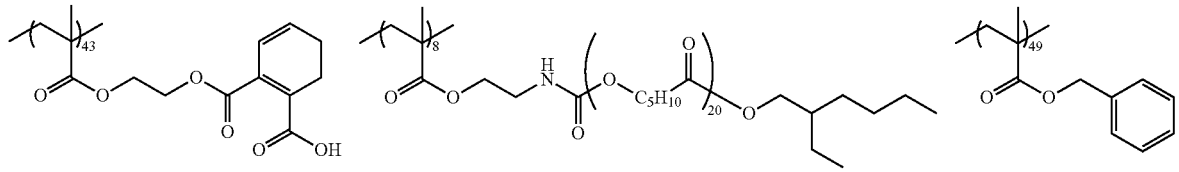

Dispersion Resin 4: the following structure (Mw: 24000)

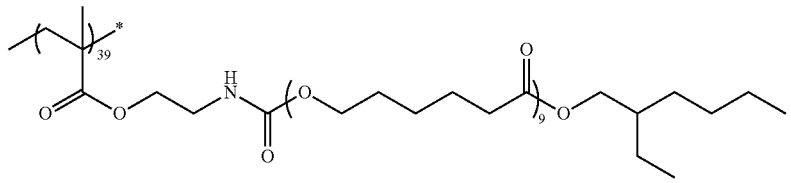

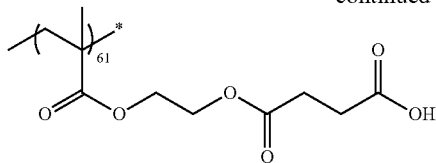

Alkali-Soluble Resin 1: the following structure (Mw: 12000)

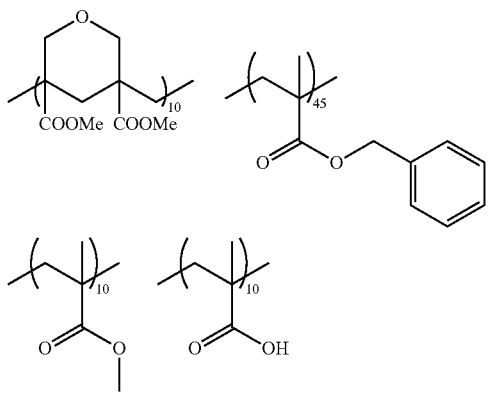

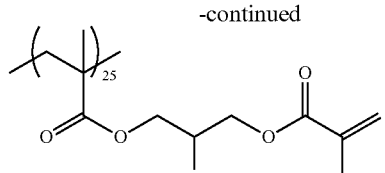

[Organic Solvent]
PGMEA: propylene glycol methyl ether acetate

Examples 1 to 13 and Comparative Examples 1 to 3

Preparation of Coloring Composition

Components shown in the following table were mixed with each other at a ratio shown in the following table to prepare a coloring composition. The table shows the amount (unit: part(s) by mass) of the corresponding component.

TABLE 2

| | Example 1 | Example 2 | Example 3 | Example 4 | Example 5 | Example 6 | Example 7 | Example 8 | Example 9 |
|---|---|---|---|---|---|---|---|---|---|
| Pigment Dispersion 1-1 | 22.67 | | | | | | | | 22.67 |
| Pigment Dispersion 1-2 | | 22.67 | | 28.96 | | | | | |
| Pigment Dispersion 1-3 | | | 22.67 | | | | | | |
| Pigment Dispersion 1-4 | | | | | | | | 22.67 | |
| Pigment Dispersion 1-5 | | | | | | | | 22.67 | |
| Pigment Dispersion 1-6 | | | | | | | | | |
| Pigment Dispersion 1-7 | | | | | | | | | |
| Pyrrolopyrrole Dye 1 | | | | | | 3.91 | | | |
| Pyrrolopyrrole Dye 2 | | | | | | | 3.91 | | |
| Pigment Dispersion 2-1 | 11.33 | 11.33 | 11.33 | | 13.22 | 13.22 | 11.33 | 11.33 | |
| Pigment Dispersion 2-2 | 22.67 | 22.67 | 22.67 | 19.14 | 19.14 | 19.14 | 22.67 | 22.67 | 22.67 |
| Pigment Dispersion 2-3 | 10.34 | 10.34 | 10.34 | | 5.17 | 5.17 | 10.34 | 10.34 | 17.23 |
| Pigment Dispersion 2-4 | 6.89 | 6.89 | 6.89 | | 4.36 | 4.36 | 6.89 | 6.89 | 10.34 |
| Pigment Dispersion 2-5 | | | | 22.75 | | | | | |
| Pigment Dispersion 2-6 | | | | | | | | | |
| Polymerizable Compound 1 | 1.37 | 1.37 | 1.37 | 1.5 | 1.48 | 1.48 | 1.37 | 1.37 | 1.37 |
| Polymerizable Compound 2 | | | | | | | | | |
| Alkali-Soluble Resin 1 | 3.52 | 3.52 | 3.52 | 4.9 | 7.81 | 7.81 | 3.52 | 3.52 | 3.31 |
| Photopolymerization Initiator 1 | 0.86 | 0.86 | 0.86 | 0.92 | 0.92 | 0.92 | 0.86 | 0.86 | 0.86 |

TABLE 2-continued

| | | | | | | | | | |
|---|---|---|---|---|---|---|---|---|---|
| Photopolymerization Initiator 2 | | | | | | | | | |
| Surfactant 1 | 0.42 | 0.42 | 0.42 | 0.42 | 0.42 | 0.42 | 0.42 | 0.42 | 0.42 |
| Polymerization Inhibitor 1 | 0.001 | 0.001 | 0.001 | 0.001 | 0.001 | 0.001 | 0.001 | 0.001 | 0.001 |
| Organic Solvent 1 | 19.93 | 19.93 | 19.93 | 21.41 | 43.57 | 43.57 | 19.93 | 19.93 | 21.13 |
| Organic Solvent 2 | | | | | | | | | |

| | Example 10 | Example 11 | Example 12 | Example 13 | Comparative Example 1 | Comparative Example 2 | Comparative Example 3 |
|---|---|---|---|---|---|---|---|
| Pigment Dispersion 1-1 | 22.67 | 22.67 | 22.67 | 22.67 | | | |
| Pigment Dispersion 1-2 | | | | | | | |
| Pigment Dispersion 1-3 | | | | | | | |
| Pigment Dispersion 1-4 | | | | | | | |
| Pigment Dispersion 1-5 | | | | | | | |
| Pigment Dispersion 1-6 | | | | | | 17 | |
| Pigment Dispersion 1-7 | | | | | | | 14.59 |
| Pyrrolopyrrole Dye 1 | | | | | | | |
| Pyrrolopyrrole Dye 2 | | | | | | | |
| Pigment Dispersion 2-1 | 22.67 | | 11.33 | 11.33 | 9.17 | | |
| Pigment Dispersion 2-2 | 22.67 | 11.33 | 22.67 | 22.67 | 18.35 | | |
| Pigment Dispersion 2-3 | 6.89 | 10.34 | 10.34 | 10.34 | 8.37 | | |
| Pigment Dispersion 2-4 | | 13.78 | 6.89 | 6.89 | 5.58 | | |
| Pigment Dispersion 2-5 | | | | | | | |
| Pigment Dispersion 2-6 | | 15.11 | | | | | |
| Polymerizable Compound 1 | 1.37 | 1.37 | | 1.37 | 2.26 | 2.74 | 2.74 |
| Polymerizable Compound 2 | | | 1.37 | | | | |
| Alkali-Soluble Resin 1 | 3.73 | 3.38 | 3.52 | 3.52 | 14.3 | 21.46 | 22.02 |
| Photopolymerization Initiator 1 | 0.86 | 0.86 | 0.86 | | 1.41 | 1.71 | 1.71 |
| Photopolymerization Initiator 2 | | | | 0.86 | | | |
| Surfactant 1 | 0.42 | 0.42 | 0.42 | 0.42 | 0.42 | 0.42 | 0.42 |
| Polymerization Inhibitor 1 | 0.001 | 0.001 | 0.001 | 0.001 | 0.001 | 0.001 | 0.001 |
| Organic Solvent 1 | 18.72 | 20.74 | 19.93 | 10.93 | 40.14 | 56.67 | 58.52 |
| Organic Solvent 2 | | | | 9.00 | | | |

In the table, an abbreviation of each component is as follows.

Pyrrolopyrrole Dye 1: the following structure (which was synthesized using a method described in JP2009-263614A) (a colorant having an absorption maximum in a wavelength range of 800 to 900 nm)

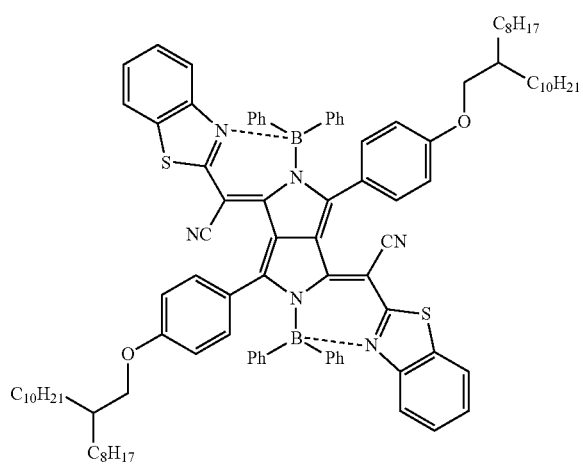

Pyrrolopyrrole Dye 2: the following structure (which was synthesized using a method described in JP2009-263614A) (a colorant having an absorption maximum in a wavelength range of 800 to 900 nm)

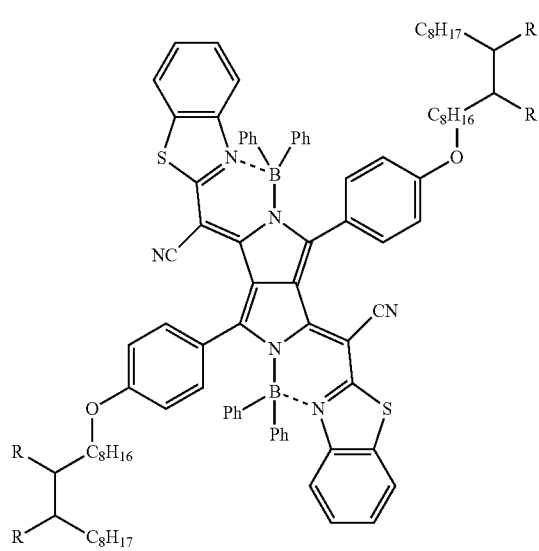

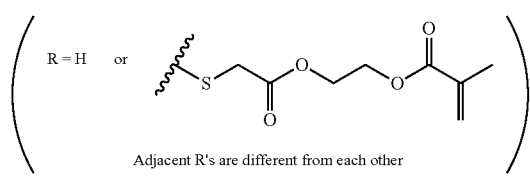

Polymerizable Compound 1: M-305 (including 55 to 63 mass % of triacrylate; manufactured by Toagosei Co., Ltd., the following structure)

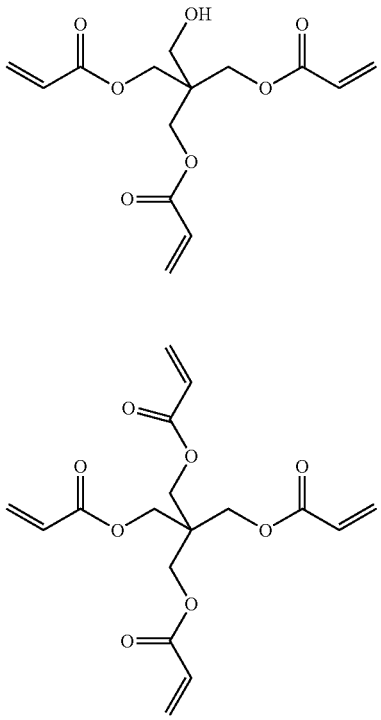

Polymerizable Compound 2: dipentaerythritol hexaacrylate (manufactured by Shin-Nakamura Chemical Co., Ltd., A-DPH)

Photopolymerization Initiator 1: IRGACURE OXE-01 (manufactured by BASF SE, the following structure)

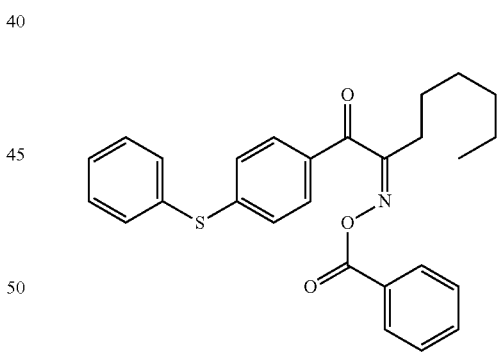

hotopolymerization Initiator 2: IRGACURE OXE-02 (manufactured by BASF SE)

Surfactant 1: MEGAFAC F-781F (a fluorine-containing polymeric surfactant, manufactured by DIC Corporation)

Polymerization Inhibitor 1: p-methoxyphenol

Organic Solvent 1: propylene glycol methyl ether acetate

Organic Solvent 2: cyclohexanone

[Absorbance and Spectral Characteristics]

The coloring composition was applied to a glass substrate such that the thickness of a post-baked film was 1.0 μm to form a colored layer on the glass substrate. Specifically, the coloring composition was spin-coated on the glass substrate, was dried using a hot plate at 100° C. for 120 seconds, and was further heated (post-baked) using a hot plate at 200° C. for 300 seconds.

Regarding the glass substrate including the colored layer, the light transmittance in a wavelength range of 300 to 1300 nm, the minimum value A of the absorbance in a wavelength range of 400 to 830 nm, and the maximum value B of the absorbance in a wavelength range of 1000 to 1300 nm were measured using an ultraviolet-visible-near infrared spectrophotometer U-4100 (manufactured by Hitachi High-Technologies Corporation; ref. glass substrate).

[Preparation of Color Filter]

Each of the coloring compositions according to Examples 1 to 13 and Comparative Examples 1 to 3 was applied to a silicon wafer using a spin coater such that the thickness of a dried film was 1.0 μm, and was heated (pre-baked) using a hot plate at 100° C. for 120 seconds to form a coating film.

Next, using an i-ray stepper exposure device FPA-3000 i5+ (manufactured by Canon Corporation), the coating film was exposed at an optimum exposure intensity through a photomask on which a square pixel pattern having a size of 1.4×1.4 μm was formed. The optimum exposure intensity was determined based on an exposure intensity at which the square pixel pattern is resolved while increasing the intensity from 50 to 750 mJ/cm$^2$ at an interval of 50 mJ/cm$^2$.

Next, the silicon wafer on which the exposed coating film was formed was placed on a horizontal rotary table of a spin-shower developing machine (DW-30, manufactured by Chemitronics Co., Ltd.) and underwent paddle development at 23° C. for 60 seconds using CD-2060 (manufactured by Fujifilm Electronic Materials Co., Ltd.) to form a colored pattern on the silicon wafer.

The silicon wafer on which the colored pattern was formed was rinsed with pure water and was dried by spraying.

Further, the silicon wafer was heated (post-baked) using a hot plate at 200° C. for 300 seconds. In this way, silicon wafers having the colored pattern were obtained as color filters according to Examples 1 to 13 and Comparative Examples 1 to 3.

<Evaluation>

[Heat Resistance]

Each of the color filters was heated using a hot plate at 260° C. for 300 seconds. The light transmittance (unit: %) of the color filter in a wavelength range of 400 to 830 nm was measured before and after heating to evaluate a change in transmittance.

Change in transmittance=|(Transmittance (%) after Heating−Transmittance (%) before Heating|

<Evaluation Criteria>

3: The change between the transmittances before and after heating is lower than 3%
2: The change between the transmittances before and after heating is 3% or higher and lower than 5%
1: The change between the transmittances before and after heating is 5% or higher

[Spectral Identification]

Each of the obtained color filters as a near infrared ray filter was incorporated into a solid image pickup element using a well-known method. Using the obtained solid image pickup element, an object was irradiated with a near infrared LED light source having an emission wavelength of 940 nm in a low-illuminance environment (0.001 Lux) to acquire images. Next, the image performances of the solid image pickup elements were compared to each other for evaluation. Evaluation criteria are as described below. <Evaluation Criteria>

3: Satisfactory (an object was able to be clearly recognized on the image)
2: Less satisfactory (an object was able to be recognized on the image)
1: Unsatisfactory (an object was not able to be recognized on the image)

TABLE 3

| | Spectral Identification | Heat Resistance | Maximum Transmittance 400 to 830 nm | Minimum Transmittance 1000 to 1300 nm | Minimum Absorbance A: 400 to 830 nm | Maximum Absorbance B: 1000 to 1300 nm | Absorbance Ratio A/B |
|---|---|---|---|---|---|---|---|
| Example 1 | 3 | 3 | 0.80% | 92% | 2.10 | 0.04 | 57.9 |
| Example 2 | 3 | 3 | 4.7% | 85% | 1.33 | 0.07 | 18.8 |
| Example 3 | 3 | 3 | 2.8% | 72% | 1.55 | 0.14 | 10.9 |
| Example 4 | 3 | 3 | 9.6% | 73% | 1.02 | 0.14 | 7.4 |
| Example 5 | 3 | 2 | 15% | 86% | 0.82 | 0.07 | 12.5 |
| Example 6 | 3 | 2 | 8.9% | 72% | 1.05 | 0.14 | 7.4 |
| Example 7 | 2 | 1 | 17% | 81% | 0.76 | 0.09 | 8.3 |
| Example 8 | 2 | 1 | 18% | 72% | 0.74 | 0.14 | 5.2 |
| Example 9 | 2 | 3 | 0.85% | 92% | 2.07 | 0.04 | 57.2 |
| Example 10 | 2 | 3 | 0.89% | 92% | 2.05 | 0.04 | 56.6 |
| Example 11 | 2 | 3 | 1.07% | 92% | 1.97 | 0.04 | 54.4 |
| Example 12 | 3 | 3 | 0.80% | 92% | 2.10 | 0.04 | 57.9 |
| Example 13 | 3 | 3 | 0.80% | 92% | 2.10 | 0.04 | 57.9 |
| Comparative Example 1 | 1 | 3 | 83% | 96% | 0.08 | 0.02 | 3.2 |
| Comparative Example 2 | 1 | 3 | 18% | 22% | 0.74 | 0.66 | 1.1 |
| Comparative Example 3 | 1 | 3 | 19% | 20% | 0.72 | 0.70 | 1.0 |

In all the Examples 1 to 13 according to the present invention in which the coloring composition was used, noises generated from visible rays were small, the transmission of near infrared rays having an emission wavelength of 940 nm was allowed, and the spectral identification was satisfactory. On the other hand, in Comparative Examples 1 to 3, noises generated from visible rays were large, and the spectral identification was unsatisfactory.

Test Example 2

Preparation of Pigment Dispersions 3-1 to 3-11

A mixed solution having a composition shown in Table 4 below was mixed and dispersed using a bead mill (a high-pressure dispersing machine with a pressure reducing mechanism, NANO-3000-10 (Nippon BEE Chemical Co., Ltd.)), in which zirconia beads having a diameter of 0.3 mm were used, until an average particle size of an IR colorant was as shown in Table 4. As a result, a pigment dispersion was prepared. Table 4 shows the amount (unit: part(s) by mass) of the corresponding component.

The volume average particle size of a pigment in the pigment dispersion was measured using MICROTRAC UPA 150 (manufactured by Nikkiso Co., Ltd.). The results are shown in Table 4.

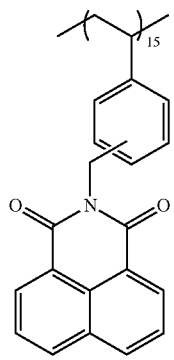

TABLE 4

|  | Colorants | | | | | |
|---|---|---|---|---|---|---|
|  | First Colorant | | | | | |
|  | Kind | Average Particle Size (nm) | Second Colorant | Colorant Derivative | Resin | Organic Solvent |
| Pigment Dispersion 3-1 | Pyrrolopyrrole Pigment 1 (3) | 100 | PR254(4.5) | Colorant Derivative 1 (2.2) | Dispersion Resin 10 (7.3) | PGMEA(83) |
| Pigment Dispersion 3-2 | Pyrrolopyrrole Pigment 1 (3) | 100 | PR254(4.5) | Colorant Derivative 1 (2.2) | Dispersion Resin 11 (7.3) | PGMEA(83) |
| Pigment Dispersion 3-3 | Pyrrolopyrrole Pigment 1 (3) | 100 | PR254(4.5) | Colorant Derivative 1 (2.2) | Dispersion Resin 12 (7.3) | PGMEA(83) |
| Pigment Dispersion 3-4 | Pyrrolopyrrole Pigment 1 (3.3) | 100 | PB15:6(5) |  | Dispersion Resin 10 (8.7) | PGMEA(83) |
| Pigment Dispersion 3-5 | Pyrrolopyrrole Pigment 1 (3.3) | 100 | PB15:6(5) |  | Dispersion Resin 11 (8.7) | PGMEA(83) |
| Pigment Dispersion 3-6 | Pyrrolopyrrole Pigment 1 (3.3) | 100 | PB15:6(5) |  | Dispersion Resin 12 (8.7) | PGMEA(83) |
| Pigment Dispersion 3-7 | Pyrrolopyrrole Pigment 1 (2.1) | 100 | PR254(2.1) PB15:6(2.1) | Colorant Derivative 1 (1.9) | Dispersion Resin 10 (6.8) | PGMEA(85) |
| Pigment Dispersion 3-8 | TiOPc(8.5) | 100 |  | Colorant Derivative 1 (1.1) | Dispersion Resin 11 (5.4) | PGMEA(85) |
| Pigment Dispersion 3-9 | TiOPc(8.5) | 100 |  | Colorant Derivative 1 (1.1) | Dispersion Resin 12 (5.4) | PGMEA(85) |
| Pigment Dispersion 3-10 | VONPc(8.5) | 100 |  | Colorant Derivative 1 (1.1) | Dispersion Resin 11 (5.4) | PGMEA(85) |
| Pigment Dispersion 3-11 | VONPc(8.5) | 100 |  | Colorant Derivative 1 (1.1) | Dispersion Resin 12 (5.4) | PGMEA(85) |

In the table, an abbreviation of each component is as follows.

Pyrrolopyrrole Pigment 1: Pyrrolopyrrole Pigment 1 used in Test Example 1

TiOPc: oxotitanyl phthalocyanine

VONPc: oxovanadyl naphthalocyanine

PR254: Pigment Red 254

PB15:6: Pigment Blue 15:6

PGMEA: propylene glycol methyl ether acetate

Dispersion resin 10: the following structure (Mw: 8500)

-continued

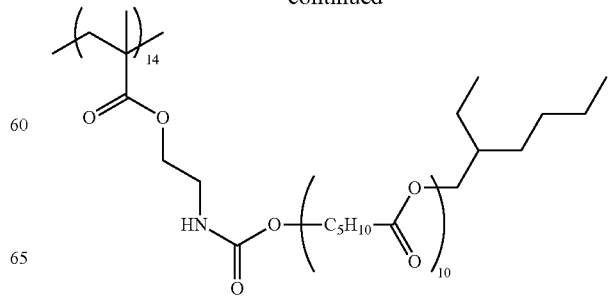

-continued

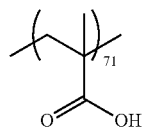

Dispersion Resin 11: the following structure (Mw: 9200)

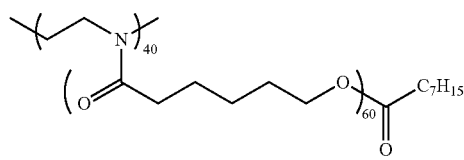

-continued

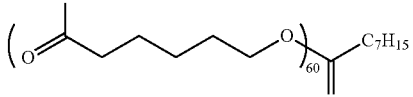

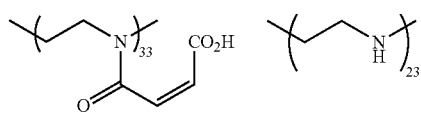

Dispersion Resin 12: the following structure (Mw: 20000)

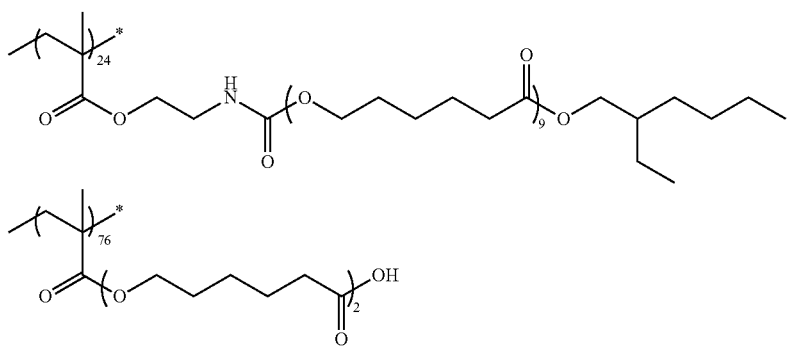

Colorant Derivatives 1: the following structure

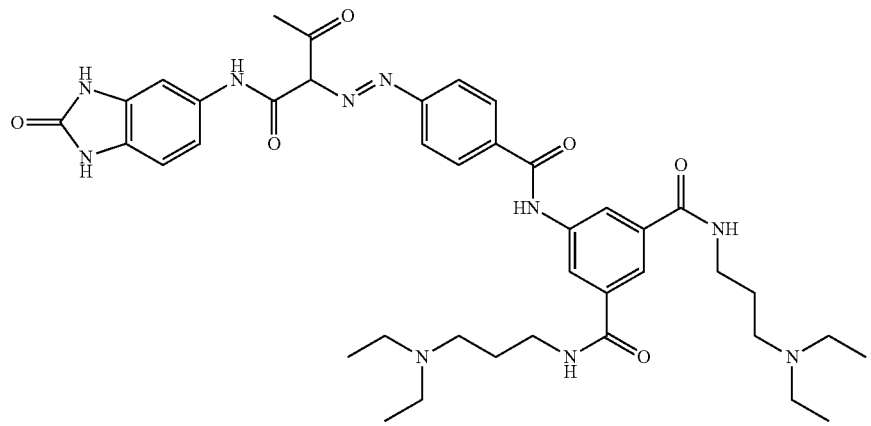 [SMILES: CCN(CC)CCCNC(=O)c1cc(NC(=O)c2ccc(/N=N/C(C(C)=O)C(=O)Nc3ccc4[nH]c(=O)[nH]c4c3)cc2)cc(C(=O)NCCCN(CC)CC)c1]

[Preparation of Coloring Composition]

Components shown in Table 5 were mixed with each other at a ratio shown in Table 5 to obtain a coloring composition. Table 5 shows the amount (unit: part(s) by mass) of the corresponding component.

TABLE 5

|  | Example 101 | Example 102 | Example 103 | Example 104 | Example 105 | Example 106 | Example 107 | Example 108 |
|---|---|---|---|---|---|---|---|---|
| Pigment Dispersion 3-1 | 40.97 | | | | | | | |
| Pigment Dispersion 3-2 | | 40.97 | | | | | | |
| Pigment Dispersion 3-3 | | | 40.97 | | | | | |

TABLE 5-continued

|  | Example 101 | Example 102 | Example 103 | Example 104 | Example 105 | Example 106 | Example 107 | Example 108 |
|---|---|---|---|---|---|---|---|---|
| Pigment Dispersion 3-4 | 33.61 | | | | | | | |
| Pigment Dispersion 3-5 | | 33.61 | | | | | | |
| Pigment Dispersion 3-6 | | | 33.61 | | | | | |
| Pigment Dispersion 3-7 | | | | 95.04 | | | | |
| Pigment Dispersion 3-8 | | | | | 21.84 | | | |
| Pigment Dispersion 3-9 | | | | | | 21.84 | | |
| Pigment Dispersion 3-10 | | | | | | | 14.56 | |
| Pigment Dispersion 3-11 | | | | | | | | 14.56 |
| Pigment Dispersion 2-1 | | | | | 13.31 | 13.31 | 13.31 | 13.31 |
| Pigment Dispersion 2-2 | | | | | 5.82 | 5.82 | 17.47 | 17.47 |
| Pigment Dispersion 2-3 | 4.97 | 4.97 | 4.97 | | 5.4 | 5.4 | 5.4 | 5.4 |
| Pigment Dispersion 2-4 | | | | | 1.35 | 1.35 | 4.05 | 4.05 |
| Polymerizable Compound 1 | 4.14 | 4.14 | 4.14 | 1.84 | 5.87 | 5.87 | 5.32 | 5.32 |
| Alkali-Soluble Resin 1 | 0.19 | 0.19 | 0.19 | 1.02 | 3.57 | 3.57 | 2.81 | 2.81 |
| Photopolymerization Initiator 1 | | 1.4 | 1.4 | 0.883 | | 1.986 | | 1.803 |
| Photopolymerization Initiator 3 | 1.4 | | | | 1.986 | | 1.803 | |
| Surfactant 1 | 0.04 | 0.04 | 0.04 | 0.04 | 0.04 | 0.04 | 0.04 | 0.04 |
| Substrate Adhesive 1 | 0.6 | 0.6 | 0.6 | | 0.6 | 0.6 | 0.6 | 0.6 |
| Polymerization Inhibitor 1 | 0.001 | 0.001 | 0.001 | 0.001 | 0.001 | 0.001 | 0.001 | 0.001 |
| Organic solvent 1 | 14.08 | 14.08 | 14.08 | 1.18 | 40.22 | 40.22 | 34.64 | 34.64 |

In the table, an abbreviation of each component is as follows.

Pigment Dispersions 2-1 to 2-4, Polymerizable Compound 1, Alkali-Soluble Resin 1, Photopolymerization Initiator 1, Surfactant 1, Polymerization Inhibitor 1, and Organic Solvent 1 are the same as the components described in Table 2.

Photopolymerization Initiator 3: the following structure

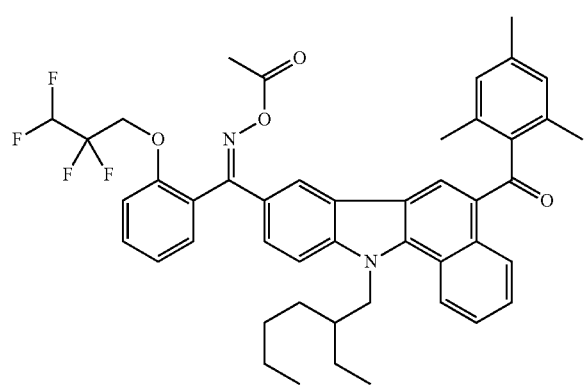 [SMILES: CCCCC(CC)Cn1c2ccc(/C(=N\OC(C)=O)c3ccccc3OCC(F)(F)C(F)F)cc2c2cc(C(=O)c3c(C)cc(C)cc3C)c3ccccc3c21]

Substrate Adhesive 1: the following structure

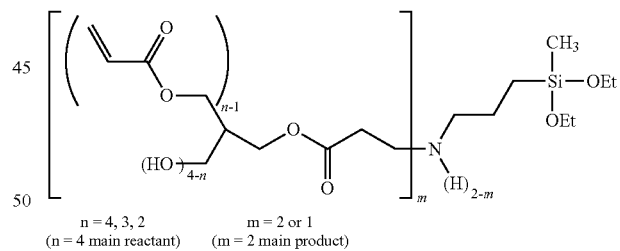

n = 4, 3, 2     m = 2 or 1
(n = 4 main reactant)     (m = 2 main product)

[Absorbance and Spectral Characteristics]

The coloring composition was applied to a glass substrate such that the thickness of a post-baked film was 3.0 μm to form a colored layer on the glass substrate. Specifically, the coloring composition was spin-coated on the glass substrate, was dried using a hot plate at 100° C. for 120 seconds, and was further heated (post-baked) using a hot plate at 200° C. for 300 seconds.

Regarding the glass substrate including the colored layer, the light transmittance in a wavelength range of 300 to 1300 nm, the minimum value A of the absorbance in a wavelength range of 400 to 830 nm, and the maximum value B of the absorbance in a wavelength range of 1000 to 1300 nm were measured using an ultraviolet-visible-near infrared spectrophotometer U-4100 (manufactured by Hitachi High-Technologies Corporation; ref. glass substrate).

[Preparation of Color Filter]

Color filters were prepared using the same method as in Test Example 1, except that each of the coloring compositions was applied to a silicon wafer using a spin coater such that the thickness of a dried film was 3.0 μm, and was heated (pre-baked) using a hot plate at 100° C. for 120 seconds.

<Evaluation>

Using the same method as in Test Example 1, the heat resistance and the spectral identification were evaluated.

TABLE 6

|  | Spectral Identification | Heat Resistance | Maximum Transmittance 400 to 830 nm | Minimum Transmittance 1000 to 1300 nm | Minimum Absorbance A: 400 to 830 nm | Maximum Absorbance B: 1000 to 1300 nm | Absorbance Ratio A/B |
|---|---|---|---|---|---|---|---|
| Example 101 | 3 | 3 | 2.9% | 92% | 1.54 | 0.04 | 38.5 |
| Example 102 | 3 | 3 | 2.9% | 92% | 1.54 | 0.04 | 38.5 |
| Example 103 | 3 | 3 | 2.9% | 92% | 1.54 | 0.04 | 38.5 |
| Example 104 | 3 | 3 | 4.1% | 91% | 1.39 | 0.04 | 34.8 |
| Example 105 | 3 | 3 | 1.3% | 82% | 1.89 | 0.09 | 21 |
| Example 106 | 3 | 3 | 1.3% | 82% | 1.89 | 0.09 | 21 |
| Example 107 | 3 | 3 | 1.7% | 81% | 1.77 | 0.09 | 19.7 |
| Example 108 | 3 | 3 | 1.7% | 81% | 1.77 | 0.09 | 19.7 |

In all the Examples 101 to 108 according to the present invention in which the coloring composition was used, noises generated from visible rays were small, the transmission of near infrared rays having an emission wavelength of 940 nm was allowed, and the spectral identification was satisfactory.

EXPLANATION OF REFERENCES

1: lens optical system
10: solid image pickup element
20: signal processing unit
30: signal switching unit
40: control unit
50: signal storage unit
60: light emission control unit
70: infrared LED
80, 81: image output unit
100: infrared sensor
110: solid image pickup element
111: near infrared absorbing filter
112: color filter
113: near infrared transmitting filter
114: region
115: microlens
116: planarizing layer
hv: incident rays

What is claimed is:
1. A coloring composition comprising:
colorants; and
a resin,
wherein a ratio AB of a minimum value A of an absorbance in a wavelength range of 400 to 830 nm to a maximum value B of an absorbance in a wavelength range of 1000 to 1300 nm is 4.5 or higher,
the colorants include one or more first colorants having an absorption maximum in a wavelength range of 800 to 900 nm and two or more second colorants having an absorption maximum in a wavelength range of 400 to 700 nm,
the first colorants include at least one compound selected from the group consisting of a pyrrolopyrrole colorant compound, a copper compound, a cyanine colorant compound, a phthalocyanine colorant compound, an iminium colorant compound, a thiol complex compound, a transition metal oxide compound, a squarylium colorant compound, a naphthalocyanine colorant compound, a quaterrylene colorant compound, a dithiol metal complex colorant compound, and a croconium compound,
the content of the first colorants is 10 to 200 parts by mass with respect to 100 parts by mass of the second colorants,
the content of the second colorants is 10 to 60 mass % with respect to the total solids content of the coloring composition, and
when a film having a thickness range of 0.5 to 50 μm is formed using the coloring composition, at at least one value in the thickness range, the light transmittance when light is transmitted from one surface of the film to the other surface has a maximum value of 10% or lower in a wavelength range of 400 to 830 nm and has a minimum value of 70% or higher in a wavelength range of 1000 to 1300 nm.

2. The coloring composition according to claim 1, wherein the first colorants include a pyrrolopyrrole colorant compound.

3. The coloring composition according to claim 2, wherein the pyrrolopyrrole colorant compound is a pigment.

4. The coloring composition according to claim 3, wherein the pyrrolopyrrole colorant compound is represented by the following Formula (1),

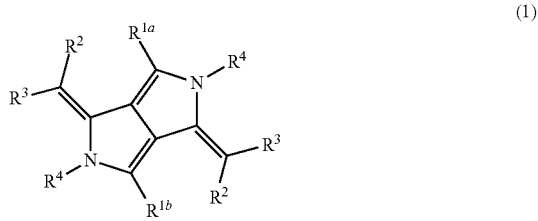

in Formula (1), $R^{1a}$ and $R^{1b}$ each independently represent an alkyl group, an aryl group, or a heteroaryl group,
$R^2$ and $R^3$ each independently represent a hydrogen atom or a substituent,
at least one of $R^2$ or $R^3$ represents an electron-withdrawing group, $R^2$ and $R^3$ may be bonded to each other to form a ring, and $R^4$ represents a hydrogen atom, an alkyl group, an aryl group, a heteroaryl group, a substituted boron atom, or a metal atom and may form a covalent bond or a coordinate bond with one or more selected from the group consisting of $R^{1a}$, $R^{1b}$, and $R^3$.

5. The coloring composition according to claim 2, wherein the pyrrolopyrrole colorant compound is represented by the following Formula (1),

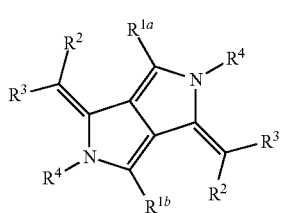

(1)

in Formula (1), $R^{1a}$ and $R^{1b}$ each independently represent an alkyl group, an aryl group, or a heteroaryl group, $R^2$ and $R^3$ each independently represent a hydrogen atom or a substituent, at least one of $R^2$ or $R^3$ represents an electron-withdrawing group, $R^2$ and $R^3$ may be bonded to each other to form a ring, and $R^4$ represents a hydrogen atom, an alkyl group, an aryl group, a heteroaryl group, a substituted boron atom, or a metal atom and may form a covalent bond or a coordinate bond with one or more selected from the group consisting of $R^{1a}$, $R^{1b}$, and $R^3$.

6. The coloring composition according to claim 1, wherein the colorants include, as the second colorants, two or more colorants selected from the group consisting of a red colorant, a yellow colorant, a blue colorant, and a violet colorant.

7. The coloring composition according to claim 1, further comprising:
a polymerizable compound.

8. The coloring composition according to claim 7, further comprising:
a photopolymerization initiator.

9. The coloring composition according to claim 1 which is used for forming a colored layer of a color filter.

10. A film having light transmittance when light is transmitted from one surface of the film having a thickness range of 0.5 to 50 μm to the other surface of 10% or lower in a wavelength range of 400 to 830 nm and having a light transmittance when light is transmitted from one surface of the film having a thickness range of 0.5 to 50 μm to the other surface of 70% or higher in a wavelength range of 1000 to 1300 nm,
wherein the film has a thickness range of 0.5 to 50 μm, and the film is formed by curing the coloring composition according to claim 1.

11. The film according to claim 10, comprising colorants, wherein the colorants include one or more first colorants having an absorption maximum in a wavelength range of 800 to 900 nm and two or more second colorants having an absorption maximum in a wavelength range of 400 to 700 nm,
the content of the first colorants is 10 to 60 mass % with respect to the total solids content of the coloring composition, and the content of the second colorants is 10 to 60 mass % with respect to the total solids content of the coloring composition.

12. The film according to claim 11, wherein the second colorants include at least one colorant selected from the group consisting of C.I. Pigment Red 254, C.I. Pigment Yellow 139, C.I. Pigment Blue 15:6, and C.I. Pigment Violet 23.

13. The film according to claim 11, wherein the second colorants include a red colorant, and the ratio of the mass of the red colorant to the total mass of the second colorant is 0.1 to 0.4.

14. The film according to claim 11, wherein the second colorants include a yellow colorant, and
the ratio of the mass of the yellow colorant to the total mass of the second colorant is 0.1 to 0.4.

15. The film according to claim 11, wherein the second colorants include a blue colorant, and the ratio of the mass of the blue colorant to the total mass of the second colorant is 0.2 to 0.6.

16. The film according to claim 11, wherein the second colorants include a violet colorant, and
the ratio of the mass of the violet colorant to the total mass of the second colorant is 0.01 to 0.3.

17. The film according to claim 11, wherein the content of the second colorants is 30 to 50 mass % with respect to the total solids content of the coloring composition.

18. The film according to claim 11, wherein the content of the first colorants is 20 to 150 parts by mass with respect to 100 parts by mass of the second colorants.

19. The film according to claim 11, wherein the content of the first colorants is 30 to 80 parts by mass with respect to 100 parts by mass of the second colorants.

20. The film according to claim 11, wherein the second colorants include at least one colorant selected from the group consisting of a bisbenzofuranone pigment, an azomethine pigment, a perylene pigment, and an azo dye.

21. The film according to claim 20, further comprising a blue colorant.

22. The film according to claim 11, wherein the second colorants include a bisbenzofuranone pigment.

23. The film according to claim 11, wherein the first colorants are pigments.

24. The film according to claim 11, wherein the second colorants include three or more colorants.

25. The film according to claim 11, wherein the second colorants include four or more colorants.

26. The film according to claim 11, wherein the second colorants include a red colorant, a yellow colorant, a blue colorant, and a violet colorant,
the ratio of the mass of the red colorant to the total mass of the second colorant is 0.1 to 0.4,
the ratio of the mass of the yellow colorant to the total mass of the second colorant is 0.1 to 0.4,
the ratio of the mass of the blue colorant to the total mass of the second colorant is 0.2 to 0.6, and
the ratio of the mass of the violet colorant to the total mass of the second colorant is 0.01 to 0.3.

27. The film according to claim 11,
wherein the second colorants include a pigment, and the content of the pigment in the second colorants is 95 mass % or higher.

28. The film according to claim 10, further comprising a colorant derivative,
wherein the colorants include a pigment.

29. The film according to claim 10, further comprising a resin,
wherein the resin is an alkali-soluble resin including a repeating unit having an ethylenically unsaturated bond.

30. A pattern forming method comprising:
applying the coloring composition according to claim 1 to a support to form a coloring composition layer;
exposing the coloring composition layer in a pattern shape; and
forming a colored pattern by removing a non-exposed portion by development.

31. A method of manufacturing a color filter comprising: the pattern forming method according to claim 30.

32. The coloring composition according to claim 1,
wherein the content of the first colorants is 10 to 60 mass % with respect to the total solids content of the coloring composition.

33. The coloring composition according to claim 1, further comprising a colorant derivative,
wherein the colorants include a pigment.

34. The coloring composition according to claim 1,
wherein the resin is an alkali-soluble resin including a repeating unit having an ethylenically unsaturated bond.

35. The coloring composition according to claim 1,
wherein the second colorants include at least one colorant selected from the group consisting of C.I. Pigment Red 254, C.I. Pigment Yellow 139, C.I. Pigment Blue 15:6, and C.I. Pigment Violet 23.

36. The coloring composition according to claim 1,
wherein the second colorants include a red colorant, and the ratio of the mass of the red colorant to the total mass of the second colorant is 0.1 to 0.4.

37. The coloring composition according to claim 1,
wherein the second colorants include a yellow colorant, and
the ratio of the mass of the yellow colorant to the total mass of the second colorant is 0.1 to 0.4.

38. The coloring composition according to claim 1,
wherein the second colorants include a blue colorant, and the ratio of the mass of the blue colorant to the total mass of the second colorant is 0.2 to 0.6.

39. The coloring composition according to claim 1,
wherein the second colorants include a violet colorant, and
the ratio of the mass of the violet colorant to the total mass of the second colorant is 0.01 to 0.3.

40. The coloring composition according to claim 1,
wherein the content of the second colorants is 30 to 50 mass % with respect to the total solids content of the coloring composition.

41. The coloring composition according to claim 1,
wherein the content of the first colorants is 20 to 150 parts by mass with respect to 100 parts by mass of the second colorants.

42. The coloring composition according to claim 1,
wherein the content of the first colorants is 30 to 80 parts by mass with respect to 100 parts by mass of the second colorants.

43. The coloring composition according to claim 1,
wherein the second colorants include at least one colorant selected from the group consisting of a bisbenzofuranone pigment, an azomethine pigment, a perylene pigment, and an azo dye.

44. The coloring composition according to claim 43, further comprising a blue colorant.

45. The coloring composition according to claim 1,
wherein the second colorants include a bisbenzofuranone pigment.

46. The coloring composition according to claim 1,
wherein the first colorants are pigments.

47. The coloring composition according to claim 1,
wherein the second colorants include three or more colorants.

48. The coloring composition according to claim 1,
wherein the second colorants include four or more colorants.

49. The coloring composition according to claim 1,
wherein the second colorants include a red colorant, a yellow colorant, a blue colorant, and a violet colorant,
the ratio of the mass of the red colorant to the total mass of the second colorant is 0.1 to 0.4,
the ratio of the mass of the yellow colorant to the total mass of the second colorant is 0.1 to 0.4,
the ratio of the mass of the blue colorant to the total mass of the second colorant is 0.2 to 0.6, and
the ratio of the mass of the violet colorant to the total mass of the second colorant is 0.01 to 0.3.

50. The coloring composition according to claim 1,
wherein the second colorants include a pigment, and the content of the pigment in the second colorants is 95 mass % or higher.

51. The coloring composition according to claim 1, further comprising,
an alkali-soluble resin,
a polymerizable compound, and
a photopolymerization initiator,
wherein the content of the alkali-soluble resin is 1 to 15 mass % with respect to the total solids content of the coloring composition,
the content of the polymerizable compound is 2 to 30 mass % with respect to the total solids content of the coloring composition, and
the content of the photopolymerization initiator is 0.5 to 10 mass % with respect to the total solids content of the coloring composition.

52. The coloring composition according to claim 1, further comprising,
an alkali-soluble resin selected from the group consisting of an acrylic resin, an acrylamide resin, and an acryl/acrylamide copolymer resin.

53. The coloring composition according to claim 1, further comprising,
a solvent.

54. A coloring composition comprising:
colorants; and
a resin,
wherein a ratio AB of a minimum value A of an absorbance in a wavelength range of 400 to 830 nm to a maximum value B of an absorbance in a wavelength range of 1000 to 1300 nm is 4.5 or higher,
the colorants include one or more first colorants having an absorption maximum in a wavelength range of 800 to 900 nm and two or more second colorants having an absorption maximum in a wavelength range of 400 to 700 nm, the first colorants include a pyrrolopyrrole colorant compound, and the second colorants include at least one colorant selected from the group consisting of a bis-benzofuranone pigment, an azomethine pigment, a perylene pigment, and an azo dye, the content of the first colorants is 10 to 200 parts by mass with respect to 100 parts by mass of the second colorants, the content of the second colorants is 10 to 60 mass % with respect to the total solid content of the coloring composition, and when a film having a thickness range of 0.5 to 50 μm is formed using the coloring composition, at at least one value in the thickness range, the light transmittance when light is transmitted from one surface of the film to the other surface has a maximum value of 10% or lower in a wavelength range of 400 to 830 nm and has a minimum value of 70% or higher in a wavelength range of 1000 to 1300 nm.

* * * * *